(12) United States Patent
Nakai et al.

(10) Patent No.: US 9,555,437 B2
(45) Date of Patent: Jan. 31, 2017

(54) SUBSTRATE PROCESSING APPARATUS

(71) Applicant: DAINIPPON SCREEN MFG. CO., LTD., Kyoto (JP)

(72) Inventors: Hitoshi Nakai, Kyoto (JP); Yasuhiko Ohashi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 13/969,995

(22) Filed: Aug. 19, 2013

(65) Prior Publication Data

US 2014/0060423 A1 Mar. 6, 2014

(30) Foreign Application Priority Data

| Aug. 31, 2012 | (JP) | P2012-191284 |
| Aug. 31, 2012 | (JP) | P2012-191285 |
| Sep. 25, 2012 | (JP) | P2012-210558 |
| Sep. 25, 2012 | (JP) | P2012-210559 |
| Sep. 25, 2012 | (JP) | P2012-210560 |

(51) Int. Cl.

| B05C 11/10 | (2006.01) |
| H01L 21/687 | (2006.01) |
| B05C 5/02 | (2006.01) |
| H01L 21/67 | (2006.01) |
| B05C 9/04 | (2006.01) |
| H01L 21/00 | (2006.01) |

(52) U.S. Cl.
CPC ....... B05C 11/1039 (2013.01); H01L 21/6708 (2013.01); H01L 21/67051 (2013.01); H01L 21/68728 (2013.01); B05C 5/02 (2013.01); B05C 9/04 (2013.01); B05C 11/1044 (2013.01); H01L 21/00 (2013.01); H01L 21/67178 (2013.01)

(58) Field of Classification Search
CPC .... B05C 11/1039; B05C 11/1044; B05C 5/02; B05C 9/04; B08B 3/04; G03F 7/162; H01L 21/00; H01L 21/67178
USPC ...... 118/52, 56, 319, 320; 134/902, 21, 153, 134/33, 95.3; 269/57; 427/240
See application file for complete search history.

(56) References Cited

U.S. PATENT DOCUMENTS

| 5,250,114 A | 10/1993 | Konishi et al. ............... 118/321 |
| 5,591,262 A | 1/1997 | Sago et al. ...................... 118/52 |

(Continued)

FOREIGN PATENT DOCUMENTS

| JP | 62-185321 | 8/1987 |
| JP | 7-256195 | 10/1995 |

(Continued)

*Primary Examiner* — Laura Edwards
(74) *Attorney, Agent, or Firm* — Ostrolenk Faber LLP

(57) ABSTRACT

A substrate processing apparatus includes a chamber, a substrate holding part, a substrate rotating mechanism, a liquid receiving part, and an upper nozzle. The chamber includes a chamber body and a chamber cover, and the chamber cover is moved up and down. While the chamber cover is in contact with the chamber body, a small sealed space is formed and some processings involving pressure reduction or pressurization are performed. When the chamber cover is moved up, an annular opening is formed between the chamber cover and the chamber body. On an outer side relative to the annular opening, positioned are a first cup part and a second cup part. A processing liquid spattering from a substrate is received by the first cup part or the second cup part. In the substrate processing apparatus, it is possible to perform various processings in the small chamber.

10 Claims, 35 Drawing Sheets

(56) References Cited

U.S. PATENT DOCUMENTS

| | | | |
|---|---|---|---|
| 6,019,843 A * | 2/2000 | Park | B05C 11/08 118/319 |
| 6,248,169 B1 | 6/2001 | Juang et al. | 118/52 |
| 6,589,338 B1 | 7/2003 | Nakamori et al. | 118/50 |
| 7,802,536 B2 * | 9/2010 | Yoshihara | G03F 7/162 118/320 |
| 2001/0014224 A1 * | 8/2001 | Hasebe et al. | 396/579 |
| 2002/0074020 A1 | 6/2002 | Ono et al. | 134/21 |
| 2002/0157692 A1 | 10/2002 | Ishihara et al. | 134/134 |
| 2003/0024645 A1 | 2/2003 | Orii et al. | 156/345.33 |
| 2004/0050491 A1 | 3/2004 | Miya et al. | 156/345.11 |
| 2008/0057219 A1 | 3/2008 | Kim et al. | 427/534 |
| 2009/0079122 A1 | 3/2009 | Obweger | 269/57 |
| 2011/0240601 A1 | 10/2011 | Hashizume et al. | 216/83 |
| 2011/0250044 A1 | 10/2011 | Obweger et al. | 414/757 |
| 2011/0253181 A1 | 10/2011 | Obweger et al. | 134/157 |
| 2011/0290283 A1 | 12/2011 | Obweger et al. | 134/104.2 |
| 2011/0304107 A1 | 12/2011 | Obweger et al. | 279/60 |
| 2012/0018940 A1 | 1/2012 | Kumnig et al. | 269/225 |
| 2012/0103522 A1 | 5/2012 | Hohenwarter | 156/345.23 |
| 2012/0118504 A1 | 5/2012 | Nomura et al. | 156/345.28 |
| 2012/0305036 A1 | 12/2012 | Lach et al. | 134/137 |
| 2013/0008602 A1 | 1/2013 | Hohenwarter | 156/345.23 |
| 2013/0062839 A1 | 3/2013 | Tschinderle et al. | 279/157 |
| 2014/0060423 A1 | 3/2014 | Nakai et al. | 118/50 |

FOREIGN PATENT DOCUMENTS

| | | |
|---|---|---|
| JP | 09-246156 | 9/1997 |
| JP | H 10-144774 | 5/1998 |
| JP | 2957383 | 7/1999 |
| JP | 11-251414 | 9/1999 |
| JP | 2000-277482 A | 10/2000 |
| JP | 2001-160546 A | 6/2001 |
| JP | 2001-308162 | 11/2001 |
| JP | 2002-093891 | 3/2002 |
| JP | 2002-176026 | 6/2002 |
| JP | 2002-261068 A | 9/2002 |
| JP | 2002-324828 | 11/2002 |
| JP | 2003-151941 | 5/2003 |
| JP | 2003-284993 | 10/2003 |
| JP | 2004-172558 | 6/2004 |
| JP | 2004-207755 A | 7/2004 |
| JP | 2006-105524 | 4/2006 |
| JP | 2006-229168 | 8/2006 |
| JP | 2006-278955 A | 10/2006 |
| JP | 2007-103956 | 4/2007 |
| JP | 2008-60578 A | 3/2008 |
| JP | 2011-139015 | 7/2011 |
| JP | 2014-49606 A | 3/2014 |
| KR | 10-2006-0065225 | 6/2006 |
| KR | 2011/0107277 | 9/2011 |

* cited by examiner

SUBSTRATE PROCESSING APPARATUS

TECHNICAL FIELD

The present invention relates to a substrate processing apparatus for processing a substrate.

BACKGROUND ART

In a process of manufacturing a semiconductor substrate (hereinafter, referred to simply as a "substrate"), conventionally, various processings are performed on a substrate by using various kinds of substrate processing apparatuses. By supplying a processing liquid onto a substrate having a surface on which a resist pattern is formed, for example, a processing such as etching or the like is performed on the surface of the substrate. Further, after the etching is finished, a process of removing the resist from the substrate and a process of cleaning the substrate are also performed.

In an apparatus disclosed in Japanese Patent Application Laid-Open No. 9-246156 (Document 1), after rinsing a developer or the like on a wafer by using a rinse liquid, the wafer is dried. Specifically, a wafer is loaded into a rinse processing part and absorbed by a wafer absorption part, and after an opening of the rinse processing part is closed by a shutter, an internal space of the rinse processing part is exhausted. Then, in the internal space which has been brought into a reduced pressure atmosphere, the rinse liquid is supplied onto the wafer while the wafer is rotated together with the wafer absorption part at low speed, and after that, the wafer is dried by rotating the wafer at high speed. Further, Japanese Patent Application Laid-Open No. 2006-105524 (Document 2) discloses a vacuum drying apparatus for drying a thin film formed on a main surface of a substrate while the inside of a chamber in which the substrate is contained is brought into a reduced pressure atmosphere.

When processings using various liquids and/or a drying process are performed in one chamber, various processing liquids are deposited onto a chamber inner wall, and this reduces the collection efficiency of the processing liquids and shortens the lifetimes of the processing liquids in recycling. Further, when some deposits are left on the chamber inner wall due to a plurality of processing liquids, this may cause particles. Furthermore, there is a possibility of causing heat generation and/or smoke generation by mixture of a plurality of processing liquids. On the other hand, in order to reduce the amount of gas to be used for the processings, it is preferable that the volume of a space in the chamber should be small.

SUMMARY OF INVENTION

The present invention is intended for a substrate processing apparatus for processing a substrate, and it is an object of the present invention to provide a substrate processing apparatus capable of collecting a processing liquid with high efficiency and performing various processings in a small chamber. It is another object of the present invention to receive a processing liquid in a sealed space by using a cup part disposed outside the chamber.

The substrate processing apparatus according to one aspect of the present invention includes a chamber which forms therein an internal space which is sealed, a chamber opening and closing mechanism for moving up and down a chamber movable part including an upper portion or a lower portion of the chamber relative to the other portion of the chamber, a substrate holding part disposed in the chamber, for holding a substrate horizontally, a substrate rotating mechanism for rotating the substrate together with the substrate holding part about a central axis oriented in a vertical direction, a processing liquid supply part for supplying a processing liquid onto an upper surface or a lower surface of the substrate, and a cup part positioned on an outer side in a radial direction relative to an annular opening formed around the substrate by a movement of the chamber movable part, for receiving the processing liquid spattering from the substrate being rotated. It is thereby possible to provide a substrate processing apparatus capable of collecting the processing liquid with high efficiency and performing various processings in a small chamber.

In another aspect of the present invention, the substrate processing apparatus includes a chamber which forms therein an internal space which is sealed, a chamber opening and closing mechanism for moving up and down a chamber cover including an upper portion of the chamber relative to the other portion of the chamber, a substrate holding part disposed in the chamber, for holding a substrate horizontally, a substrate rotating mechanism for rotating the substrate together with the substrate holding part about a central axis oriented in a vertical direction, a processing liquid supply part for supplying a processing liquid onto the substrate, and a top plate which has a plate-like shape perpendicular to the central axis and is attached to the chamber cover rotatably about the central axis, being engaged with the substrate holding part in a circumferential direction about the central axis while the chamber forms the internal space which is sealed. It is thereby possible to prevent a liquid deposited on the inside of the chamber from dropping onto the substrate, with a simple structure.

In still another aspect of the present invention, the substrate processing apparatus includes a chamber having a chamber body and a chamber cover and forming an internal space which is sealed by closing an upper opening of the chamber body by the chamber cover, a chamber opening and closing mechanism for moving the chamber cover in a vertical direction relative to the chamber body, a substrate holding part disposed in the chamber, for holding a substrate horizontally, a substrate rotating mechanism for rotating the substrate together with the substrate holding part about a central axis oriented in the vertical direction, a processing liquid supply part for supplying a processing liquid onto the substrate, a cup part positioned on an outer side in a radial direction relative to an annular opening formed around the substrate by causing the chamber cover to be apart from the chamber body, along the entire circumference thereof, for receiving the processing liquid spattering from the substrate being rotated, and a cup moving mechanism for moving the cup part in the vertical direction between a first position on the outer side in the radial direction relative to the annular opening and a second position lower than the first position, and in the substrate processing apparatus of the present invention, the cup part includes a sidewall portion having a substantially cylindrical shape and being opposed to the annular opening in the radial direction at the first position, a first seal portion on which a first seal is formed between the first seal portion and the chamber cover along the entire circumference of the chamber cover at the first position, and a second seal portion on which a second seal is formed between the second seal portion and the chamber body along the entire circumference of the chamber body at the first position, and a sealed space is formed by the chamber cover and the chamber body in a state where the annular opening is formed, and the cup part positioned at the first position. It is thereby possible to receive the processing liquid in the sealed space by using the cup part disposed outside the chamber.

In yet another aspect of the present invention, the substrate processing apparatus includes a substrate supporting part for supporting a substrate horizontally from below, an upper rotating member disposed above the substrate supporting part, a position regulating member for regulating a position of the upper rotating member relative to the substrate supporting part in a circumferential direction about a central axis oriented in a vertical direction, a substrate retaining part fixed to the upper rotating member, for retaining the substrate held by the substrate supporting part from above, a substrate rotating mechanism for rotating the substrate together with the substrate supporting part, the substrate retaining part, and the upper rotating member, and a processing liquid supply part for supplying a processing liquid onto the substrate, and in the substrate processing apparatus of the present invention, the substrate supporting part includes a plurality of first contact parts which come into contact with an outer edge of the substrate at a plurality of first contact positions, respectively, and the substrate retaining part includes a plurality of second contact parts which come into contact with the outer edge of the substrate at a plurality of second contact positions different from the plurality of first contact positions, respectively, in the circumferential direction. It is thereby possible to prevent the processing liquid from remaining near the holding structure for holding the substrate.

In further aspect of the present invention, the substrate processing apparatus includes a chamber having a chamber body and a chamber cover and forming an internal space which is sealed by closing an upper opening of the chamber body by the chamber cover, a chamber opening and closing mechanism for moving the chamber cover in a vertical direction relative to the chamber body, a substrate supporting part disposed in the chamber, for supporting a substrate horizontally, a top plate disposed above the substrate supporting part, having a lower surface perpendicular to a central axis oriented in the vertical direction and opposed to the substrate, a position regulating member for regulating a position of the top plate relative to the substrate supporting part in a circumferential direction about the central axis, a substrate rotating mechanism for rotating the substrate together with the substrate supporting part and the top plate about the central axis, a processing liquid supply part for supplying a processing liquid onto the substrate, and a top plate moving mechanism for moving the top plate in the vertical direction relative to the chamber cover by using magnetic force. It is thereby possible to change a distance between the top plate and the substrate in the vertical direction in the chamber.

These and other objects, features, aspects and advantages of the present invention will become more apparent from the following detailed description of the present invention when taken in conjunction with the accompanying drawings.

DESCRIPTION OF EMBODIMENTS

Figure 1:
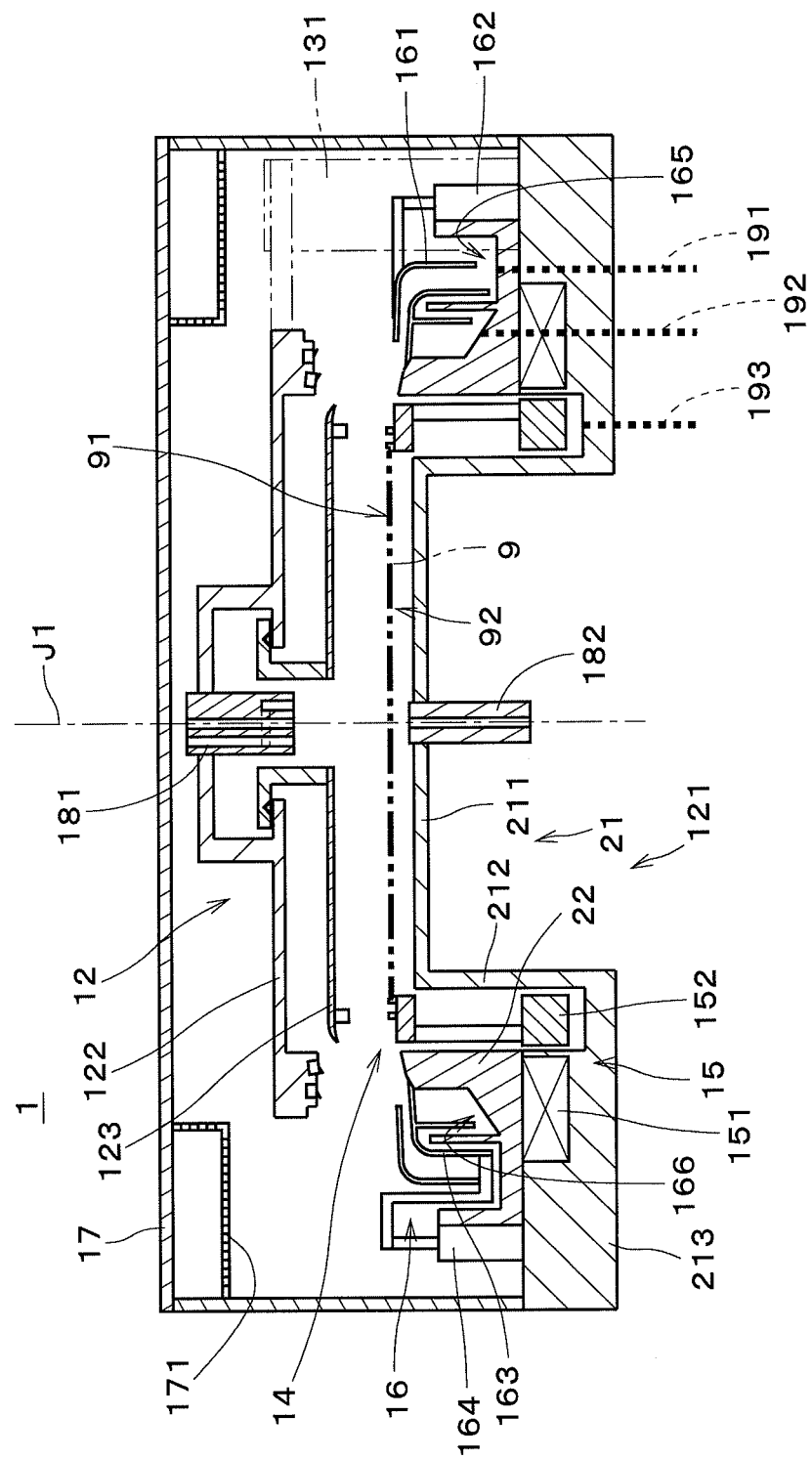
FIG. 1 is a cross section showing a substrate processing apparatus in accordance with a first preferred embodiment of the present invention.

FIG. 1 is a view showing a configuration of a substrate processing apparatus 1 in accordance with the first preferred embodiment of the present invention. The substrate processing apparatus 1 is a single-substrate processing apparatus which supplies a processing liquid onto a semiconductor substrate 9 (hereinafter, referred to simply as a "substrate 9") having a substantially disk-like shape and thereby processes substrates 9 one by one.

The substrate processing apparatus 1 includes a chamber 12, a chamber opening and closing mechanism 131, a substrate holding part 14, a substrate rotating mechanism 15, a liquid receiving part 16, and a cover 17.

The chamber 12 includes a chamber body 121, a chamber cover 122, and a top plate 123. The chamber body 121 is formed of a non-magnetic material. The chamber body 121 includes a chamber bottom 21 and a chamber sidewall 22. The chamber bottom 21 includes a substantially disk-like center portion 211, a cylindrical inner wall portion 212 extending downward from an outer edge of the center portion 211, and a base portion 213 extending outward in a radial direction from the inner wall portion 212. When the substrate holding part 14 holds a substrate 9, a lower surface 92 of the substrate 9 is opposed to an upper surface of the center portion 211. The chamber sidewall 22 has an annular shape about a central axis J1 oriented in a vertical direction and protrudes upward from the base portion 213. The member which forms the chamber sidewall 22 serves as part of the liquid receiving part 16 as discussed later.

The chamber cover 122 has a substantially disk-like shape perpendicular to the central axis J1 and includes an upper portion of the chamber 12. The chamber cover 122 closes an upper opening of the chamber body 121. FIG. 1 shows a state in which the chamber cover 122 is apart from the chamber body 121. When the chamber cover 122 closes the upper opening of the chamber body 121, an outer edge of the chamber cover 122 is in contact with an upper portion of the chamber sidewall 22.

The top plate 123 has a substantially disk plate-like shape perpendicular to the central axis J1 and has an opening at its center. When the substrate 9 is held by the substrate holding part 14, the upper surface 91 of the substrate 9 is opposed to a lower surface of the top plate 123. The top plate 123 is so attached to the chamber cover 122 as to be suspended from the chamber cover 122. More exactly, the top plate 123 is attached to the chamber cover 122 with a distance between the top plate 123 and the chamber cover 122 being changeable. The top plate 123 is rotatable about the central axis J1 with respect to the chamber cover 122.

The chamber opening and closing mechanism 131 moves up and down the chamber cover 122 which is a movable part of the chamber 12 relative to the other portion of the chamber 12. Hereinafter, the chamber opening and closing mechanism 131 will be referred to as a "cover up-and-down moving mechanism 131". By bringing the chamber cover 122 into contact with the chamber body 121 and pressing the chamber cover 122 toward the chamber body 121, a sealed internal space 120 (see FIG. 7) is formed in the chamber 12.

The substrate holding part 14 has an annular shape about the central axis J1 and holds an outer edge of the substrate 9. The substrate holding part 14 is disposed in the chamber 12 and holds the substrate 9 horizontally. In other words, the substrate 9 is held by the substrate holding part 14 with the upper surface 91 thereof directed upward, being perpendicular to the central axis J1. As a chuck mechanism in which the substrate holding part 14 holds the substrate 9, various mechanisms may be used.

The substrate rotating mechanism 15 is a so-called hollow motor. The substrate rotating mechanism 15 includes a stator part 151 having an annular shape about the central axis J1 and an annular rotor part 152. The rotor part 152 includes a permanent magnet having a substantially annular shape. A surface of the permanent magnet is molded by PTFE (polytetrafluoroethylene) resin. The rotor part 152 is disposed in an annular space having a bottom between the inner wall portion 212 and the chamber sidewall 22. The rotor part 152 is connected to the substrate holding part 14 with a connecting member.

The stator part 151 is disposed on an outer side in the radial direction relative to the rotor part 152, outside the chamber 12 (that is, outside the internal space 120). In this preferred embodiment, the stator part 151 is fixed to the base portion 213 and positioned below the liquid receiving part 16. The stator part 151 includes a plurality of coils which are arranged in a circumferential direction about the central axis J1.

By supplying current to the stator part 151, a rotating force is generated about the central axis J1 between the stator part 151 and the rotor part 152. The rotor part 152 thereby rotates horizontally about the central axis J1. By magnetic force exerted between the stator part 151 and the rotor part 152, the rotor part 152 floats in the chamber 12, not being in direct or indirect contact with the chamber 12, and rotates together with the substrate 9 and the substrate holding part 14 about the central axis J1.

The liquid receiving part 16 includes a first cup part 161, a first cup up-and-down moving mechanism 162, a second cup part 163, and a second cup up-and-down moving mechanism 164. As discussed earlier, part of the member forming the chamber sidewall 22 is included in the liquid receiving part 16. The second cup part 163 has an annular shape about the central axis J1 and is positioned on an outer side in the radial direction relative to the chamber sidewall 22. The first cup part 161 also has an annular shape and is positioned on an outer side in the radial direction relative to the second cup part 163. The first cup up-and-down moving mechanism 162 moves the first cup part 161 up and down, and the second cup up-and-down moving mechanism 164 moves the second cup part 163 up and down.

A lower portion of an inner peripheral portion of the second cup part 163 is positioned in an annular second recessed portion 166 positioned on an outer side relative to the chamber sidewall 22. A lower portion of the first cup part 161 is positioned in an annular first recessed portion 165 positioned on an outer side relative to the second recessed portion 166. The members which form the first recessed portion 165 and the second recessed portion 166 are continuous with the member which forms the chamber sidewall 22.

At a center of the chamber cover 122, an upper nozzle 181 is fixed. The upper nozzle 181 is opposed to the opening at the center of the top plate 123. At a center of the center portion 211 of the chamber bottom 21, a lower nozzle 182 is attached. A bottom portion of the first recessed portion 165 is connected to a first discharge path 191. A bottom portion of the second recessed portion 166 is connected to a second discharge path 192. A bottom portion of a recessed portion between the inner wall portion 212 and the chamber sidewall 22 is connected to a third discharge path 193. The positions where the upper nozzle 181 and the lower nozzle 182 are attached are not necessarily limited to the center portions, but the upper nozzle 181 and the lower nozzle 182 may be attached to, for example, positions opposed to a peripheral portion of the substrate 9.

The cover 17 covers the chamber 12 from the upper and side directions thereof. At an upper portion of the cover 17, provided is a multiple hole part 171. Since air flows out from many holes formed in the multiple hole part 171, downflow occurs in the cover 17. It is thereby possible to prevent particles from rising from the liquid receiving part 16 and the chamber bottom 21 to the substrate 9.

Figure 2:
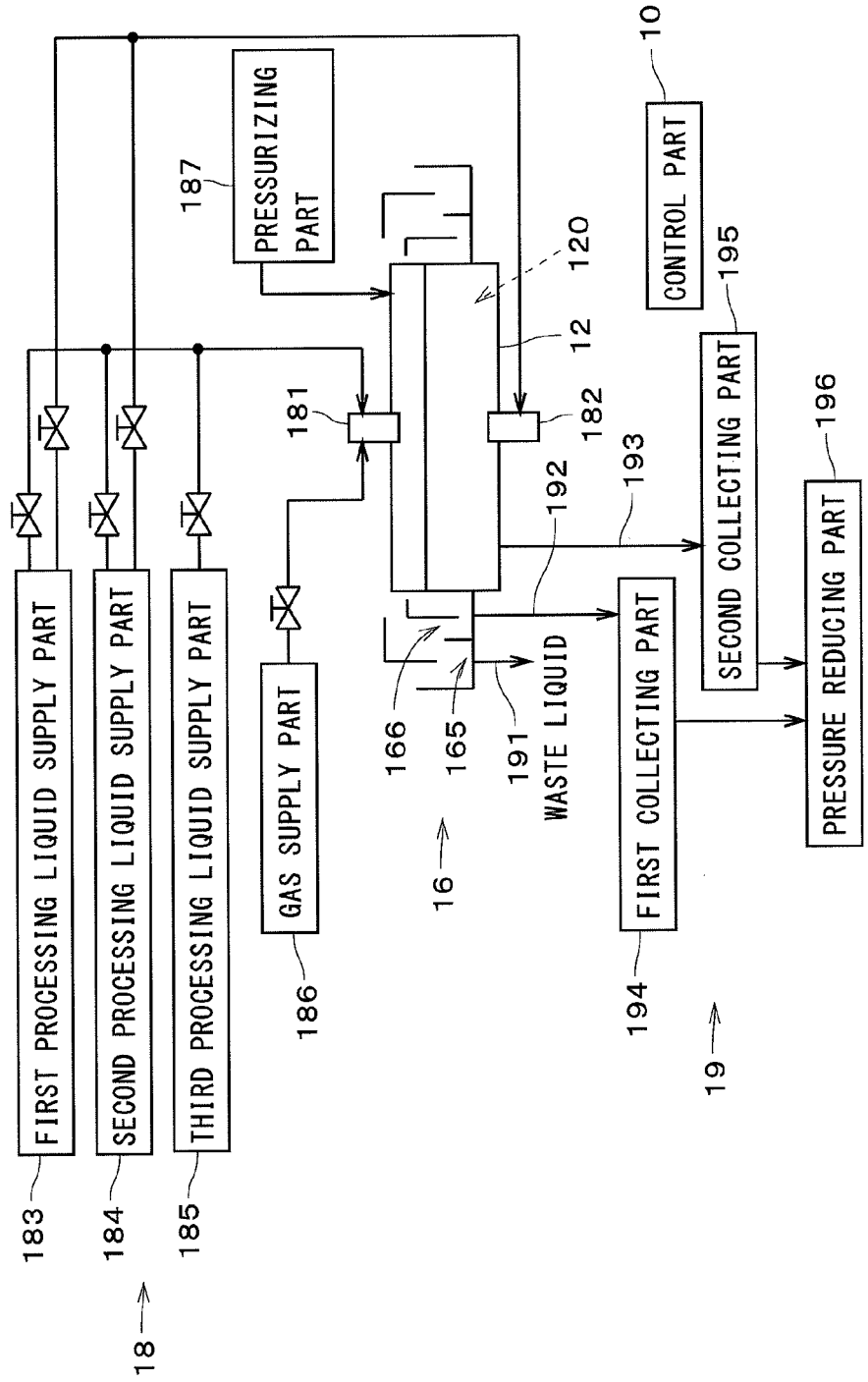
FIG. 2 is a block diagram showing a processing liquid supply part and a liquid collecting part.

FIG. 2 is a block diagram showing a processing liquid supply part 18 and a liquid collecting part 19 included in the substrate processing apparatus 1. The processing liquid supply part 18 includes a first processing liquid supply part 183, a second processing liquid supply part 184, and a third processing liquid supply part 185 besides the upper nozzle 181 and the lower nozzle 182. The first processing liquid supply part 183, the second processing liquid supply part 184, and the third processing liquid supply part 185 are connected to the upper nozzle 181 through valves, respectively. The lower nozzle 182 is connected to the first processing liquid supply part 183 and the second processing liquid supply part 184 through valves, respectively. The upper nozzle 181 is also connected to a gas supply part 186. The upper nozzle 181 has a liquid ejection port at its center and also has a gas ejection port around the liquid ejection port. Therefore, more exactly, part of the upper nozzle 181 serves as a gas supply part for supplying gas onto the substrate 9 in a broad sense. The lower nozzle 182 has a liquid ejection port at its center.

To the chamber 12, connected is a pressurizing part 187 for increasing pressure in the internal space 120 of the chamber 12 while the chamber 12 is sealed. By the pressurizing part 187, the internal space 120 is brought into a pressurized atmosphere where the pressure is higher than atmospheric pressure. The gas supply part 186 may serve also as the pressurizing part. When pressurization is not needed, the pressurizing part 187 may be omitted.

The first discharge path 191 which is connected to the first recessed portion 165 of the liquid receiving part 16 is connected to a waste liquid path. The second discharge path 192 which is connected to the second recessed portion 166 is connected to a first collecting part 194. The third discharge path 193 which is connected to the chamber bottom 21 is connected to a second collecting part 195. The first collecting part 194 and the second collecting part 195 are connected to a pressure reducing part 196. By driving the pressure reducing part 196, the processing liquid is collected in the first collecting part 194 and the second collecting part 195. While the chamber 12 is sealed, the pressure reducing part 196 reduces the pressure in the internal space 120 and the internal space 120 is thereby bought into a reduced pressure atmosphere where the pressure is lower than atmospheric pressure. The first collecting part 194 and the second collecting part 195 are also connected to the waste liquid path, and the liquid can be discarded from the second discharge path 192 and the third discharge path 193.

The first processing liquid supply part 183, the second processing liquid supply part 184, the third processing liquid supply part 185, the gas supply part 186, the pressurizing part 187, the first collecting part 194, the second collecting part 195, the pressure reducing part 196, and the valves are controlled by a control part 10. The cover up-and-down moving mechanism 131, the substrate holding part 14, the substrate rotating mechanism 15, the first cup up-and-down moving mechanism 162, and the second cup up-and-down moving mechanism 164 are also controlled by the control part 10.

In this preferred embodiment, a first processing liquid supplied from the first processing liquid supply part 183 is an etching solution such as hydrofluoric acid, a tetramethylammonium hydroxide solution, or the like. A second processing liquid supplied from the second processing liquid supply part 184 is deionized water (DIW). A third processing liquid supplied from the third processing liquid supply part 185 is isopropyl alcohol (IPA). Further, the gas supply part 186 supplies nitrogen gas ($N_2$) to the inside of the chamber 12.

Figure 3:
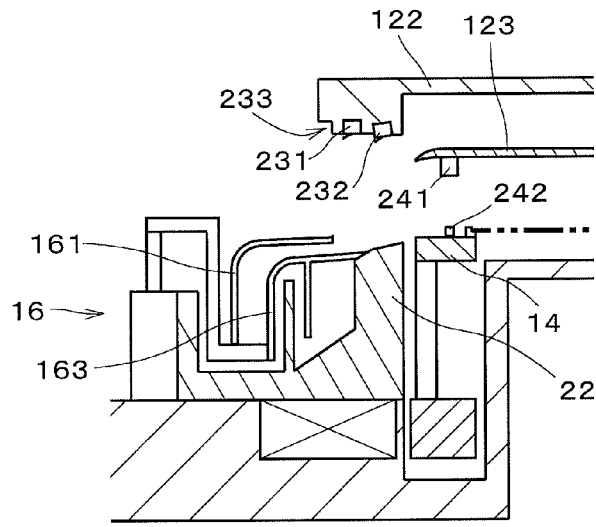
FIG. 3 is an enlarged view showing the vicinity of a liquid receiving part.

FIG. 3 is an enlarged view showing the vicinity of the liquid receiving part 16. At a lower portion of the outer edge of the chamber cover 122, provided are two annular lip seals 231 and 232. The lip seal 231 is positioned above an upper end portion of the second cup part 163. The lip seal 232 is positioned above an upper end portion of the chamber sidewall 22. When the chamber cover 122 moves down and the second cup part 163 moves up, the lip seal 231 comes into contact with the upper end portion of the second cup part 163. When the chamber cover 122 moves down to the chamber sidewall 22, the lip seal 232 comes into contact with the upper end portion of the chamber sidewall 22.

At a lower portion of the outer edge of the chamber cover 122 which is an upper portion of the chamber 12, provided is a recessed portion 233 which is recessed upward and inward in the radial direction along the entire circumference of the chamber cover 122. When the chamber cover 122 moves down and the first cup part 161 moves up, the upper end portion of the first cup part 161 comes into contact with the recessed portion 233 with respect to the vertical direction. The upper end portion of the first cup part 161 may only come close to the recessed portion 233. When the second cup part 163 moves down, the upper portion of the chamber sidewall 22 comes into contact with the upper end portion of the second cup part 163.

At the lower surface of an outer edge of the top plate 123, a plurality of first engaging parts 241 are arranged in the circumferential direction. On the upper surface of the substrate holding part 14, a plurality of second engaging parts 242 are arranged in the circumferential direction. It is preferable that three or more pairs of these first and second engaging parts should be provided, and in this preferred embodiment, provided are four pairs of first and second engaging parts. At a lower portion of each of the first engaging parts 241, provided is a recessed portion which is recessed upward. The second engaging parts 242 protrude upward from the substrate holding part 14.

When the chamber cover 122 moves down, the second engaging parts 242 get engaged with the recessed portions of the first engaging parts 241, respectively. The top plate 123 thereby gets engaged with the substrate holding part 14 in the circumferential direction about the central axis J1. When the substrate holding part 14 is rotated by the substrate rotating mechanism 15 in this state, the top plate 123 is also rotated. When the top plate 123 moves down, a rotation position of the substrate holding part 14 is controlled so that the first engaging parts 241 and the second engaging parts 242 may be engaged with each other.

Figure 4:
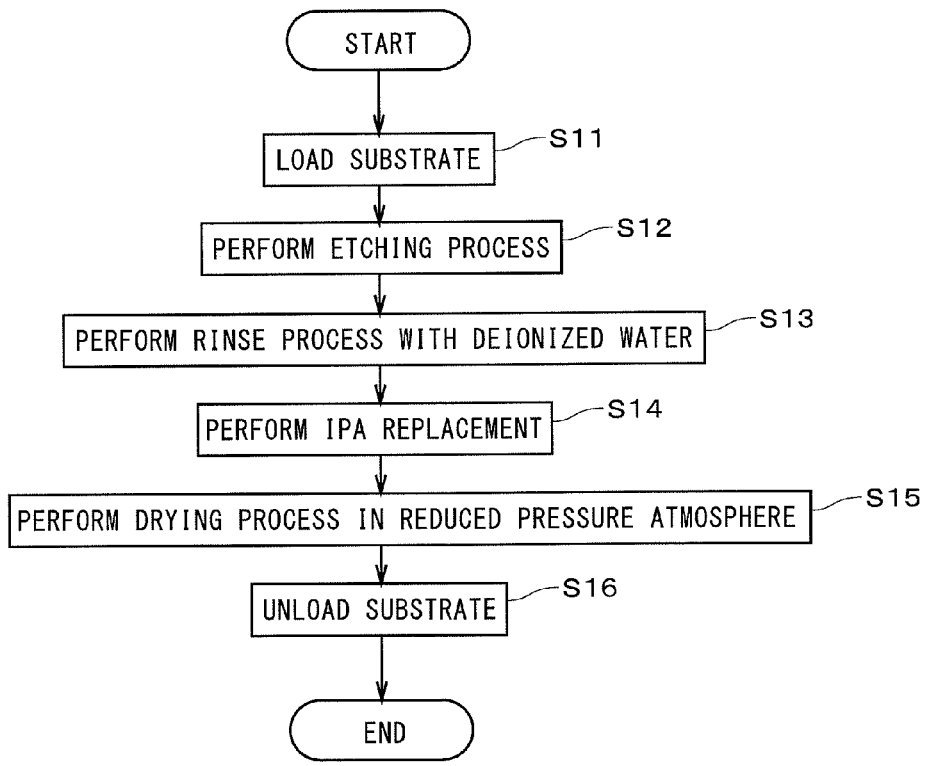
FIG. 4 is a flowchart showing an exemplary operation of the substrate processing apparatus.
Figure 5:
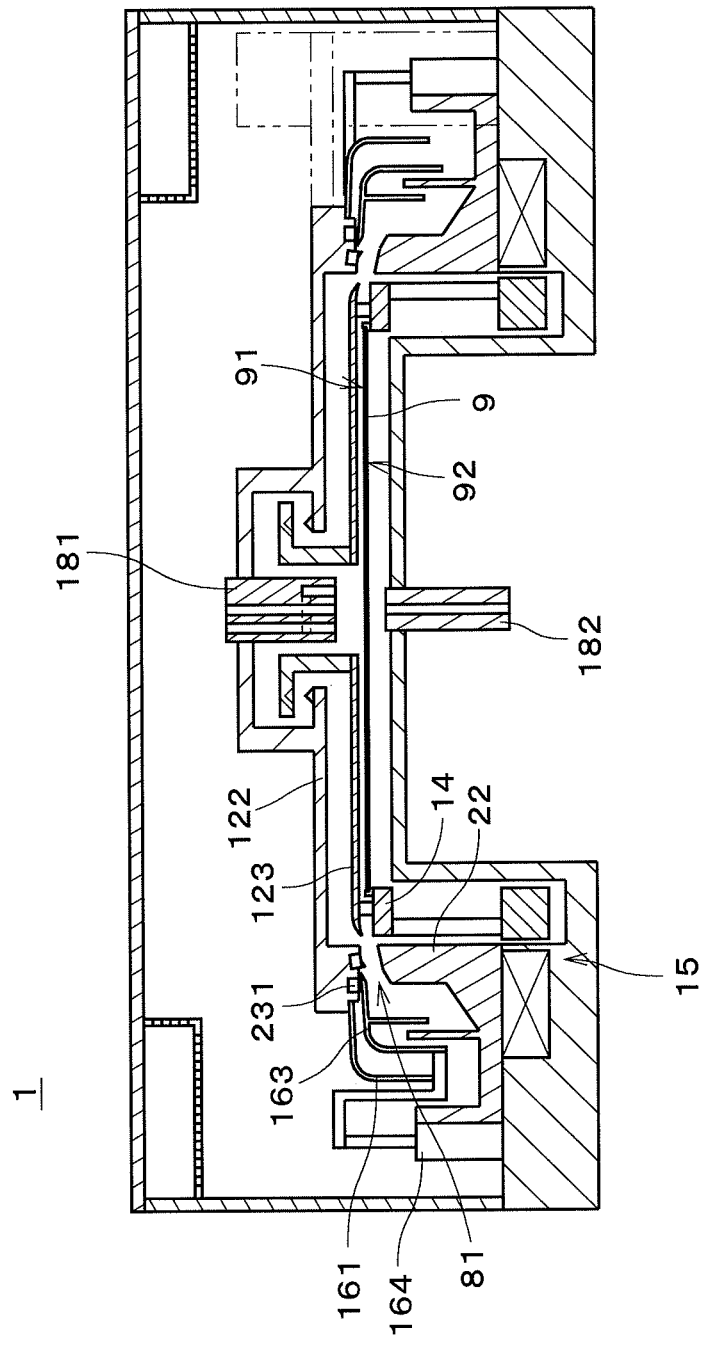
FIGS. 5 to 8 are cross sections each showing the substrate processing apparatus.

Next, with reference to FIG. 4, discussion will be made on an operation flow for processing the substrate 9 in the substrate processing apparatus 1 under the control of the control part 10. The operation shown in FIG. 4 is only one example, and various processings may be performed in various orders in the substrate processing apparatus 1. In the substrate processing apparatus 1, first, the substrate 9 is transferred and held by the substrate holding part 14 while the chamber cover 122 is positioned high as shown in FIG. 1 (Step S11). Then, the chamber cover 122 moves down, and the top plate 123 gets engaged with the substrate holding part 14 as shown in FIG. 5. The chamber cover 122 is apart from the chamber sidewall 22, and an annular opening 81 is formed between the chamber cover 122 and the chamber sidewall 22 around the substrate 9 (that is, on an outer side in the radial direction relative to the substrate 9).

The second cup part 163 moves up and gets positioned on an outer side in the radial direction relative to the annular opening 81. Thus, the second cup up-and-down moving mechanism 164 moves the second cup part 163 between the a position on the outer side relative to the annular opening 81 in the radial direction and another position lower the position. Then, the upper end portion of the second cup part 163 comes into contact with the lip seal 231. Since a sealed space is thereby formed around the substrate 9 in the chamber 12, it is possible to prevent particles from entering the second cup part 163 even if the particles drop from above. Further, the upper end portion of the first cup part 161 also comes into contact with the chamber cover 122, and it is thereby possible to prevent particles from entering the first cup part 161. Hereinafter, a state of the chamber 12 in which the annular opening 81 is formed will be referred to as a "semiopen state". The state shown in FIG. 1 will be referred to as an "open state".

Next, the substrate rotating mechanism 15 starts high-speed rotation of the substrate holding part 14 and the substrate 9. Further, the substrate 9 is heated by a not-shown heater. Then, the first processing liquid from the first processing liquid supply part 183 (see FIG. 2) is supplied onto a center portion of the upper surface 91 of the substrate 9 from the upper nozzle 181. The first processing liquid is spread toward the outer peripheral portion of the substrate 9 by the rotation of the substrate 9, and the entire upper surface 91 is coated with the first processing liquid (Step S12).

The first processing liquid is also supplied onto a center portion of the lower surface 92 of the substrate 9 from the lower nozzle 182 and is spread toward the outer peripheral portion of the substrate 9 by the rotation of the substrate 9. The first processing liquid spattering from the upper surface 91 and the lower surface 92 of the substrate 9 is received by the second cup part 163 through the annular opening 81 and collected by the second collecting part 195. If the collected first processing liquid can be recycled, the first processing liquid is recycled after removing impurities and the like therefrom through a filter or the like. The outer edge of the top plate 123 is slightly sloped downward as it goes outward in the radial direction. Since the processing liquid is guided by the outer edge of the top plate 123, the processing liquid can be appropriately received by the liquid receiving part 16 through the annular opening 81.

After the etching process using the first processing liquid is finished, the supply of the first processing liquid is stopped, and then the upper nozzle 181 ejects nitrogen gas and the first processing liquid is removed from the substrate 9 by the rotation of the substrate 9. Since the top plate 123 is rotated together with the substrate holding part 14, almost no first processing liquid is left on the lower surface of the top plate 123 and no first processing liquid drops from the top plate 123.

Figure 6:
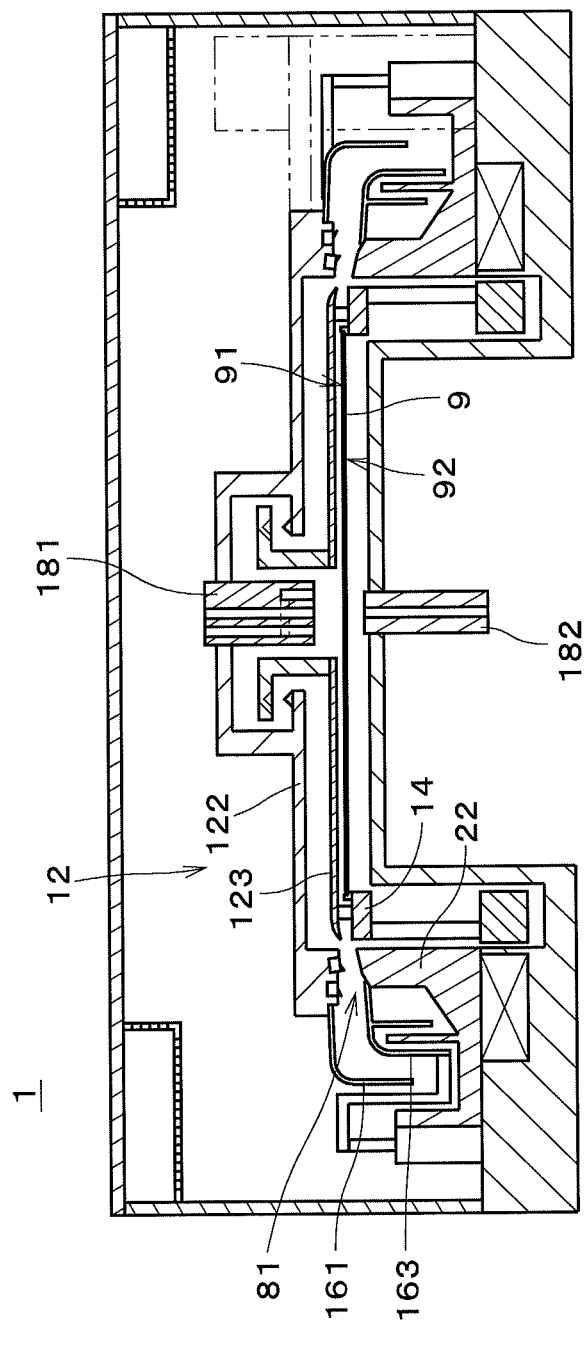

Next, while the chamber 12 remains in the semiopen state, the second cup part 163 moves down, and the first cup part 161 gets positioned on the outer side relative to the annular opening 81 in the radial direction as shown in FIG. 6. In other words, the second cup up-and-down moving mechanism 164 switches between the state in which the second cup part 163 receives the processing liquid from the substrate 9 and the state in which the first cup part 161 receives the processing liquid from the substrate 9. The upper end portion of the second cup part 163 comes into contact with the upper portion of the chamber sidewall 22, and the inside of the chamber 12 is separated from the space inside the second cup part 163. The upper end portion of the first cup part 161 is in contact with the chamber cover 122.

While the top plate 123 is engaged with the substrate holding part 14, the upper nozzle 181 positioned at the center of the top plate 123 continuously ejects the second processing liquid which is deionized water and the second processing liquid is thereby supplied onto the center portion of the upper surface 91 of the substrate 9 being rotated. By the rotation of the substrate 9, the second processing liquid is spread toward the outer peripheral portion of the substrate 9 and spattered outside from the outer peripheral edge of the substrate 9. The second processing liquid is also supplied onto the center portion of the lower surface 92 of the substrate 9 from the lower nozzle 182 and spread toward the outer peripheral portion of the substrate 9 by the rotation of the substrate 9. The used water which is the second processing liquid spattering from the substrate 9 is received by the second cup part 163 and discarded (Step S13). In the process of rinsing the substrate 9 by using the second processing liquid, the supply of the second processing liquid onto the lower surface 92 is stopped at some midpoint and the rotation speed of the substrate 9 decreases. The clearance between the top plate 123 and the substrate 9 is thereby filled with the second processing liquid. In other words, the deionized water paddles on the substrate 9.

Figure 7:
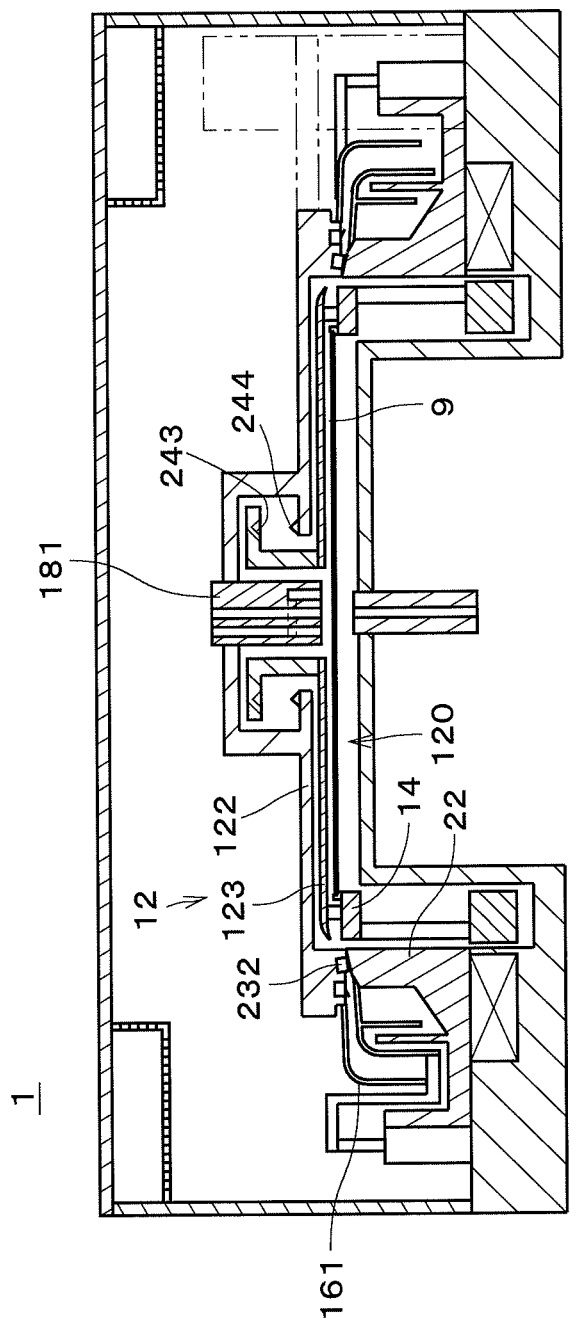

Next, the supply of the second processing liquid is stopped, and the third processing liquid which is isopropyl alcohol (IPA) is supplied onto the upper surface 91 of the substrate 9 only from the upper nozzle 181. The clearance between the top plate 123 and the substrate 9 is thereby filled with the third processing liquid, and then the supply of the third processing liquid is stopped. The deionized water is thereby replaced with the isopropyl alcohol (IPA) on the substrate 9 (Step S14). After that, as shown in FIG. 7, the chamber cover 122 and the first cup part 161 move down. The lip seal 232 of the chamber cover 122 comes into contact with the upper portion of the chamber sidewall 22. The sealed internal space 120 is thereby formed in the chamber 12. Since the top plate 123 is movable in the vertical direction relative to the chamber cover 122, the top plate 123 remains engaged with the substrate holding part 14. While the chamber 12 is sealed, the substrate 9 and the substrate holding part 14 are opposed directly to the sidewall of the chamber 12 and there is no other liquid receiving part therebetween. The chamber 12 may be sealed before Step S14. Though the processing is performed in a liquid-tight state where the clearance between the top plate 123 and the substrate 9 is filled with the processing liquid in Steps S13 and S14 in this preferred embodiment, there may be a case where the top plate 123 is positioned higher than that in this case and the processing is performed in a state where the clearance between the top plate 123 and the substrate 9 is not filled with the processing liquid.

By rotating the substrate 9 at high speed in the sealed space and ejecting nitrogen gas ($N_2$) from the upper nozzle 181, the third processing liquid is removed from the substrate 9. The third processing liquid spattering from the substrate 9 is received by the chamber sidewall 22 and collected by the second collecting part 195. At that time, the pressure reducing part 196 reduces pressure in the internal space 120 of the chamber 12, to thereby promote drying of the substrate 9 (Step S15). If the third processing liquid collected by the second collecting part 195 is recycled, impurities and the like are removed from the third processing liquid. After the drying of the substrate 9 is finished, the rotation of the substrate 9 is stopped.

Further, the substrate 9 may be heated while being dried. Before reducing the pressure, the pressurizing part 187 may increase the pressure in the internal space 120. This makes it possible for the third processing liquid to easily enter the inside of the pattern on the substrate 9.

After that, the pressure in the internal space 120 is increased back to the normal pressure, and the chamber cover 122 moves up as shown in FIG. 1. Since the top plate 123 is rotated together with the substrate holding part 14, almost no liquid is left on the lower surface of the top plate 123 and no liquid drops from the top plate 123 while the chamber cover 122 moves up. The substrate 9 is unloaded by an external transfer mechanism (Step S16). When the chamber cover 122 moves up, a plurality of projections 244 provided on the chamber cover 122 get engaged with an annular groove portion 243 provided in a lower surface of an upper portion of the top plate 123, and the top plate 123 is thereby aligned with respect to the chamber cover 122. As a structure for alignment, any other structure may be used.

Figure 8:
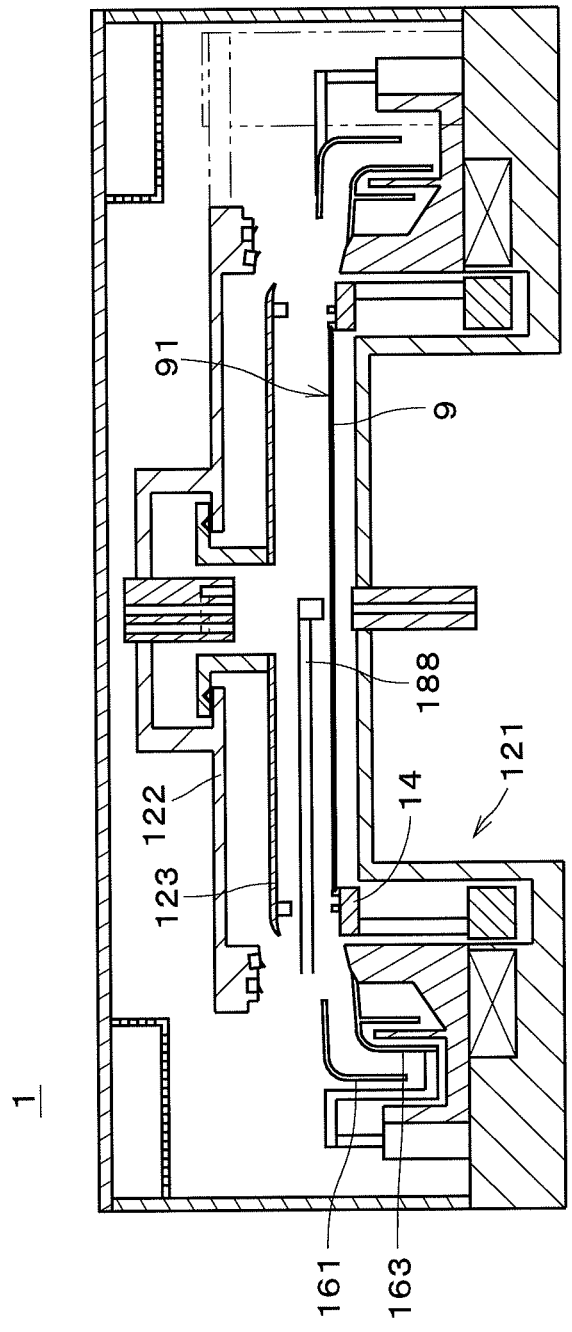

As shown in FIG. 8, a scan nozzle 188 may be additionally provided in the processing liquid supply part 18 of the substrate processing apparatus 1. In the case where the scan nozzle 188 is used, the chamber 12 is brought into the open state where the chamber cover 122 is positioned above and largely apart from the chamber body 121 and the top plate 123 is apart from the substrate holding part 14. Therefore, the top plate 123 is not rotated. Thus, when a distance between the chamber cover 122 and the other portion of the chamber 12 is a first distance, the top plate 123 is engaged with the substrate holding part 14 in the circumferential direction, and when the distance is a second distance larger than the first distance, the top plate 123 is apart from the substrate holding part 14. Between the chamber cover 122 and the chamber body 121, the scan nozzle 188 is inserted from the outside of the chamber 12 and moved to above the substrate 9. The scan nozzle 188 is a two-fluid nozzle used, for example, for cleaning with deionized water after an SC1 process. The scan nozzle 188 may be any type of nozzle other than the two-fluid nozzle. The scan nozzle 188 supplies the processing liquid onto the upper surface 91 of the substrate 9 while repeating a reciprocating motion in the horizontal direction. The scan nozzle 188 may be any other type of nozzle for other processings. When the two-fluid nozzle is used as the scan nozzle 188, it is preferable that a not-shown gas exhaust facility should be connected to the inside of the cover 17 to sufficiently discharge the generated processing liquid mist.

When the processing liquid from the scan nozzle 188 is discarded, the first cup part 161 moves up and the second cup part 163 moves down. The outer edge of the substrate 9 is opposed to the first cup part 161 in the radial direction. When the processing liquid is collected and recycled, both the first cup part 161 and the second cup part 163 move up. The outer edge of the substrate 9 is opposed to the second cup part 163 in the radial direction.

Thus, the substrate processing apparatus 1 can perform both a processing in a state where the chamber 12 is sealed (hereinafter, the processing will be referred to as a "sealed-state processing") and a processing in another state where the chamber 12 is in the semiopen state or the open state (hereinafter, the processing will be referred to as an "open-state processing"). In other words, more various processings than in the conventional cases can be performed by one apparatus. Especially, the sealed-state processing and the open-state processing, which involve pressure reduction and/or pressurization, can be continuously performed. In a case where the scan nozzle 188 is provided, a processing using the scan nozzle 188 can be also performed continuously with the sealed-state processing. Further, since the liquid receiving part 16 is disposed outside the chamber 12, it is possible to collect the processing liquid with high efficiency and reduce the size and volumetric capacity of the chamber 12. This makes it possible to easily and efficiently perform processings involving pressurization and/or pressure reduction and reduce the amount of gas to be filled in the chamber 12. Furthermore, since the surroundings of the substrate 9 in the chamber 12 can be almost sealed even when the chamber 12 is in the semiopen state, it is possible to prevent an undesirable atmosphere inside the cover 17 from flowing in the inside of the chamber 12. In the above-discussed Step S12, for example, by supplying the first processing liquid onto the substrate 9 while ejecting nitrogen gas ($N_2$) from the upper nozzle 181 in the semiopen state shown in FIG. 5, the surroundings of the substrate 9 in the chamber 12 is brought into a nitrogen atmosphere, with undesirable oxygen and/or processing liquid atmosphere being removed, and the processings can be performed in a low oxygen atmosphere. Such as a processing performed in the low oxygen atmosphere is useful, for example, in a polymer removal process or the like for a substrate on which copper wiring is formed, to prevent oxidation of the copper wiring.

Since the first cup part 161 and the second cup part 163 are provided in the liquid receiving part 16, a plurality of kinds of processing liquids can be collected separately. The processing liquid used in the sealed-state processing and that used in the open-state processing can be also collected separately. It is thereby possible to increase the collection efficiency of the processing liquids and prolong the lifetimes of the processing liquids as compared with the case where a plurality of kinds of processing liquids are received only by the chamber inner wall and collected separately by using a multiple valve. Further, it is possible to easily prevent generation of particles, heat generation, smoke generation, or the like caused by mixture of different kinds of processing liquids.

In the chamber 12, deionized water may be supplied onto the substrate 9 in a sealed state. The used water or isopropyl alcohol (IPA) spattering from the substrate 9 is received by the chamber 12 in the sealed state, and if the processing liquid is a liquid chemical which causes a chemical reaction on the substrate 9, the processing liquid is received by the cup part in the semiopen state. This reduces contamination inside the chamber 12. Thus, since the inner wall of the chamber 12 and the cup parts each serve as a liquid receiving part dedicated to a specific processing liquid, it is possible to collect the processing liquid with high purity and low loss.

Further, since all the cup parts can be moved up and down, it is possible to easily handle the substrate 9 in loading.

In the substrate processing apparatus 1, by using the top plate 123, it is possible to prevent the liquid deposited on the inside of the chamber from dropping onto the substrate with a simple structure. In performing a processing, since the top plate 123 gets close to the substrate 9 while being engaged with the substrate holding part 14, it is possible to reduce the amount of processing liquid required to coat the upper surface 91 of the substrate 9. It is also possible to reduce the amount of gas to be supplied between the top plate 123 and the substrate 9.

Since the top plate 123 can be moved in the vertical direction relative to the chamber cover 122, it is possible to rotate the top plate 123 together with the substrate holding part 14 both in the sealed state and in the semiopen state. Further, by moving the chamber cover 122 up slightly from the semiopen state, the engagement between the top plate 123 and the substrate holding part 14 can be released. It is also possible to eject the processing liquid from the upper nozzle 181 to perform a processing in such an open state.

In the substrate processing apparatus 1, the rotor part 152 is disposed in the internal space 120 which can be sealed and the stator part 151 is disposed outside the chamber 12. It is thereby possible to easily form the internal space 120 having excellent hermeticity. As a result, it is possible to easily achieve a single-substrate processing on the substrate 9 in the sealed internal space 120. Further, it is possible to more easily provide various structures such as the lower nozzle 182 or the like on the chamber bottom 21, as compared with in an apparatus in which a motor is provided below the chamber bottom.

In the substrate rotating mechanism 15, the rotor part 152 rotates, being in a floating state in the internal space 120. For this reason, it is not necessary to provide any structure for supporting the rotor part 152 in the internal space 120, and it is thereby possible to reduce the size and simplify the configuration of the substrate processing apparatus 1. Since no dust or the like is generated due to friction between the rotor part 152 and the supporting structure, it is possible to improve cleanability of the internal space 120. Furthermore, since no friction resistance caused by the supporting structure is exerted on the rotor part 152, it is possible to easily rotate the rotor part 152 at high speed.

Figure 9:
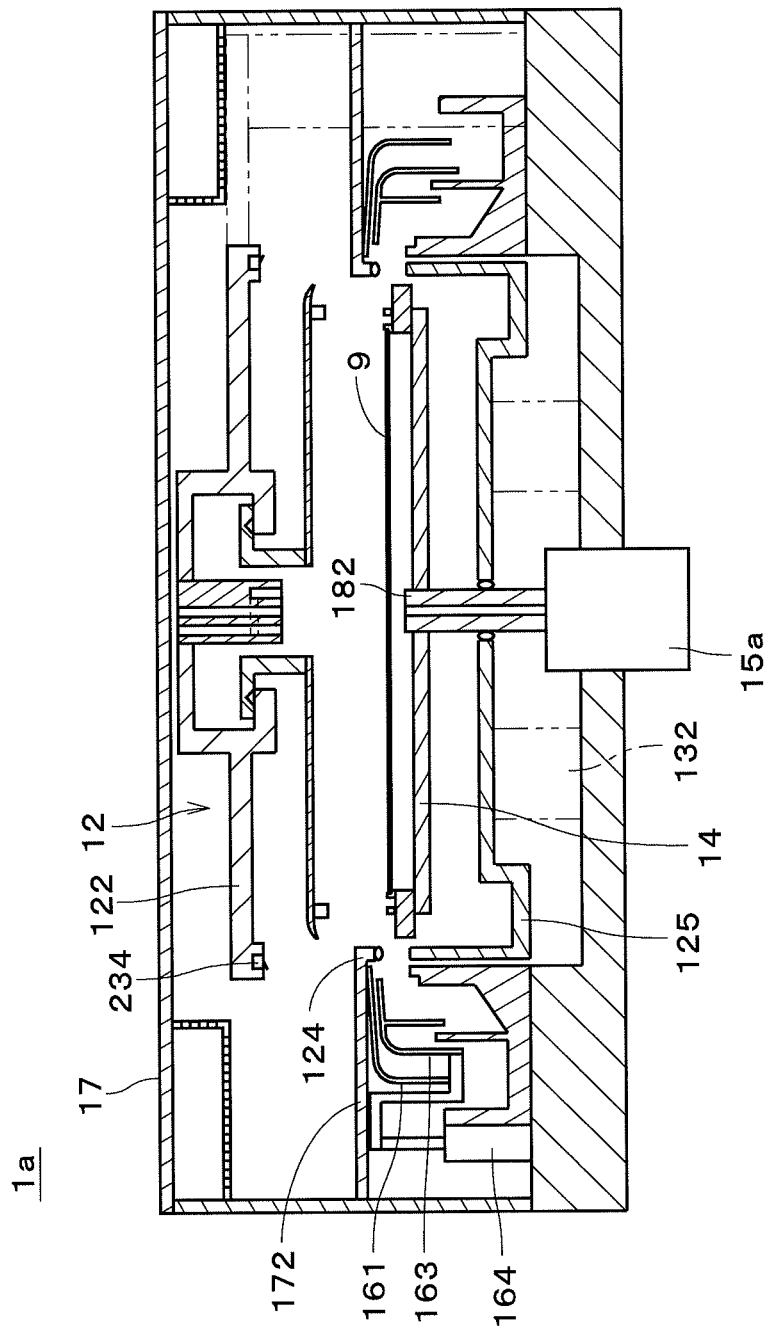
FIG. 9 is a cross section showing a substrate processing apparatus in accordance with a second preferred embodiment of the present invention.
Figure 10:
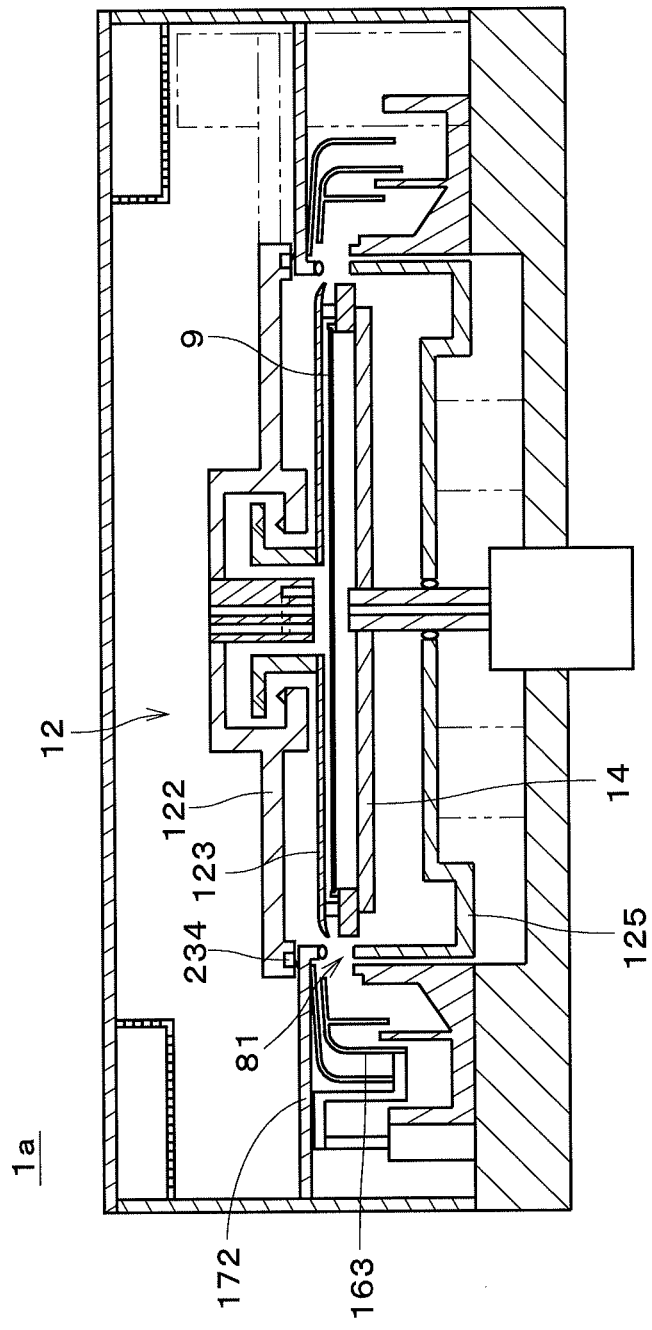
FIGS. 10 to 13 are cross sections each showing the substrate processing apparatus.
Figure 11:
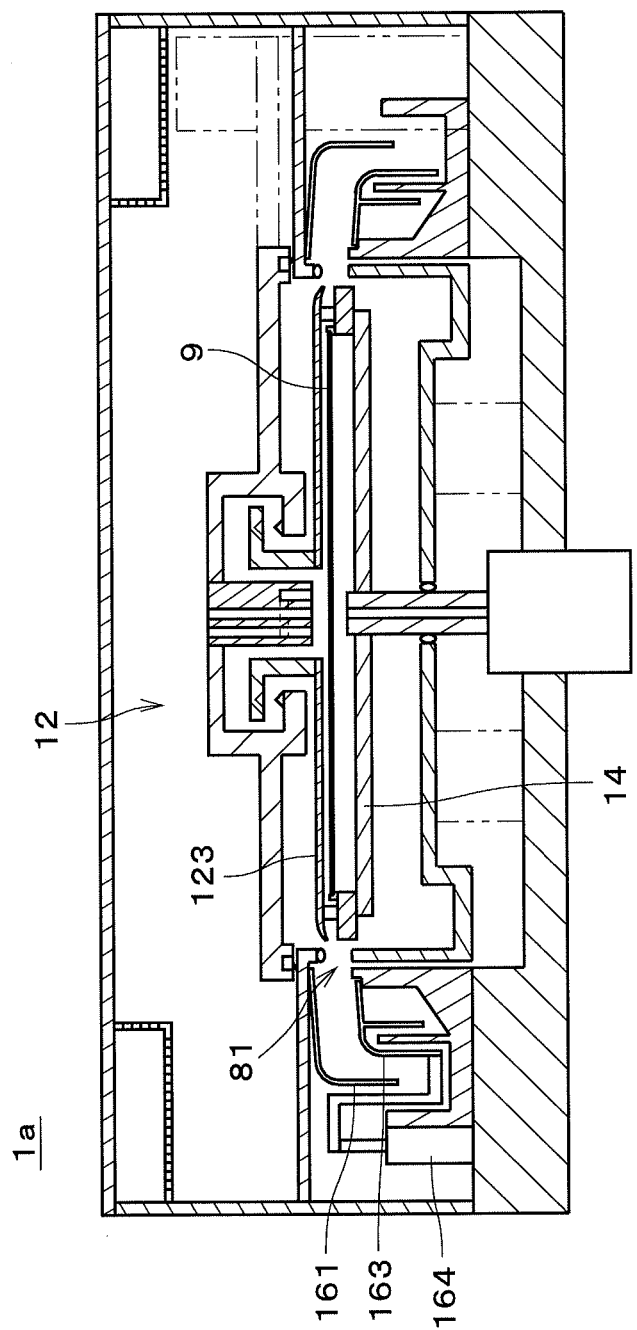
Figure 12:
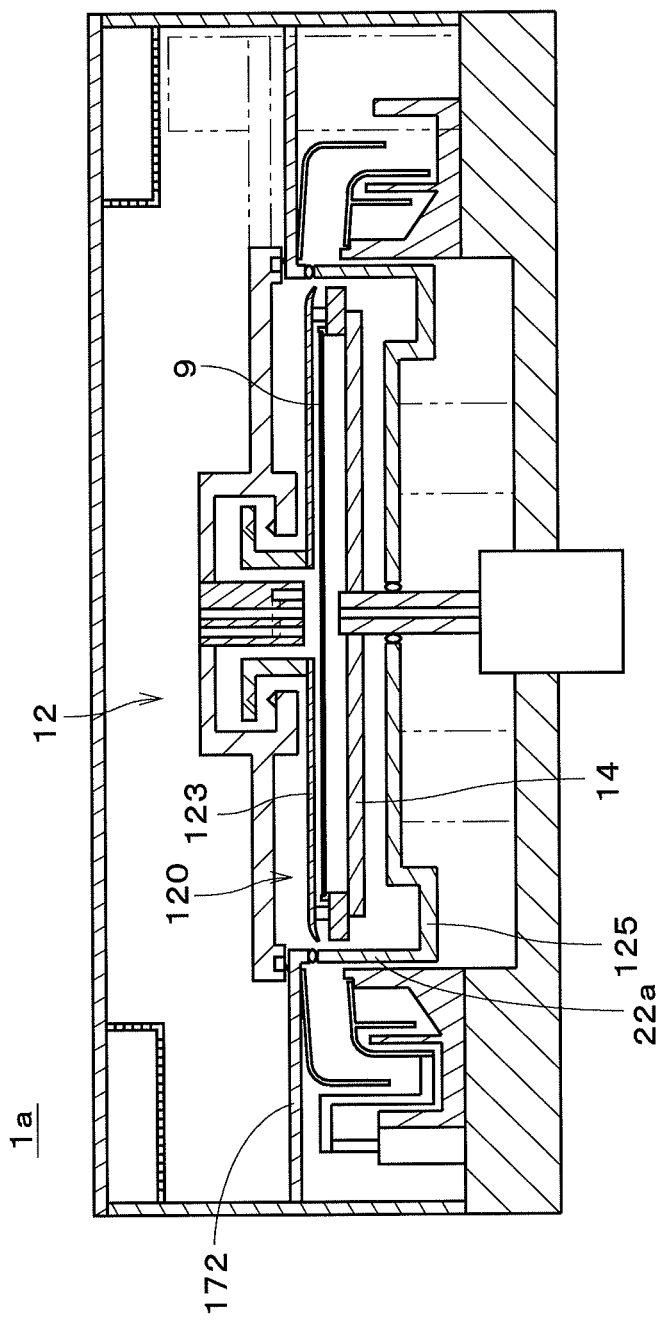
Figure 13:
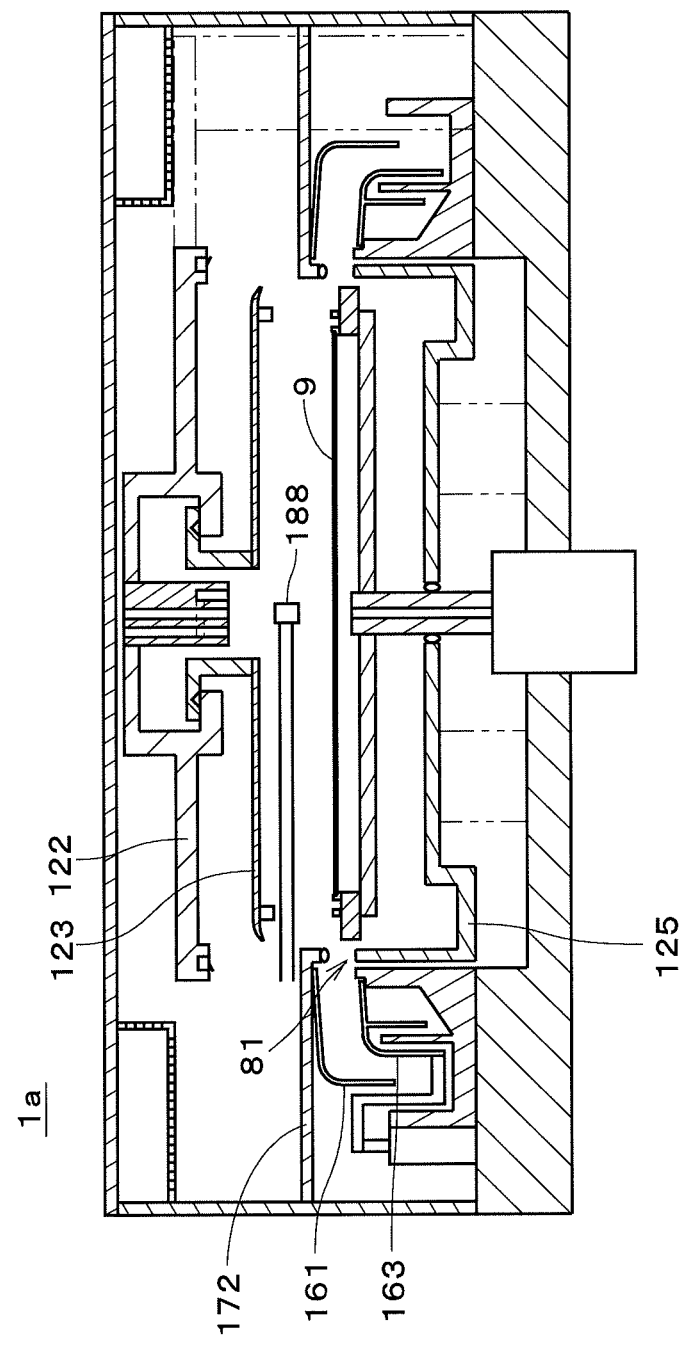

FIGS. 9 to 13 are cross sections each showing a substrate processing apparatus 1a in accordance with the second preferred embodiment of the present invention. FIG. 9 shows a state of the apparatus in loading or unloading the substrate 9. FIG. 10 shows a state in which the processing liquid spattering from the substrate 9 is received by the second cup part 163 in the semiopen state. FIG. 11 shows a state in which the processing liquid spattering from the substrate 9 is received by the first cup part 161 in the semiopen state. FIG. 12 shows a state in which a sealed-state processing is performed (a processing is performed in the sealed space). FIG. 13 shows a state in which a processing is performed by using the scan nozzle 188.

As shown in FIG. 9, in the substrate processing apparatus 1a, the cover 17 is provided with a partition plate 172. The partition plate 172 extends outward in the radial direction from the chamber 12. A portion which is continuous inward in the radial direction from the partition plate 172, i.e., an inner peripheral portion of a member including the partition plate 172 protrudes downward, which constitutes part of the chamber 12. Hereinafter, this portion will be referred to as a "chamber fixed part 124". In other words, the partition plate 172 extends outward from the chamber fixed part 124. The partition plate 172 is positioned above the first cup part 161 and the second cup part 163. With the partition plate 172, it is possible to prevent airflow from flowing into the chamber 12 in the semiopen state.

A portion 125 which includes the lower portion of the chamber 12 and is positioned lower than the chamber fixed part 124 is moved up and down by the chamber up-and-down moving mechanism 132. As discussed later, since the semiopen state and the sealed state are achieved by the chamber up-and-down moving mechanism 132, the chamber up-and-down moving mechanism 132 serves as a chamber opening and closing mechanism in this preferred embodiment. Hereinafter, the portion 125 will be referred to as a "chamber movable part". The chamber cover 122 is positioned above the chamber fixed part 124. Further, like in the first preferred embodiment, the cover up-and-down moving mechanism 131 may be also regarded as the chamber opening and closing mechanism.

The position of the first cup part 161 is fixed in a state where the upper end portion thereof is close to the partition plate 172. The second cup part 163 is moved up and down by the second cup up-and-down moving mechanism 164. A substrate rotating mechanism 15a is a shaft rotation type motor, and the substrate holding part 14 has a plate-like shape. A rotation shaft of the substrate rotating mechanism 15a is connected to a center of the substrate holding part 14. The lower nozzle 182 provided at an upper end of the substrate rotating mechanism 15a. Other constituent elements are almost identical to those of the first preferred embodiment. Exemplary operation is the same as that of the first preferred embodiment.

At the outer edge of the chamber cover 122, provided is an annular lip seal 234. As shown in FIG. 10, in the semiopen state, the lip seal 234 of the chamber cover 122 is in contact with the partition plate 172. On the other hand, the chamber movable part 125 is apart from the partition plate 172. The annular opening 81 is thereby formed between the chamber movable part 125 and the partition plate 172. The annular opening 81 is positioned around the substrate 9. In FIG. 10, the second cup part 163 is positioned on an outer side relative to the annular opening 81 in the radial direction. The processing liquid spattering from the substrate 9 being rotated is collected by the first collecting part 194 (see FIG. 2) through the second cup part 163, like in the first preferred embodiment.

In FIG. 11, the chamber 12 is in the semiopen state, and the second cup part 163 is moved down from the state shown in FIG. 10 and the first cup part 161 is thereby positioned on an outer side relative to the annular opening 81 in the radial direction. Thus, like in the first preferred embodiment, the second cup up-and-down moving mechanism 164 moves the second cup part 163 between the position on the outer side relative to the annular opening 81 in the radial direction and another position lower than the position, to thereby switch between the state in which the second cup part 163 receives the processing liquid from the substrate 9 and the state in which the first cup part 161 receives the processing liquid from the substrate 9. The processing liquid spattering from the substrate 9 is received by the first cup part 161 and discarded.

In FIG. 12, the chamber movable part 125 is moved up and comes into contact with the partition plate 172. The sealed internal space 120 is thereby formed in the chamber 12. The processing liquid spattering from the substrate 9 is received by a chamber sidewall 22a which is an outer peripheral portion of the chamber movable part 125 and collected by the second collecting part 195.

As shown in FIG. 13, in the case where the scan nozzle 188 is used, the chamber cover 122 gets apart from the partition plate 172, and then the scan nozzle 188 is inserted between the chamber cover 122 and the partition plate 172. The chamber movable part 125 also gets apart from the partition plate 172, to thereby form the annular opening 81. The processing liquid spattering from the substrate 9 being rotated is received by the cup part positioned on the outer side relative to the annular opening 81 in the radial direction. In the case of FIG. 13, the first cup part 161 is positioned on the outer side relative to the annular opening 81 in the radial direction. As a matter of course, the second cup part 163 may be positioned on the outer side relative to the annular opening 81 in the radial direction.

Like in the first preferred embodiment, in the semiopen state and the sealed state, the top plate 123 is engaged with the substrate holding part 14 in the circumferential direction and rotated together with the substrate holding part 14. This reduces the amount of processing liquid and processing gas to be used. In the case of FIG. 13, the top plate 123 is not rotated.

Figure 14:
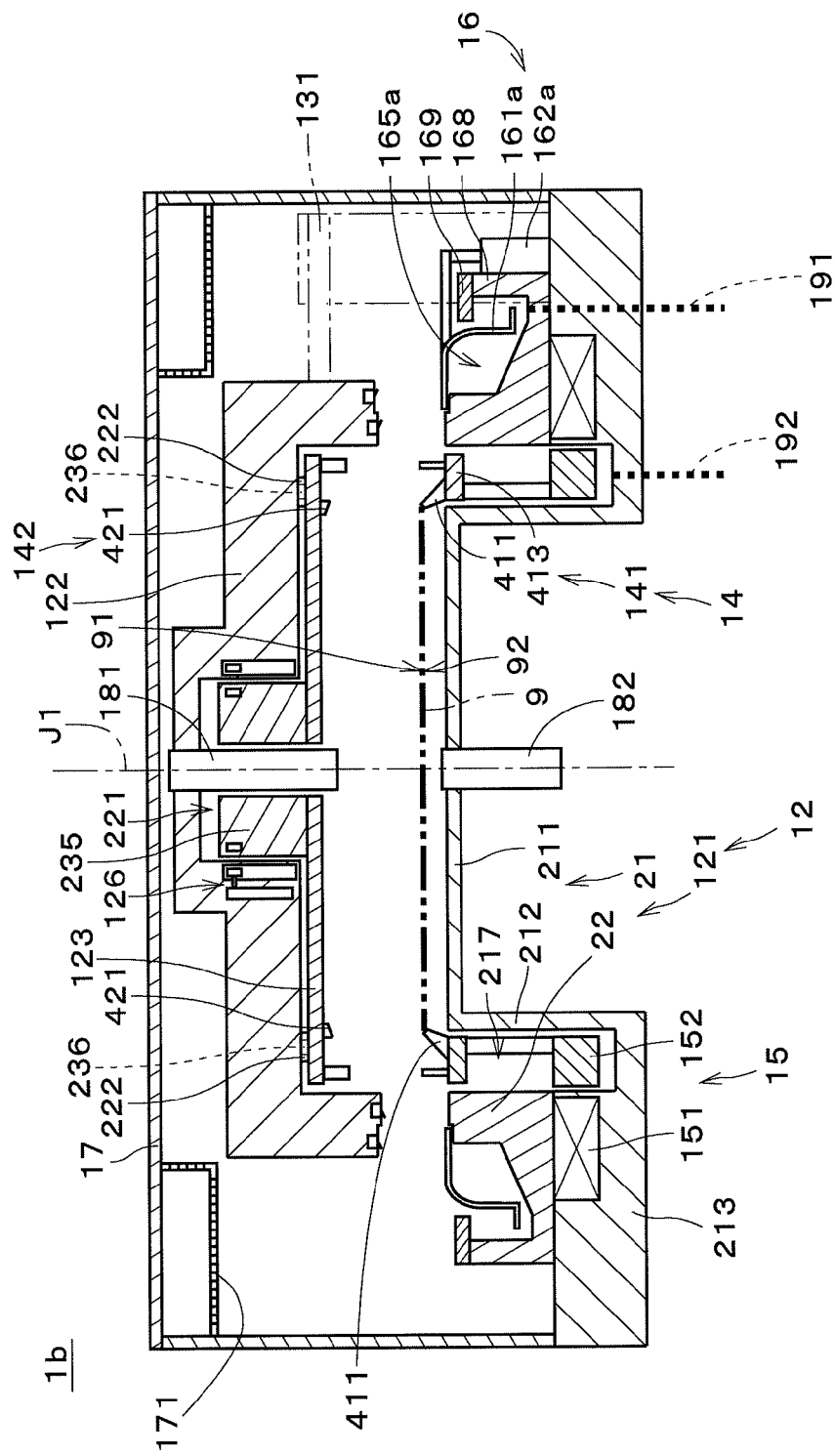
FIG. 14 is a cross section showing a substrate processing apparatus in accordance with a third preferred embodiment of the present invention.

FIG. 14 is a cross section showing a substrate processing apparatus 1b in accordance with the third preferred embodiment of the present invention. The substrate processing apparatus 1b is a single-substrate processing apparatus which supplies a processing liquid onto a semiconductor substrate 9 (hereinafter, referred to simply as a "substrate 9") having a substantially disk-like shape and thereby processes substrates 9 one by one. In FIG. 14, hatching is omitted in the cross section showing part of a configuration of the substrate processing apparatus 1b (the same applies to other cross sections).

The substrate processing apparatus 1b includes the chamber 12, the top plate 123, a top plate moving mechanism 126, the chamber opening and closing mechanism 131, the substrate holding part 14, the substrate rotating mechanism 15, the liquid receiving part 16, and the cover 17.

The chamber 12 includes the chamber body 121 and the chamber cover 122. The chamber body 121 and the chamber cover 122 are each formed of a non-magnetic material. The chamber body 121 includes the chamber bottom 21 and the chamber sidewall 22. The chamber bottom 21 includes the substantially disk-like center portion 211, the cylindrical inner wall portion 212 extending downward from the outer edge of the center portion 211, and the base portion 213 extending outward in the radial direction from the inner wall portion 212. The chamber sidewall 22 has an annular shape about the central axis J1 oriented in the vertical direction and protrudes upward from a center portion of the base portion 213 in the radial direction. The member which forms the chamber sidewall 22 serves as part of the liquid receiving part 16 as discussed later. In the following discussion, a space surrounded by the chamber sidewall 22, the inner wall portion 212, and the base portion 213 will be referred to as a lower annular space 217. When the substrate 9 is supported by a substrate supporting part 141 (described later) of the substrate holding part 14, the lower surface 92 of the substrate 9 is opposed to the upper surface of the center portion 211.

The chamber cover 122 has a substantially disk-like shape perpendicular to the central axis J1 and includes the upper portion of the chamber 12. The chamber cover 122 closes the upper opening of the chamber body 121. FIG. 14 shows a state in which the chamber cover 122 is apart from the chamber body 121. When the chamber cover 122 closes the upper opening of the chamber body 121, the outer edge of the chamber cover 122 is in contact with the upper portion of the chamber sidewall 22. At the center of the chamber cover 122, provided is an accommodating part 221 having a substantially covered cylindrical shape, which is recessed upward.

The chamber opening and closing mechanism 131 moves the chamber cover 122 which is a movable part of the chamber 12 in the vertical direction relative to the chamber body 121 which is the other portion of the chamber 12. The chamber opening and closing mechanism 131 is a cover up-and-down moving mechanism for moving the chamber cover 122 up and down. When the chamber cover 122 is moved in the vertical direction by the chamber opening and closing mechanism 131, the top plate 123 is also moved in the vertical direction together with the chamber cover 122. By bringing the chamber cover 122 into contact with the chamber body 121 to close the upper opening and pressing the chamber cover 122 toward the chamber body 121, the sealed internal space 120 (see FIGS. 20 and 21) is formed in the chamber 12.

The substrate holding part 14 is disposed in the chamber 12 and holds the substrate 9 horizontally. In other words, the substrate 9 is held by the substrate holding part 14 with the upper surface 91 thereof directed upward, being perpendicular to the central axis J1. The substrate holding part 14 includes the above-mentioned substrate supporting part 141 for supporting the outer edge of the substrate 9 from below and a substrate retaining part 142 for retaining the outer edge of the substrate 9 supported by the substrate supporting part 141 from above. The substrate supporting part 141 includes a supporting-part base 413 having a substantially annular disk-like shape about the central axis J1 and a plurality of first contact parts 411 fixed on an upper surface of the supporting-part base 413. The substrate retaining part 142 includes a plurality of second contact parts 421 fixed on the lower surface of the top plate 123. Respective positions of the plurality of second contact parts 421 in the circumferential direction are actually different from respective positions of the plurality of first contact parts 411 in the circumferential direction.

The top plate 123 has a substantially disk-like shape perpendicular to the central axis J1. The top plate 123 is disposed below the chamber cover 122 and above the substrate supporting part 141. The top plate 123 has an opening at its center. When the substrate 9 is supported by the substrate supporting part 141, the upper surface 91 of the substrate 9 is opposed to the lower surface of the top plate 123, which is perpendicular to the central axis J1. A diameter of the top plate 123 is larger than that of the substrate 9, and the outer peripheral edge of the top plate 123 is positioned on an outer side relative to the outer peripheral edge of the substrate 9 in the radial direction along the entire circumference thereof.

On the lower surface of the chamber cover 122, a plurality of plate holding parts 222 for holding the top plate 123 are arranged in the circumferential direction about the central axis J1. On the upper surface of the top plate 123, a plurality of protruding portions 236 are arranged in the circumferential direction at positions opposed to the plurality of plate holding parts 222, respectively. By holding the plurality of protruding portions 236 by the plurality of plate holding parts 222, the top plate 123 is so supported by the chamber cover 122 as to be suspended from the chamber cover 122.

To the upper surface of the top plate 123, a top plate shaft 235 is fixed. The top plate 123 and the top plate shaft 235 are each formed of a non-magnetic material. The top plate shaft 235 has a substantially cylindrical shape about the central axis J1. At least part of the top plate shaft 235 (most portion except a lower end portion thereof in this preferred embodiment) is accommodated in then accommodating part 221 of the chamber cover 122. The top plate moving mechanism 126 is disposed at the top plate shaft 235 and the chamber cover 122. The top plate moving mechanism 126 moves the top plate 123 in the vertical direction relative to the chamber cover 122 by using magnetic force.

Figure 15:
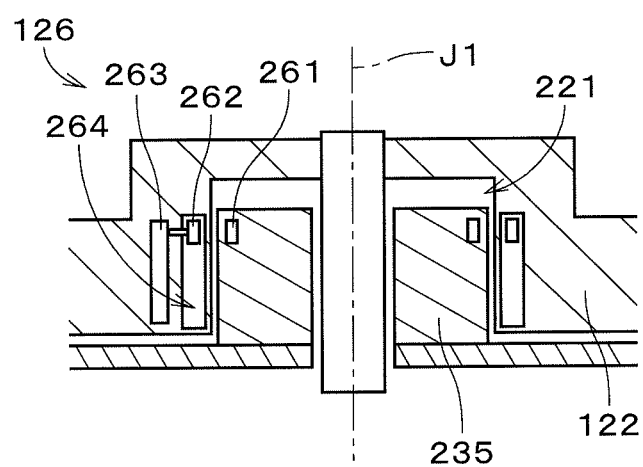
FIG. 15 is an enlarged cross section showing the vicinity of a top plate shaft.

FIG. 15 is an enlarged cross section showing the vicinity of the top plate shaft 235. As shown in FIG. 15, the top plate moving mechanism 126 includes a first magnet 261, a second magnet 262, and a magnet moving mechanism 263. The first magnet 261 is disposed in the circumferential direction along an outer peripheral surface of the top plate shaft 235 inside the top plate shaft 235. The first magnet 261 is fixed to the top plate shaft 235. The second magnet 262 is disposed around the accommodating part 221 in the circumferential direction in an annular hole 264 formed around the accommodating part 221 in the chamber cover 122. In this preferred embodiment, the first magnet 261 and the second magnet 262 each have a substantially annular shape about the central axis J1. An upper portion of the first magnet 261 is the north pole and a lower portion thereof is the south pole. An upper portion of the second magnet 262 is the south pole and a lower portion thereof is the north pole. A height of the annular hole 264 in the vertical direction is higher than that of the second magnet 262 in the vertical direction. The second magnet 262 is moved in the vertical direction in the annular hole 264 by the magnet moving mechanism 263.

The substrate rotating mechanism 15 shown in FIG. 14 is a so-called hollow motor. The substrate rotating mechanism 15 includes the stator part 151 having an annular shape about the central axis J1 and the rotor part 152 having an annular shape. The rotor part 152 includes a permanent magnet having a substantially annular shape. A surface of the permanent magnet is molded by PTFE (polytetrafluoroethylene) resin. The rotor part 152 is disposed in the lower annular space 217 in the internal space 120 of the chamber 12. To an upper portion of the rotor part 152, the supporting-part base 413 of the substrate supporting part 141 is attached with a connecting member interposed therebetween. The supporting-part base 413 is disposed above the rotor part 152.

The stator part 151 is disposed around the rotor part 152 outside the chamber 12 (i.e., outside the internal space 120) i.e., on the outer side in the radial direction relative to the rotor part 152. In this preferred embodiment, the stator part 151 is fixed to the base portion 213 and positioned below the liquid receiving part 16. The stator part 151 includes a plurality of coils which are arranged in the circumferential direction about the central axis J1.

By supplying current to the stator part 151, a rotating force is generated about the central axis J1 between the stator part 151 and the rotor part 152. The rotor part 152 thereby rotates horizontally about the central axis J1. By the magnetic force exerted between the stator part 151 and the rotor part 152, the rotor part 152 floats in the chamber 12, not being in direct or indirect contact with the chamber 12, and rotates together with the substrate 9 and the substrate holding part 14 about the central axis J1.

The liquid receiving part 16 includes a cup part 161a and a cup moving mechanism 162a. As discussed earlier, part of the member forming the chamber sidewall 22 is included in the liquid receiving part 16. The cup part 161a has an annular shape about the central axis J1 and is positioned on an outer side in the radial direction relative to the chamber sidewall 22. The cup moving mechanism 162a moves the cup part 161a in the vertical direction.

A lower portion of the cup part 161a is positioned in an annular liquid receiving recessed portion 165a positioned outside the chamber sidewall 22. At an upper end portion of a substantially cylindrical outer wall portion 168 surrounding an outer periphery of the liquid receiving recessed portion 165a, fixed is an outer seal portion 169 having a substantially annular disk-like shape about the central axis J1. The outer seal portion 169 extends inward in the radial direction from the upper end portion of the outer wall portion 168 and covers an outer peripheral portion of an upper opening of the liquid receiving recessed portion 165a along the entire circumference thereof.

At the center of the chamber cover 122, the upper nozzle 181 is fixed. The upper nozzle 181 is inserted into a through hole formed at a center of the top plate shaft 235 and inserted into the opening at the center of the top plate 123. At a center of the center portion 211 of the chamber bottom 21, the lower nozzle 182 is attached. A bottom portion of the liquid receiving recessed portion 165a is connected to the first discharge path 191. A bottom portion of the lower annular space 217 between the inner wall portion 212 and the chamber sidewall 22 is connected to the second discharge path 192. The positions where the upper nozzle 181 and the lower nozzle 182 are attached are not necessarily limited to the center portions, but the upper nozzle 181 and the lower nozzle 182 may be attached to, for example, positions opposed to a peripheral portion of the substrate 9.

The cover 17 covers the chamber 12 from the upper and side directions thereof. At the upper portion of the cover 17, provided is a multiple hole part 171. Since air flows out from many holes formed in the multiple hole part 171, downflow occurs in the cover 17. It is thereby possible to prevent particles from rising from the liquid receiving part 16 and the chamber bottom 21 to the substrate 9.

Figure 16:
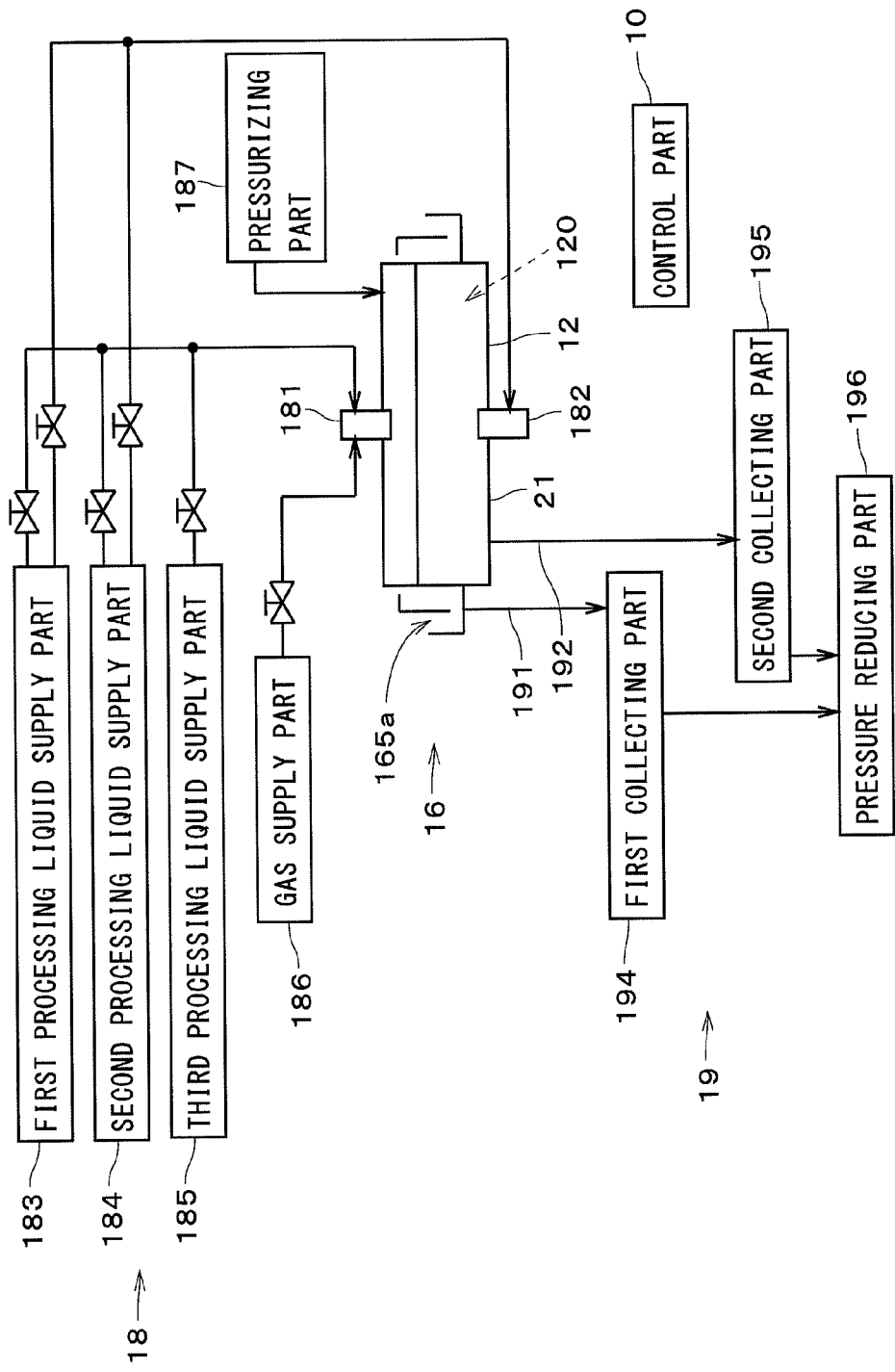
FIG. 16 is a block diagram showing a processing liquid supply part and a liquid collecting part.

FIG. 16 is a block diagram showing the processing liquid supply part 18 and the liquid collecting part 19 included in the substrate processing apparatus 1b. The processing liquid supply part 18 includes the first processing liquid supply part 183, the second processing liquid supply part 184, and the third processing liquid supply part 185 besides the upper nozzle 181 and the lower nozzle 182. The first processing liquid supply part 183, the second processing liquid supply part 184, and the third processing liquid supply part 185 are connected to the upper nozzle 181 through valves, respectively. The lower nozzle 182 is connected to the first processing liquid supply part 183 and the second processing liquid supply part 184 through valves, respectively. The upper nozzle 181 is also connected to the gas supply part 186. The upper nozzle 181 has the liquid ejection port at its center and also has the gas ejection port around the liquid ejection port. Therefore, more exactly, part of the upper nozzle 181 serves as the gas supply part for supplying gas onto the substrate 9 in a broad sense. The lower nozzle 182 has the liquid ejection port at its center.

To the chamber 12, connected is the pressurizing part 187 for increasing pressure in the internal space 120 of the chamber 12 while the chamber 12 is sealed. By the pressurizing part 187, the internal space 120 is brought into a pressurized atmosphere where the pressure is higher than atmospheric pressure. The gas supply part 186 may serve also as the pressurizing part. When pressurization is not needed, the pressurizing part 187 may be omitted.

The first discharge path 191 which is connected to the liquid receiving recessed portion 165a of the liquid receiving part 16 is connected to the first collecting part 194. The second discharge path 192 which is connected to the chamber bottom 21 is connected to the second collecting part 195. The first collecting part 194 and the second collecting part 195 are connected to the pressure reducing part 196. By driving the pressure reducing part 196, the processing liquid is collected in the first collecting part 194 and the second collecting part 195. While the chamber 12 is sealed, the pressure reducing part 196 reduces the pressure in the internal space 120 and the internal space 120 is thereby bought into a reduced pressure atmosphere where the pressure is lower than atmospheric pressure. The first collecting part 194 and the second collecting part 195 are also connected to the waste liquid path, and the liquid can be discarded from the first discharge path 191 and the second discharge path 192.

The first processing liquid supply part 183, the second processing liquid supply part 184, the third processing liquid supply part 185, the gas supply part 186, the pressurizing part 187, the first collecting part 194, the second collecting part 195, the pressure reducing part 196, and the valves are controlled by the control part 10. The chamber opening and closing mechanism 131, the substrate holding part 14, the substrate rotating mechanism 15, and the cup moving mechanism 162a (see FIG. 14) are also controlled by the control part 10.

In this preferred embodiment, the first processing liquid supplied onto the substrate 9 from the first processing liquid supply part 183 is an etching solution such as hydrofluoric acid, a tetramethylammonium hydroxide solution, or the like. The second processing liquid supplied from the second processing liquid supply part 184 is deionized water (DIW). The third processing liquid supplied from the third processing liquid supply part 185 is isopropyl alcohol (IPA). Further, the gas supply part 186 supplies nitrogen gas (N₂) to the inside of the chamber 12.

Figure 17:
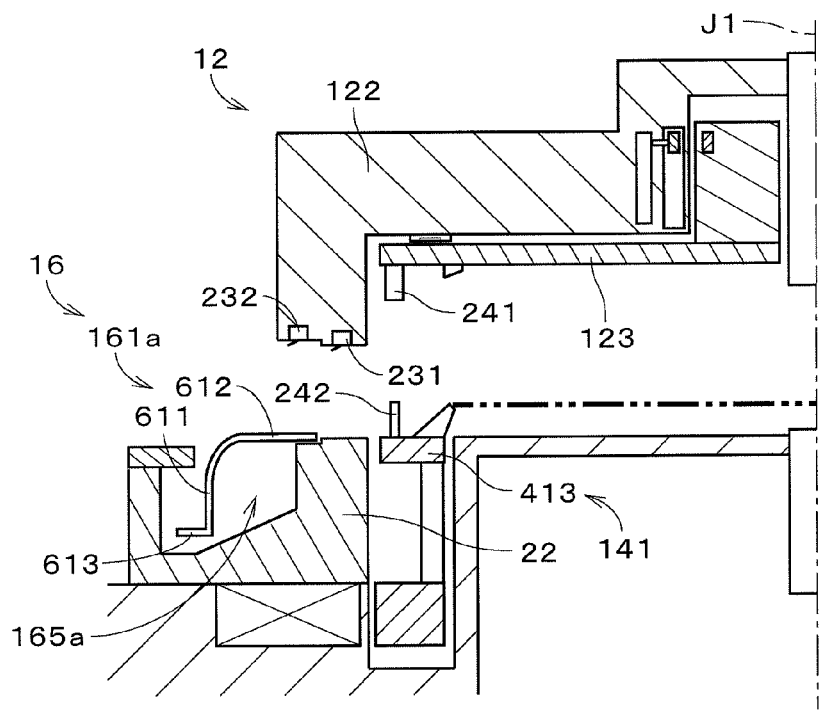
FIG. 17 is an enlarged view showing part of a chamber and a liquid receiving part.

FIG. 17 is an enlarged view showing part of the chamber 12 and the liquid receiving part 16. The cup part 161a includes a sidewall portion 611, an upper surface portion 612, and a lower surface portion 613. The sidewall portion 611 has a substantially cylindrical shape about the central axis J1. The upper surface portion 612 has a substantially annular disk-like shape about the central axis J1 and extends inward in the radial direction from an upper end portion of the sidewall portion 611. The lower surface portion 613 has a substantially annular disk-like shape about the central axis J1 and extends outward in the radial direction from a lower end portion of the sidewall portion 611. The upper surface portion 612 and the lower surface portion 613 are substantially perpendicular to the central axis J1. In a state of FIG. 17, almost the entire sidewall portion 611 and the lower surface portion 613 of the cup part 161a are positioned in the liquid receiving recessed portion 165a.

At the lower surface of the outer edge of the chamber cover 122, provided are the lip seals 231 and 232. The lip seal 231 is positioned above the upper end portion of the chamber sidewall 22. The lip seal 232 is positioned above an inner edge of the upper surface portion 612 of the cup part 161a. When the chamber cover 122 moves down and the cup part 161a moves up, the lip seal 232 comes into contact with the inner edge of the upper surface portion 612 of the cup part 161a with respect to the vertical direction. When the chamber cover 122 moves down to the chamber sidewall 22, the lip seal 232 comes into contact with the upper end portion of the chamber sidewall 22.

Figure 18:
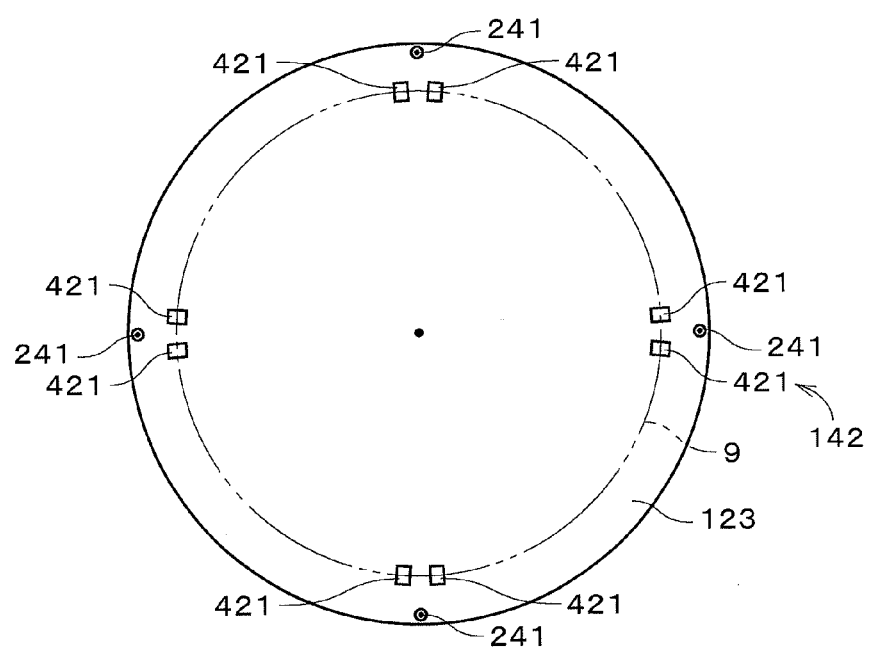
FIG. 18 is a bottom view showing a top plate.
Figure 19:
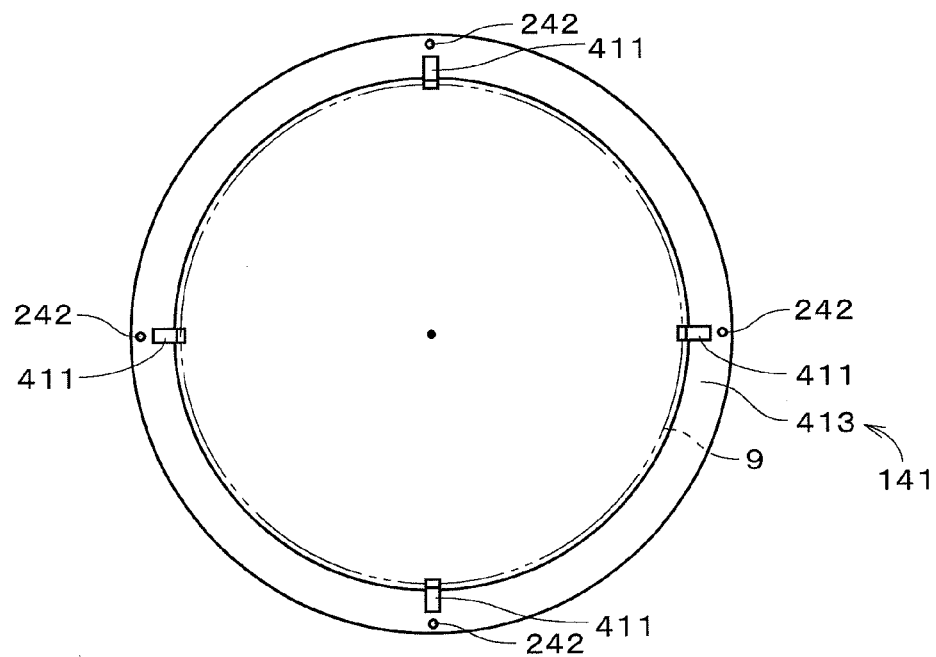
FIG. 19 is a plan view showing a substrate supporting part.

FIG. 18 is a bottom view showing the top plate 123. FIG. 19 is a plan view showing the substrate supporting part 141. In FIGS. 18 and 19, the substrate 9 is indicated by the two-dot chain line. As shown in FIGS. 17 to 19, at the lower surface of the outer edge of the top plate 123, the plurality of first engaging parts 241 are arranged in the circumferential direction. On the upper surface of the supporting-part base 413, the plurality of second engaging parts 242 are arranged in the circumferential direction. It is preferable that three or more pairs of these first and second engaging parts should be provided, and in this preferred embodiment, provided are four pairs of first and second engaging parts. At the lower portion of each of the first engaging parts 241, provided is the recessed portion which is recessed upward. The second engaging parts 242 protrude upward from the supporting-part base 413.

Figure 20:
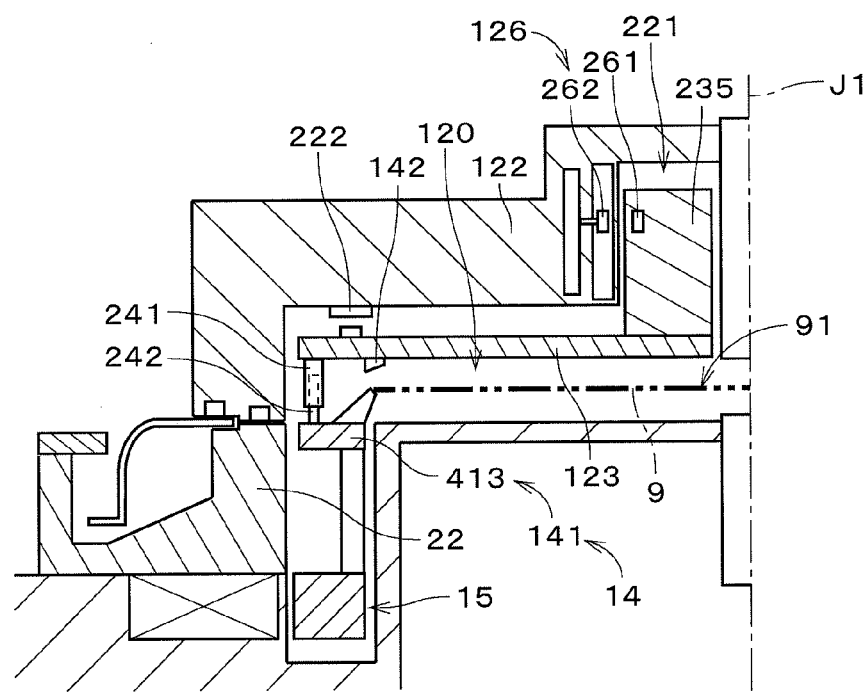
FIGS. 20 and 21 are enlarged views each showing part of the chamber and the liquid receiving part.

As shown in FIG. 20, when the chamber cover 122 moves down to the chamber sidewall 22, the second engaging parts 242 get engaged with the recessed portions of the first engaging parts 241, respectively. The top plate 123 thereby gets engaged with the supporting-part base 413 of the substrate supporting part 141 in the circumferential direction about the central axis J1. In other words, the first engaging parts 241 and the second engaging parts 242 serve as a position regulating member for regulating a position of the top plate 123 relative to the substrate supporting part 141 in a rotation direction (in other words, for fixing a relative position of the top plate 123 in the circumferential direction). When the top plate 123 moves down, a rotation position of the supporting-part base 413 is controlled by the substrate rotating mechanism 15 so that the first engaging parts 241 and the second engaging parts 242 may be engaged with each other. A position of the top plate 123 relative to the substrate supporting part 141 in the vertical direction is not fixed by the first engaging parts 241 and the second engaging parts 242.

In a state of FIG. 20, the holding of the top plate 123 by the plate holding part 222 is released, and the top plate 123 is apart from the chamber cover 122 and close to the substrate 9. A position of the top plate 123 in the vertical direction is determined by the magnetic force (attractive force) exerted between the first magnet 261 and the second magnet 262 of the top plate moving mechanism 126. Specifically, the first magnet 261 and the second magnet 262 are opposed to each other in the radial direction so that a center portion of the first magnet 261 in the vertical direction and a center portion of the second magnet 262 in the vertical direction may be positioned at almost the same position in the vertical direction. The position of the top plate 123 relative to the chamber cover 122 in the vertical direction is thereby fixed. Further, since a position of the top plate 123 in the horizontal direction is determined by the first engaging parts 241 and the second engaging parts 242, the top plate shaft 235 is not in contact with an inner side surface of the accommodating part 221.

In the following discussion, the position of the top plate 123 shown in FIG. 20 will be referred to as a "first close position". While the top plate 123 is positioned at the first close position, the substrate retaining part 142 of the substrate holding part 14 is not in contact with the substrate 9 and does not retain the outer edge of the substrate 9. When the substrate supporting part 141 is rotated by the substrate rotating mechanism 15 in this state, the top plate 123 is rotated together with the substrate supporting part 141, the substrate 9 held horizontally by the substrate supporting part 141, and the substrate retaining part 142. The top plate 123 is an upper rotating member which rotates together with the substrate supporting part 141.

As shown in FIG. 19, on the upper surface of the supporting-part base 413, the plurality of first contact parts 411 of the substrate supporting part 141 are arranged in the circumferential direction. The plurality of first contact parts 411 are disposed on an inner side relative to the plurality of second engaging parts 242 in the radial direction. Further, as shown in FIG. 18, on the lower surface of the outer edge of the top plate 123, the plurality of second contact parts 421 of the substrate retaining part 142 are arranged in the circumferential direction. The plurality of second contact parts 421 are disposed on an inner side relative to the plurality of first engaging parts 241 in the radial direction. As discussed above, respective positions of the plurality of second contact parts 421 in the circumferential direction are different from respective positions of the plurality of first contact parts 411 in the circumferential direction. In this preferred embodiment, four first contact parts 411 are arranged at regular angular intervals in the circumferential direction. Further, assuming adjacent two second contact parts 421 as a pair, four pairs of second contact parts 421 are arranged at regular angular intervals in the circumferential direction.

Figure 21:
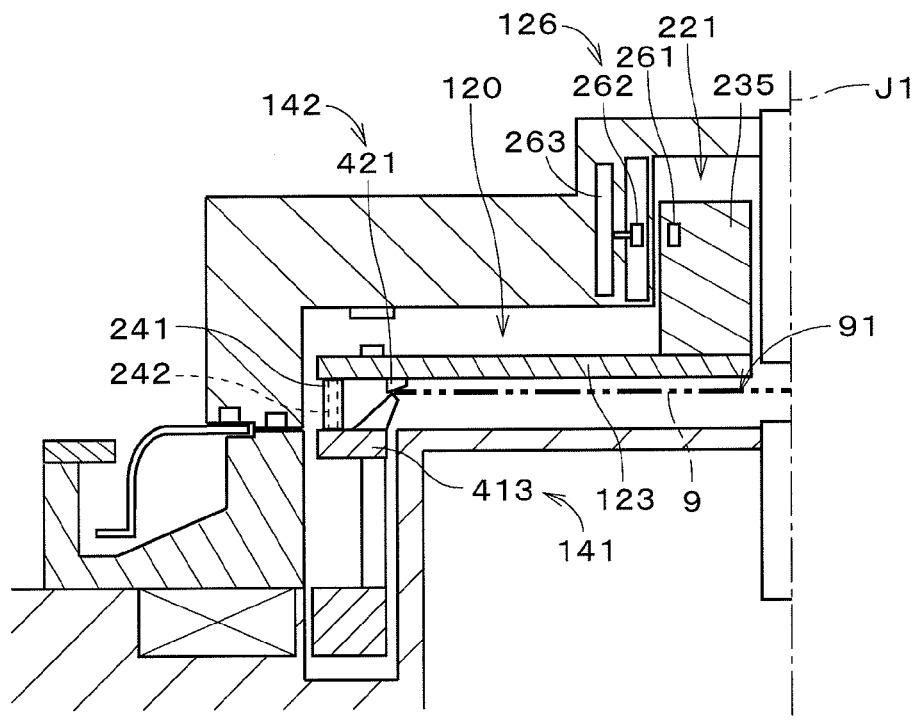

As shown in FIG. 21, in the top plate moving mechanism 126, when the second magnet 262 is moved downward by the magnet moving mechanism 263, the top plate shaft 235 and the top plate 123 are moved downward by the magnetic force (attractive force) exerted between the first magnet 261 and the second magnet 262. The top plate 123 thereby gets close to the substrate 9. In the following discussion, the position of the top plate 123 shown in FIG. 21 will be referred to as a "second close position". In this preferred embodiment, a distance in the vertical direction between the lower surface of the top plate 123 and the upper surface 91 of the substrate 9 at the second close position is about 2 mm. Further, a distance in the vertical direction between the lower surface of the top plate 123 and the upper surface 91 of the substrate 9 at the first close position is about 10 mm.

Even when the top plate 123 is positioned at the second close position, the position of the top plate 123 in the circumferential direction relative to the supporting-part base 413 of the substrate supporting part 141 is fixed since the first engaging parts 241 and the second engaging parts 242 are engaged with each other. Further, the top plate shaft 235 is not in contact with the inner side surface of the accommodating part 221. On the other hand, when the top plate 123 is positioned at the second close position, the plurality of second contact parts 421 of the substrate retaining part 142 are in contact with the outer edge of the substrate 9, unlike in the state where the top plate 123 is positioned at the first close position.

Figure 22:
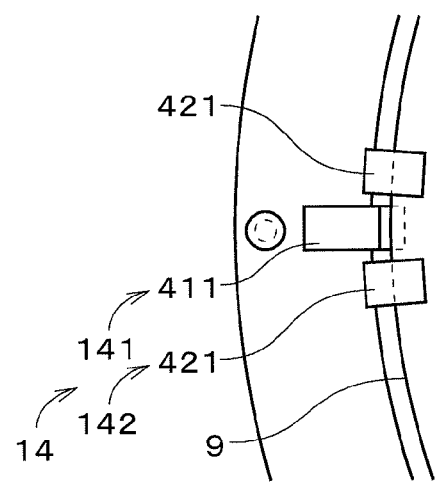
FIG. 22 is an enlarged plan view showing part of a substrate holding part.

FIG. 22 is an enlarged plan view showing part of the substrate holding part 14 which holds the substrate 9. In FIG. 22, the chamber cover 122 is not shown. As shown in FIG. 22, two second contact parts 421 of the substrate retaining part 142 are provided on both sides of one first contact part 411 of the substrate supporting part 141 in the circumferential direction, adjacently thereto. The first contact part 411 and the two second contact parts 421 are arranged, being apart from one another with a small gap between adjacent two in the circumferential direction. The same applies to other sets of one first contact part 411 and two second contact parts 421. A distance between each first contact part 411 and the adjacent second contact part 421 in the circumferential direction is smaller than a distance between the second contact part 421 and any other first contact part 411 in the circumferential direction. In the outer edge of the substrate 9, a position where the first contact part 411 is in contact therewith will be referred to as a "first contact position", and a position where the second contact part 421 is in contact therewith will be referred to as a "second contact position". The plurality of second contact positions are different from the plurality of first contact positions with respect to the circumferential direction.

Figure 23:
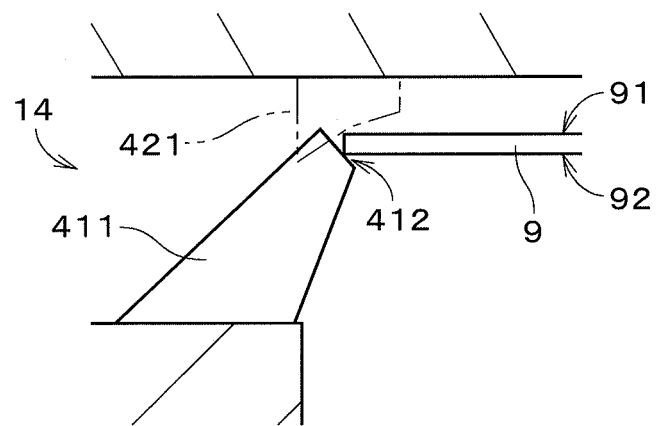
FIG. 23 is an enlarged side elevation view showing the vicinity of a first contact part.

FIG. 23 is an enlarged side elevation view showing the vicinity of one first contact part 411. The other first contact parts 411 each have the same structure as that of the first contact part 411 shown in FIG. 23. The plurality of first contact parts 411 each have a first sloped surface 412 which goes downward as it goes inward in the radial direction. Each of the first contact parts 411 comes into contact with the outer edge of the substrate 9 at the first sloped surface 412 thereof.

Figure 24:
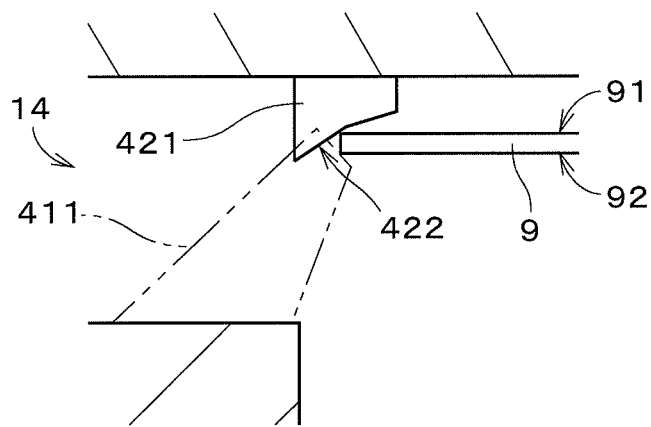
FIG. 24 is an enlarged side elevation view showing the vicinity of a second contact part.

FIG. 24 is an enlarged side elevation view showing the vicinity of one second contact part 421. The other second contact parts 421 each have the same structure as that of the second contact part 421 shown in FIG. 24. The plurality of second contact parts 421 each have a second sloped surface 422 which goes upward as it goes inward in the radial direction. Each of the second contact parts 421 comes into contact with the outer edge of the substrate 9 at the second sloped surface 422 thereof.

In FIG. 23, the second contact part 421 disposed adjacently to the first contact part 411 is indicated by the two-dot chain line. In FIG. 24, the first contact part 411 disposed adjacently to the second contact part 421 is indicated by the two-dot chain line. As shown in FIGS. 23 and 24, an upper end portion of the first contact part 411 is positioned higher than the upper surface 91 of the substrate 9 and a lower end portion of the second contact part 421 is positioned lower than the lower surface 92 of the substrate 9. Therefore, in the substrate holding part 14, the respective upper end portions of the plurality of first contact parts 411 are positioned higher than the respective lower end portions of the plurality of second contact parts 421.

Figure 25:
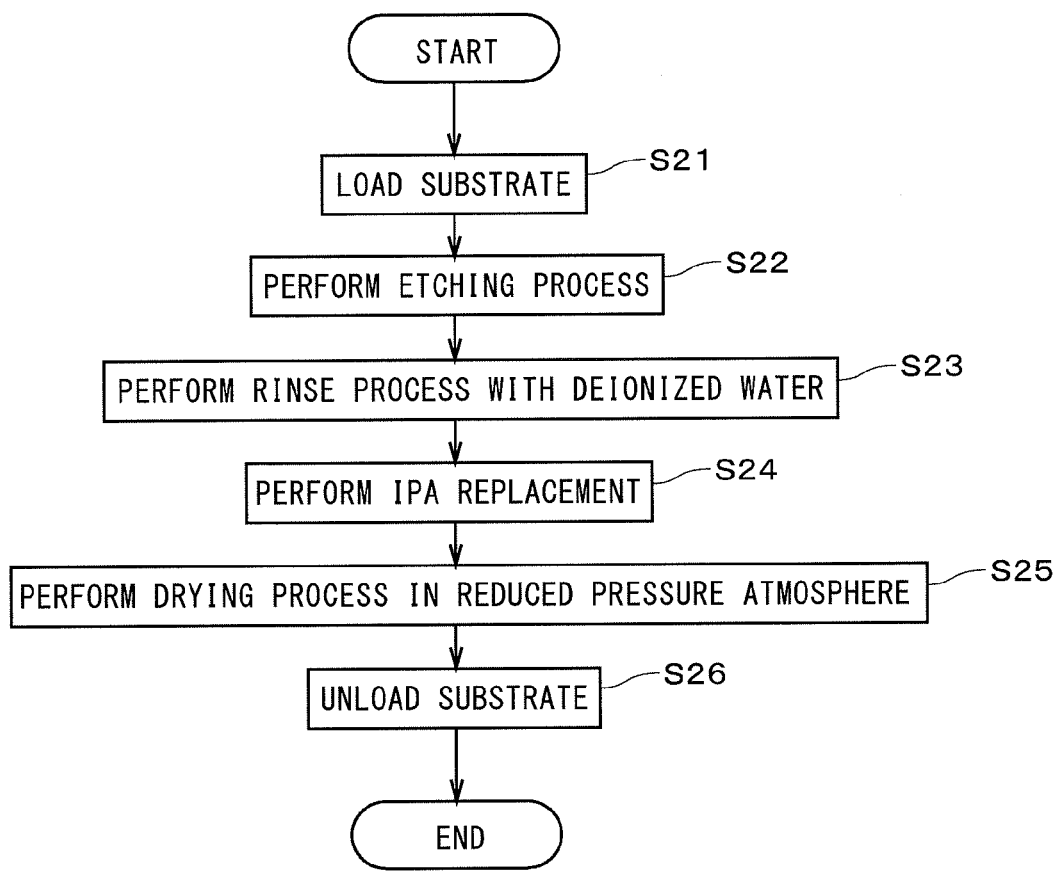
FIG. 25 is a flowchart showing an operation flow of substrate processing.
Figure 26:
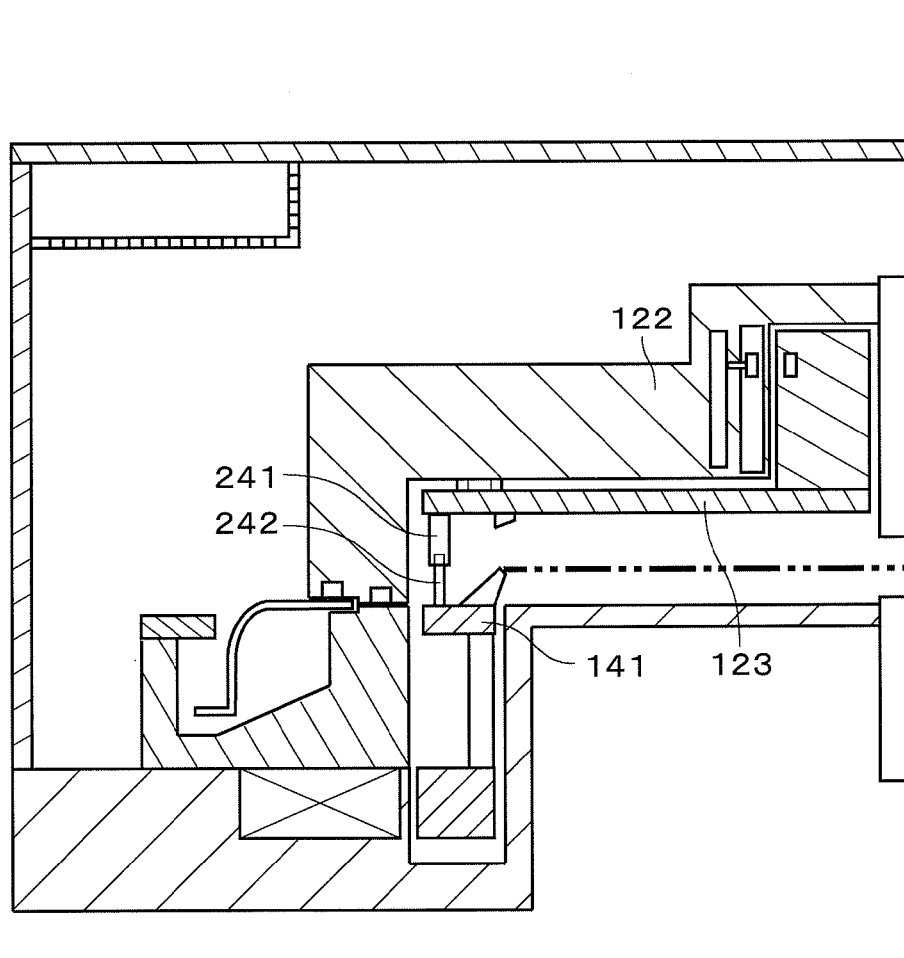
FIGS. 26 to 29 are cross sections each showing part of the substrate processing apparatus.

Next, with reference to FIG. 25, discussion will be made on an operation flow for processing the substrate 9 in the substrate processing apparatus 1b under the control of the control part 10. The operation shown in FIG. 25 is only one example, and various processings may be performed in various orders in the substrate processing apparatus 1b. In the substrate processing apparatus 1b, first, the substrate 9 is transferred and held by the substrate holding part 14 while the chamber cover 122 is positioned high as shown in FIG. 14 (Step S21). Then, the chamber cover 122 moves down, and the position of the top plate 123 in the circumferential direction relative to the substrate supporting part 141 is fixed by the first engaging parts 241 and the second engaging parts 242 as shown in FIG. 26.

Figure 27:
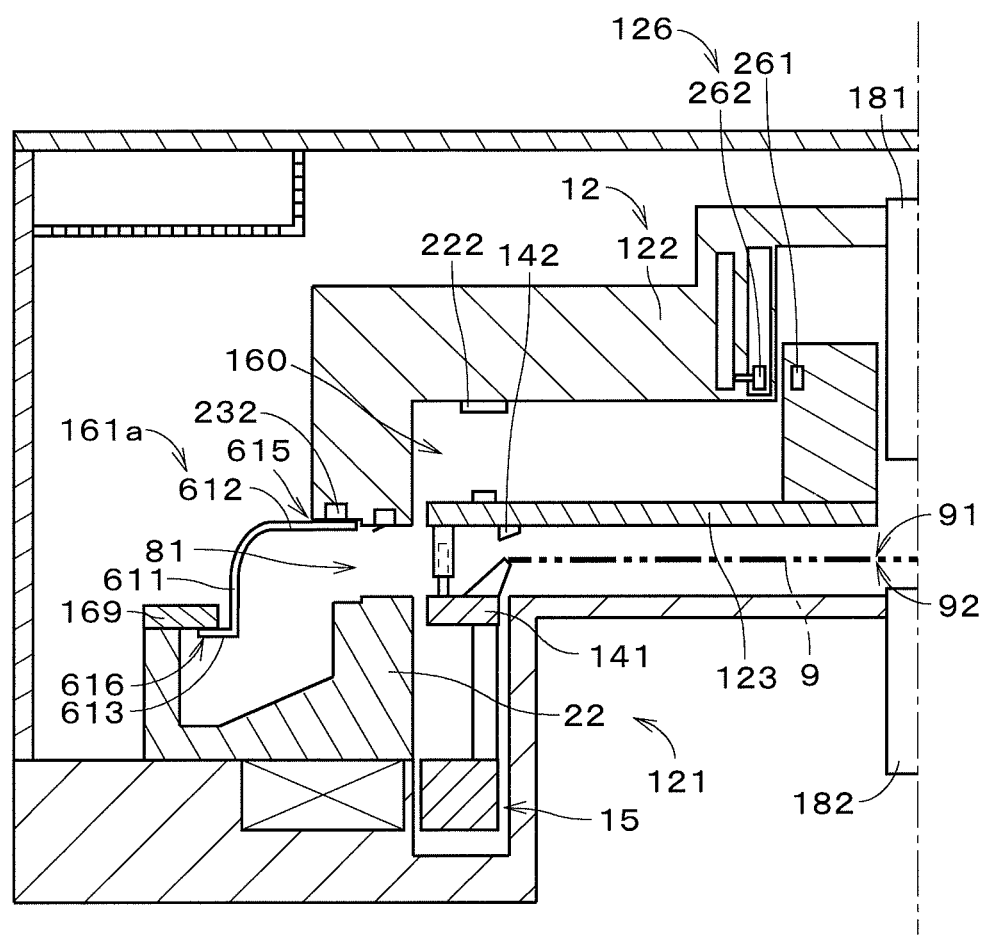

Subsequently, as shown in FIG. 27, the holding of the top plate 123 by the plate holding part 222 is released, and the chamber cover 122 moves upward and gets apart from the top plate 123. A position of the top plate 123 in the vertical direction relative to the chamber cover 122 and the substrate supporting part 141 is fixed by the first magnet 261 and the second magnet 262 of the top plate moving mechanism 126. The top plate 123 is positioned at the first close position and the substrate retaining part 142 is not in contact with the substrate 9. Further, the chamber cover 122 is apart from the chamber sidewall 22, and the annular opening 81 is formed around the substrate 9 (i.e., on the outer side in the radial direction relative to the substrate 9), between the chamber cover 122 and the chamber sidewall 22. Hereinafter, a state of the chamber 12 in which the annular opening 81 is formed will be referred to as the "semiopen state". The state shown in FIG. 14 will be referred to as the "open state".

The cup part 161a moves up from the position shown in FIG. 14 and gets positioned on an outer side relative to the annular opening 81 in the radial direction along the entire circumference thereof as shown in FIG. 27. Thus, the cup moving mechanism 162a (see FIG. 14) moves the cup part 161a in the vertical direction between the a first position on the outer side in the radial direction relative to the annular opening 81 and a second position (see FIG. 14) lower the first position. In the cup part 161a positioned at the first position, the sidewall portion 611 thereof is opposed to the annular opening 81 in the radial direction.

In the cup part 161a positioned at the first position, an upper surface of an inner edge of the upper surface portion 612 thereof is in contact with the lip seal 232 of the chamber cover 122 along the entire circumference thereof. Between the chamber cover 122 and the upper surface portion 612 of the cup part 161a, a first seal 615 for preventing gas and liquid from passing therethrough is thereby formed. Further, an upper surface of the lower surface portion 613 of the cup part 161a is in contact with a lower surface of the outer seal portion 169 of the chamber body 121 along the entire circumference thereof. Between the chamber body 121 and the lower surface portion 613 of the cup part 161a, a second seal 616 for preventing gas and liquid from passing therethrough is thereby formed.

In the substrate processing apparatus 1b, the upper surface portion 612 of the cup part 161a is a first seal portion on which the first seal 615 is formed at the first position. The lower surface portion 613 of the cup part 161a is a second seal portion on which the second seal 616 is formed at the first position. Then, a space which is sealed (hereinafter, referred to as a "sealed space 160") is formed by the chamber 12 in the semiopen state (i.e., the chamber body 121 and the chamber cover 122 in the state where the annular opening 81 is formed) and the cup part 161*a* positioned at the first position. When the sealed space 160 is formed, nitrogen gas is supplied therein from the upper nozzle 181 and the inside of the sealed space 160 is brought into a nitrogen atmosphere (i.e., a low oxygen atmosphere).

Next, the substrate rotating mechanism 15 starts rotation of the substrate supporting part 141, the substrate 9, and the top plate 123. Further, the substrate 9 is heated by a not-shown heater. Then, the first processing liquid from the first processing liquid supply part 183 (see FIG. 16) is supplied onto the center portion of the upper surface 91 of the substrate 9 from the upper nozzle 181 opposed to the opening at the center of the top plate 123. The first processing liquid is spread toward the outer peripheral portion of the substrate 9 by the rotation of the substrate 9 and the entire upper surface 91 is coated with the first processing liquid, and then etching is performed in the nitrogen atmosphere (Step S22).

The first processing liquid is also supplied onto the center portion of the lower surface 92 of the substrate 9 from the lower nozzle 182 and is spread toward the outer peripheral portion of the substrate 9 by the rotation of the substrate 9. The first processing liquid spattering from the upper surface 91 and the lower surface 92 of the substrate 9 is received by the cup part 161*a* through the annular opening 81 in the sealed space 160 and collected by the first collecting part 194 (see FIG. 16). If the collected first processing liquid can be recycled, the first processing liquid is recycled after removing impurities and the like therefrom through a filter or the like.

After the etching process using the first processing liquid is finished, the supply of the first processing liquid is stopped. Then the upper nozzle 181 ejects nitrogen gas and the first processing liquid is removed from the substrate 9 by the rotation of the substrate 9. Since the top plate 123 is rotated together with the substrate supporting part 141, almost no first processing liquid is left on the lower surface of the top plate 123 and no first processing liquid drops from the top plate 123.

Figure 28:
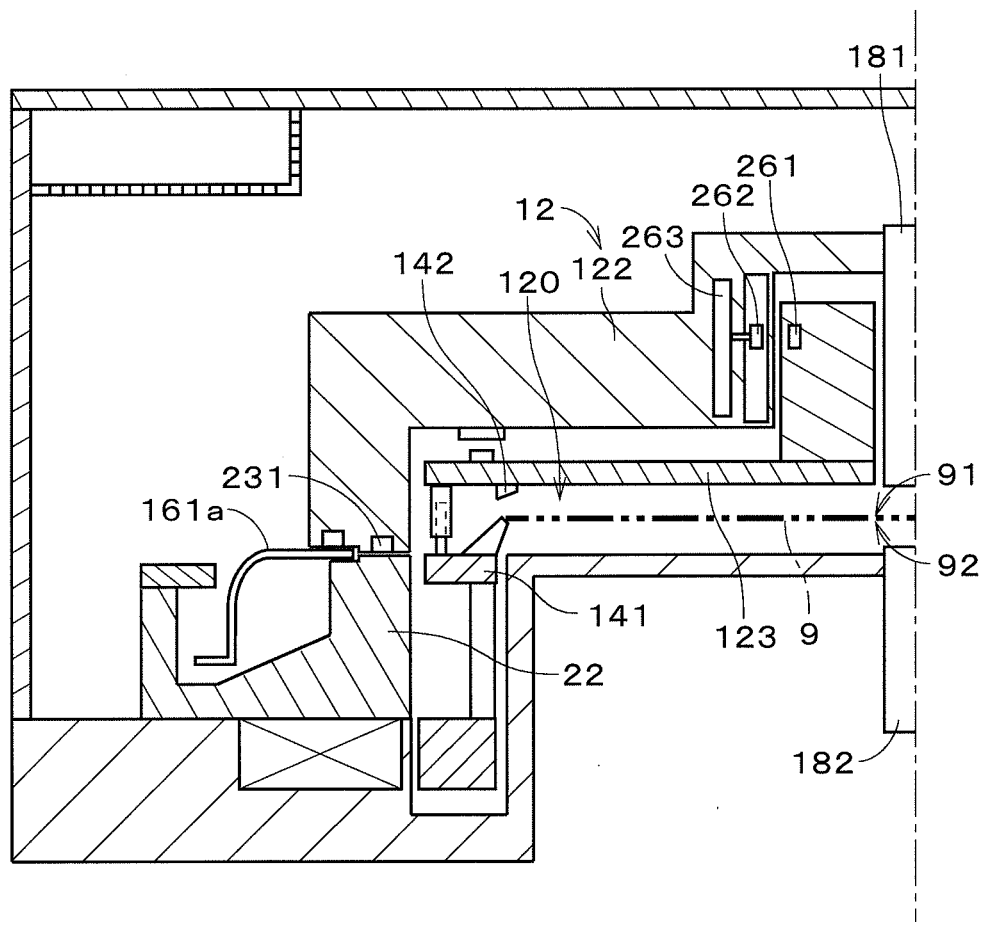

Next, as shown in FIG. 28, the chamber cover 122 and the cup part 161*a* move downward. Then, by bring the lip seal 231 of the chamber cover 122 into contact with the upper portion of the chamber sidewall 22, the chamber 12 forms the sealed internal space 120. In the state where the chamber 12 is sealed, the substrate 9 is directly opposed to the inner wall of the chamber 12, and there is no other liquid receiving part therebetween. The internal space 120 is in the nitrogen atmosphere (i.e., the low oxygen atmosphere), like the sealed space 160.

When the chamber cover 122 moves, the position of the second magnet 262 is controlled by the magnet moving mechanism 263 so that a position of the first magnet 261 in the vertical direction should not be changed, that is, the position of the top plate 123 in the vertical direction relative to substrate supporting part 141 and the substrate 9 should not be changed. For this reason, the top plate 123 does not move from the first close position and the substrate retaining part 142 is not in contact with the substrate 9.

After the internal space 120 is formed, the upper nozzle 181 continuously ejects the second processing liquid which is deionized water, to thereby supply the second processing liquid onto the center portion of the upper surface 91 of the substrate 9 being rotated. By the rotation of the substrate 9, the second processing liquid is spread toward the outer peripheral portion of the substrate 9 and spattered outside from the outer peripheral edge of the substrate 9. The second processing liquid is also supplied onto the center portion of the lower surface 92 of the substrate 9 from the lower nozzle 182 and spread toward the outer peripheral portion of the substrate 9 by the rotation of the substrate 9. The used water which is the second processing liquid, spattering from the substrate 9, is received by the inner wall of the chamber 12 (specifically, the respective inner walls of the chamber cover 122 and the chamber sidewall 22) and discarded through the second collecting part 195 (Step S23). This also cleans the inside of the chamber 12.

Figure 29:
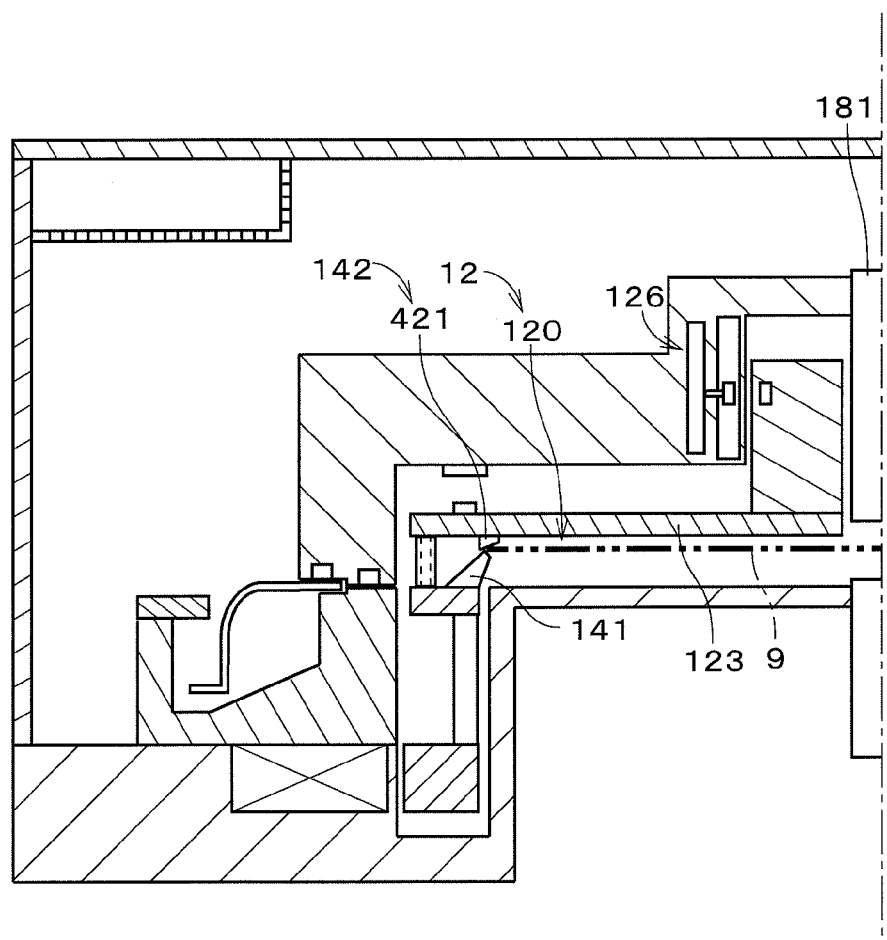

After a rinse process using deionized water is performed for a predetermined time period, the supply of the second processing liquid is stopped, and the top plate 123 is moved downward by the top plate moving mechanism 126 and gets positioned at the above-discussed second close position as shown in FIG. 29. While the top plate 123 is positioned at the second close position, the plurality of second contact parts 421 of the substrate retaining part 142 are in contact with the outer edge of the substrate 9. The substrate retaining part 142 presses the substrate 9 toward the substrate supporting part 141 by a weight of the top plate 123. The substrate 9 is firmly held, being sandwiched by the substrate supporting part 141 and the substrate retaining part 142 from below and above.

Subsequently, the third processing liquid which is isopropyl alcohol (IPA) supplied from the third processing liquid supply part 185 is ejected from the opening of the center of the top plate 123 through the upper nozzle 181. Then, when the clearance between the top plate 123 and the substrate 9 is filled with the third processing liquid, the supply of the third processing liquid is stopped. The deionized water is thereby replaced with the isopropyl alcohol (IPA) on the substrate 9 (Step S24). In Step S23, the clearance between the top plate 123 and the substrate 9 is not filled with the second processing liquid.

Next, by rotating the substrate 9 at high speed together with the substrate supporting part 141, the substrate retaining part 142, and the top plate 123 in the internal space 120 and ejecting nitrogen gas ($N_2$) from the upper nozzle 181, the third processing liquid is removed from the substrate 9. The rotation speed of the substrate 9 at this time is higher than that in Steps S22 and S23. The third processing liquid spattering from the substrate 9 is received by the inner wall of the chamber 12 and collected by the second collecting part 195. At that time, the pressure reducing part 196 reduces pressure in the internal space 120 of the chamber 12, to thereby promote drying of the substrate 9 (Step S25). If the third processing liquid collected by the second collecting part 195 is recycled, impurities and the like are removed from the third processing liquid. After the drying of the substrate 9 is finished, the rotation of the substrate 9 is stopped. Further, the substrate 9 may be heated in drying.

After that, the pressure in the internal space 120 is increased back to the normal pressure. Further, the top plate 123 is moved upward by the top plate moving mechanism 126 and held by the chamber cover 122 as shown in FIG. 26. Then, the chamber cover 122 and the top plate 123 move up, and the chamber 12 is brought into the open state as shown in FIG. 14. In Step S25, since the top plate 123 is rotated together with the substrate supporting part 141, almost no liquid is left on the lower surface of the top plate 123 and no liquid drops from the top plate 123 while the chamber cover 122 moves up. The substrate 9 is unloaded by an external transfer mechanism (Step S26).

Figure 30:
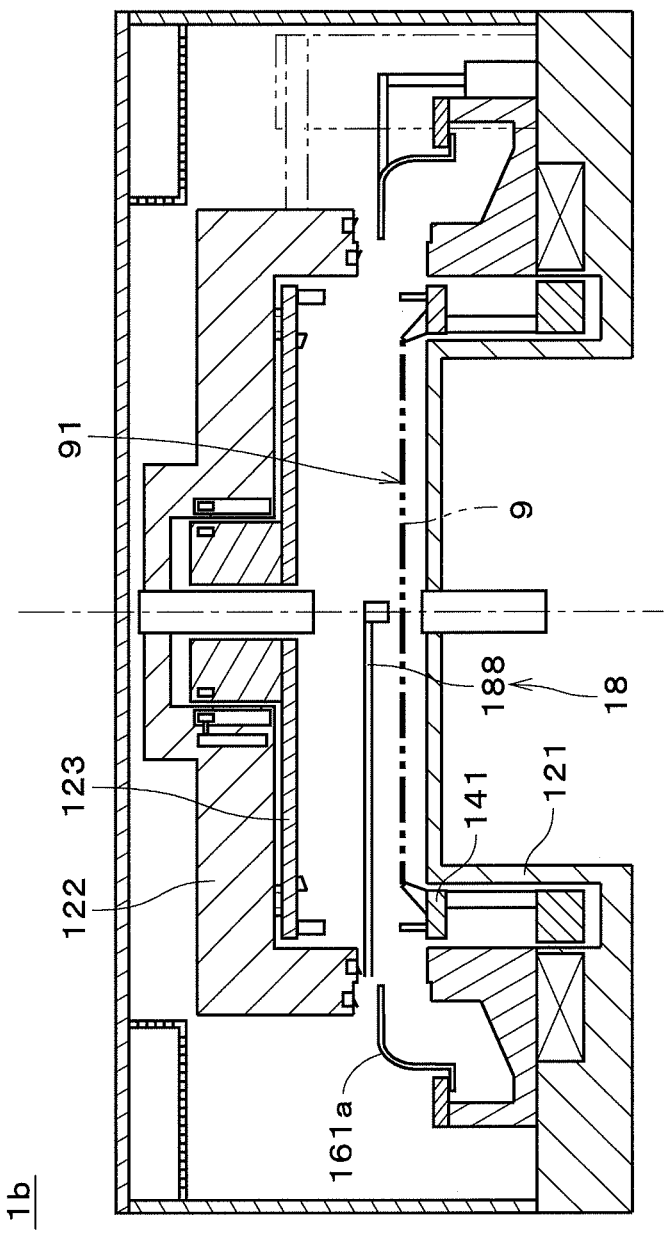
FIG. 30 is a cross section showing the substrate processing apparatus.

As shown in FIG. 30, the scan nozzle 188 may be additionally provided in the processing liquid supply part 18 of the substrate processing apparatus 1b. In the case where the scan nozzle 188 is used, the chamber 12 is brought into the open state where the chamber cover 122 is positioned above and largely apart from the chamber body 121 and the top plate 123 is apart from the substrate supporting part 141. Therefore, the top plate 123 is not rotated. Between the chamber cover 122 and the chamber body 121, the scan nozzle 188 is inserted from the outside of the chamber 12 and moved up to above the substrate 9. The scan nozzle 188 is a two-fluid nozzle used, for example, for cleaning with deionized water after an SC1 process. The scan nozzle 188 may be any type of nozzle other than the two-fluid nozzle. The scan nozzle 188 supplies the processing liquid onto the upper surface 91 of the substrate 9 while repeating a reciprocating motion in the horizontal direction. The scan nozzle 188 may be any other type of nozzle for other processings. The processing liquid from the scan nozzle 188 is received by the cup part 161a positioned at the first position and collected, and then recycled as necessary. When the two-fluid nozzle is used as the scan nozzle 188, it is preferable that a not-shown gas exhaust facility should be connected to the inside of the cover 17 to sufficiently discharge the generated processing liquid mist.

Thus, the substrate processing apparatus 1b can perform a processing on the substrate 9 in the internal space 120 in the state where the chamber 12 is sealed and also can perform a processing on the substrate 9 in the sealed space 160 formed by the chamber 12 and the cup part 161a while the chamber 12 is in the semiopen state. Further, the substrate processing apparatus 1b can perform a processing on the substrate 9 while the chamber 12 is in the open state. In other words, as to the substrate processing apparatus 1b, more various processings than in the conventional cases can be performed by one apparatus.

In the following discussion, a processing performed in the internal space 120 of the chamber 12 will be referred as a "first sealed-state processing", a processing performed in the sealed space 160 will be referred as a "second sealed-state processing", and a processing performed in the open state will be referred as an "open-state processing". The substrate processing apparatus 1b can continuously perform the first sealed-state processing which can be performed in the reduced pressure atmosphere and/or pressurized atmosphere, the second sealed-state processing using the liquid receiving part 16, and the open-state processing. In a case where the scan nozzle 188 is provided, a processing using the scan nozzle 188 can be also performed continuously with the first sealed-state processing and/or the second sealed-state processing. In the substrate processing apparatus 1b, the sealed space 160 is not brought into the reduced pressure atmosphere or the pressurized atmosphere.

In the second sealed-state processing, since the first seal 615 is formed between the cup part 161a and the chamber cover 122 and the second seal 616 is formed between the cup part 161a and the chamber body 121, the sealed space 160 is formed by the chamber 12 and the cup part 161a. It is thereby possible to receive the processing liquid in the sealed space 160 by the cup part 161a disposed outside the chamber 12. As discussed above, by performing a processing of the substrate 9 while the sealed space 160 is brought into the low oxygen atmosphere, it is possible to prevent or suppress oxidation of a film on the substrate 9. Such as a processing performed in the low oxygen atmosphere is useful, for example, in a polymer removal process or the like for a substrate on which copper wiring is formed, to prevent oxidation of the copper wiring. Since the cup part 161a is disposed outside the chamber 12, it is possible to reduce the size of the chamber 12. It is thereby possible, in the first sealed-state processing, to reduce the amount of gas to fill the internal space 120 of the chamber 12 and shorten the time required for the processing involving pressure reduction and/or pressurization in the internal space 120.

Further, by collecting the processing liquid by the second collecting part 195 in the first sealed-state processing and collecting the processing liquid by the first collecting part 194 in the second sealed-state processing, it is possible to separately collect a plurality of kinds of processing liquids while continuously performing processings using the plurality of kinds of processing liquids. It is thereby possible to increase the collection efficiency of the processing liquids and prolong the lifetimes of the processing liquids as compared with the case where a plurality of kinds of processing liquids are received only by the chamber inner wall and collected separately by using a multiple valve. Further, it is possible to easily prevent generation of particles, heat generation, smoke generation, or the like caused by mixture of different kinds of processing liquids.

As discussed above, the cup part 161a includes the upper surface portion 612 having a substantially annular disk-like shape which extends inward in the radial direction from the upper end portion of the sidewall portion 611, and the upper surface portion 612 comes into contact with the chamber cover 122. The cup part 161a further includes the lower surface portion 613 having a substantially annular disk-like shape which extends outward in the radial direction from the lower end portion of the sidewall portion 611, and the lower surface portion 613 comes into contact with the chamber body 121. Thus, in the substrate processing apparatus 1b, it is possible to easily form the first seal 615 between the chamber cover 122 and the cup part 161a and easily form the second seal 616 between the chamber body 121 and the cup part 161a, with a simple structure.

In the substrate processing apparatus 1b, by using the top plate 123, it is possible to prevent the liquid deposited on the inside of the chamber from dropping onto the substrate 9 with a simple structure. Since the outer peripheral edge of the top plate 123 is positioned on the outer side relative to the outer peripheral edge of the substrate 9 in the radial direction along the entire circumference thereof, the entire outer peripheral portion of the upper surface 91 of the substrate 9 is covered by the top plate 123. As a result, it is possible to prevent the processing liquid spattering from the outer peripheral edge of the substrate 9 from splashing back from the inner wall of the chamber 12 or the like and being deposited on the substrate 9. Further, since a processing is performed while the top plate 123 is positioned at the second close position, it is possible to reduce the amount of processing liquid required to coat the upper surface 91 of the substrate 9. It is also possible to reduce the amount of gas to be supplied between the top plate 123 and the substrate 9.

As discussed above, since the top plate 123 can be moved in the vertical direction relative to the chamber cover 122, it is possible to rotate the top plate 123 together with the substrate supporting part 141 both in the first sealed-state processing and in the second sealed-state processing. Further, by moving the chamber cover 122 up while the chamber cover 122 holds the top plate 123, it is possible to easily release the engagement between the top plate 123 and the substrate supporting part 141. It is also possible to eject the processing liquid from the upper nozzle 181 to perform a processing in such an open state.

In the substrate holding part 14, the plurality of first contact parts 411 of the substrate supporting part 141 are in contact with the outer edge of the substrate 9 at the plurality of first contact positions, respectively. Then, while the top plate 123 is positioned at the second close position, the plurality of second contact parts 421 of the substrate retaining part 142 are in contact with the outer edge of the substrate 9 at the plurality of second contact positions different from the plurality of first contact positions, respectively. Thus, since the structure for supporting the substrate 9 from below and the structure for retaining the substrate 9 from above are in contact with substrate 9 at different positions in the circumferential direction, it is possible to prevent the processing liquid moving from the center portion of the substrate 9 toward the outer edge thereof from being left near the holding structure for holding the outer edge of the substrate 9. It is also possible to prevent the processing liquid from splashing back from the holding structure.

As discussed above, in the substrate holding part 14, two second contact parts 421 of the substrate retaining part 142 are provided on both sides of each first contact part 411 of the substrate supporting part 141 in the circumferential direction, adjacently thereto. Since a stress is thereby imposed on the substrate 9 near each of the first contact parts 411 when the substrate supporting part 141 and the substrate retaining part 142 sandwich the substrate 9 to hold the same, the substrate holding part 14 can firmly hold the substrate 9. Further, two first contact parts 411 may be provided on both sides of each second contact part 421 in the circumferential direction, adjacently thereto. Even in such a case, since a stress is thereby imposed on the substrate 9 near each of the second contact parts 421, the substrate holding part 14 can firmly hold the substrate 9.

As discussed above, the upper end portion of each of the first contact parts 411 of the substrate supporting part 141 is positioned higher than the lower end portion of the corresponding second contact part 421 of the substrate retaining part 142. In other words, with respect to the vertical direction, each of the first contact parts 411 and the corresponding second contact part 421 partially overlap each other. With this structure, the substrate supporting part 141 and the substrate retaining part 142 can more strongly sandwich the substrate 9, to thereby firmly hold the same. Further, since the substrate retaining part 142 presses the substrate 9 toward the substrate supporting part 141 by the weight of the top plate 123, the substrate 9 can be thereby held much more firmly.

In the substrate supporting part 141, each of the first contact parts 411 comes into contact with the outer edge of the substrate 9 at the first sloped surface 412 thereof which goes downward as it goes inward in the radial direction. This reduces the contact area between the first contact part 411 and the substrate 9, and it is thereby possible to decrease the possibility of contamination of the substrate 9 due to the contact with the substrate supporting part 141. In the substrate retaining part 142, each of the second contact parts 421 comes into contact with the outer edge of the substrate 9 at the second sloped surface 422 thereof which goes upward as it goes inward in the radial direction. This reduces the contact area between the second contact part 421 and the substrate 9, and it is thereby possible to decrease the possibility of contamination of the substrate 9 due to the contact with the substrate retaining part 142.

The top plate moving mechanism 126 moves the top plate 123 relative to the chamber cover 122 by using magnetic force. It is thereby possible to easily change a distance between the top plate 123 and the substrate 9 in the vertical direction without providing any moving mechanism directly connected to the top plate 123. As a result, in the first sealed-state processing and second sealed-state processing, it is possible to easily change the distance between the top plate 123 and the substrate 9 even in the sealed internal space 120 or the sealed space 160.

The top plate moving mechanism 126 includes the first magnet 261 provided at the top plate shaft 235, the second magnet 262 provided at the chamber cover 122, and the magnet moving mechanism 263 for moving the second magnet 262 in the vertical direction. Thus, in the substrate processing apparatus 1b, it is possible to easily move the top plate 123 in the vertical direction with a simple structure.

As discussed above, the substrate retaining part 142 is fixed to the lower surface of the top plate 123, to retain the substrate 9 from above while the chamber 12 is brought into the sealed state and the top plate 123 is positioned at the second close position. Further, the substrate retaining part 142 is apart from the substrate 9 while the top plate 123 is positioned at the first close position. Thus, by changing the position of the top plate 123 by the top plate moving mechanism 126, it is possible to easily switch the state for holding the substrate 9 by the substrate holding part 14 in accordance with the kind of processing to be performed on the substrate 9.

In the substrate processing apparatus 1b, while the top plate 123 is positioned at the second close position, by ejecting the processing liquid from the center of the top plate 123 through the upper nozzle 181, the clearance between the top plate 123 and the substrate 9 is filled with the processing liquid. As a result, it is possible to reduce the amount of processing liquid to be used. Further, since the processing liquid on the upper surface 91 of the substrate 9 can be prevented from coming into contact with the surrounding gas, it is possible to suppress oxidation of the processing liquid when the surrounding gas contains oxygen.

In the substrate processing apparatus 1b, the rotor part 152 is disposed in the internal space 120 of the chamber 12 and the stator part 151 is disposed outside the chamber 12. It is possible to easily form the internal space 120 having excellent hermeticity. As a result, it is possible to easily achieve single-substrate processing on the substrate 9 in the sealed internal space 120. Further, it is possible to easily provide various structures such as the lower nozzle 182 or the like to the chamber bottom 21 as compared with in an apparatus in which a motor is provided below the chamber bottom.

In the substrate rotating mechanism 15, the rotor part 152 rotates, being in a floating state in the internal space 120. For this reason, it is not necessary to provide any structure for supporting the rotor part 152, and it is thereby possible to reduce the size and simplify the configuration of the substrate processing apparatus 1b. Since no dust or the like is generated due to friction between the rotor part 152 and the supporting structure, it is possible to improve cleanability of the internal space 120. Furthermore, since no friction resistance caused by the supporting structure is exerted on the rotor part 152, it is possible to easily rotate the rotor part 152 at high speed.

Figure 31:
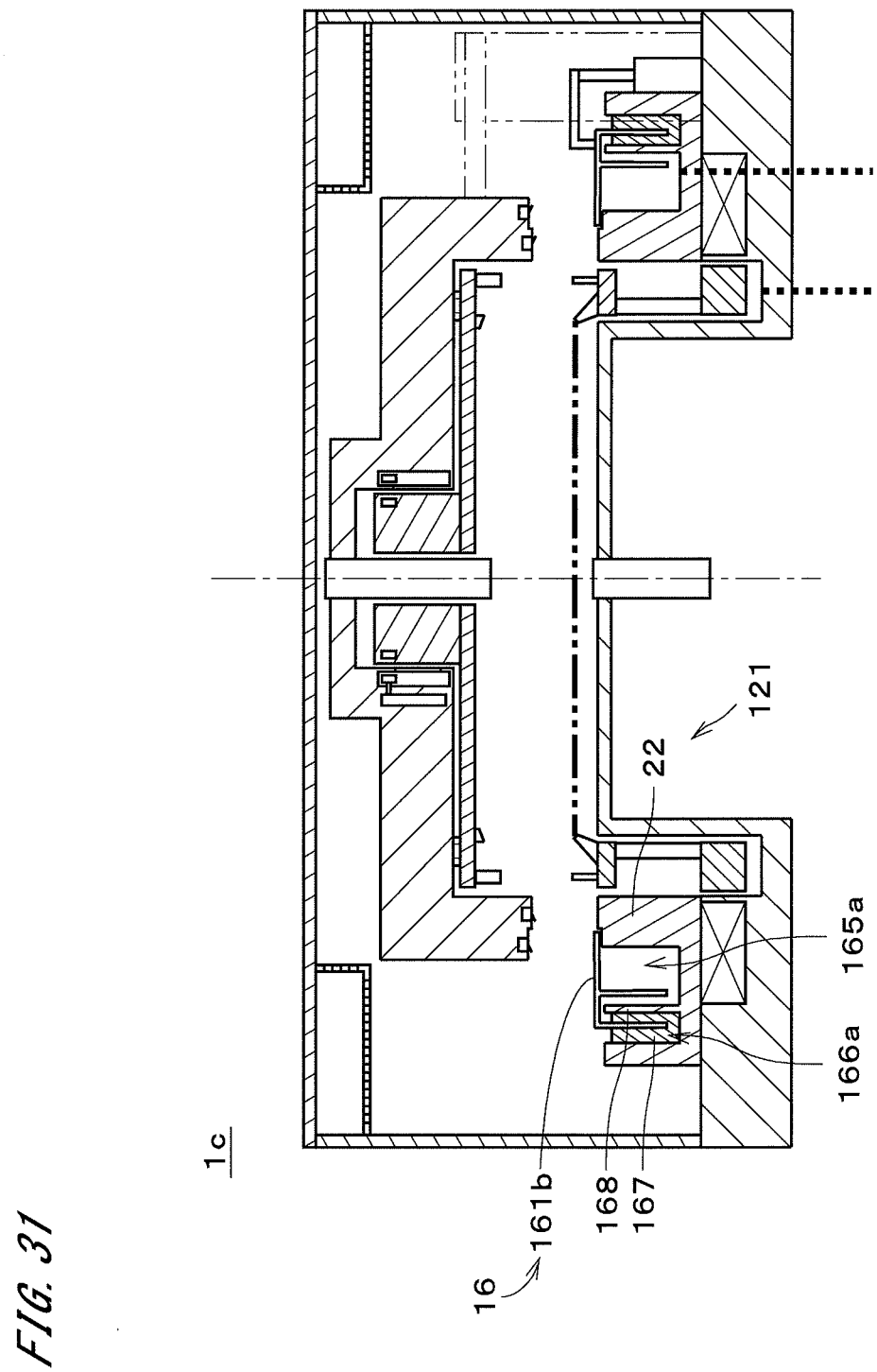
FIG. 31 is a cross section showing a substrate processing apparatus in accordance with a fourth preferred embodiment of the present invention.

FIG. 31 is a cross section showing a substrate processing apparatus 1c in accordance with the fourth preferred embodiment of the present invention. In the substrate processing apparatus 1c, a cup part 161b having a shape different from that of the cup part 161a shown in FIG. 14 is provided in the liquid receiving part 16, and the chamber body 121 includes an annular liquid pooling part 166a disposed outside the liquid receiving recessed portion 165a. Other constituent elements are identical to those of the substrate processing apparatus 1b shown in FIG. 14, and in the following description, constituent elements identical to or corresponding to those of the substrate processing apparatus 1b are represented by the same reference signs.

As shown in FIG. 31, the liquid pooling part 166a is constituted of members which constitute the chamber sidewall 22 and the liquid receiving recessed portion 165a. The liquid pooling part 166a is so provided outside the outer wall portion 168 surrounding an outer periphery of the liquid receiving recessed portion 165a, as to surround the liquid receiving recessed portion 165a along the entire circumference thereof in the circumferential direction. The liquid pooling part 166a pools therein a seal liquid 167. As the seal liquid 167, for example, deionized water is used.

Figure 32:
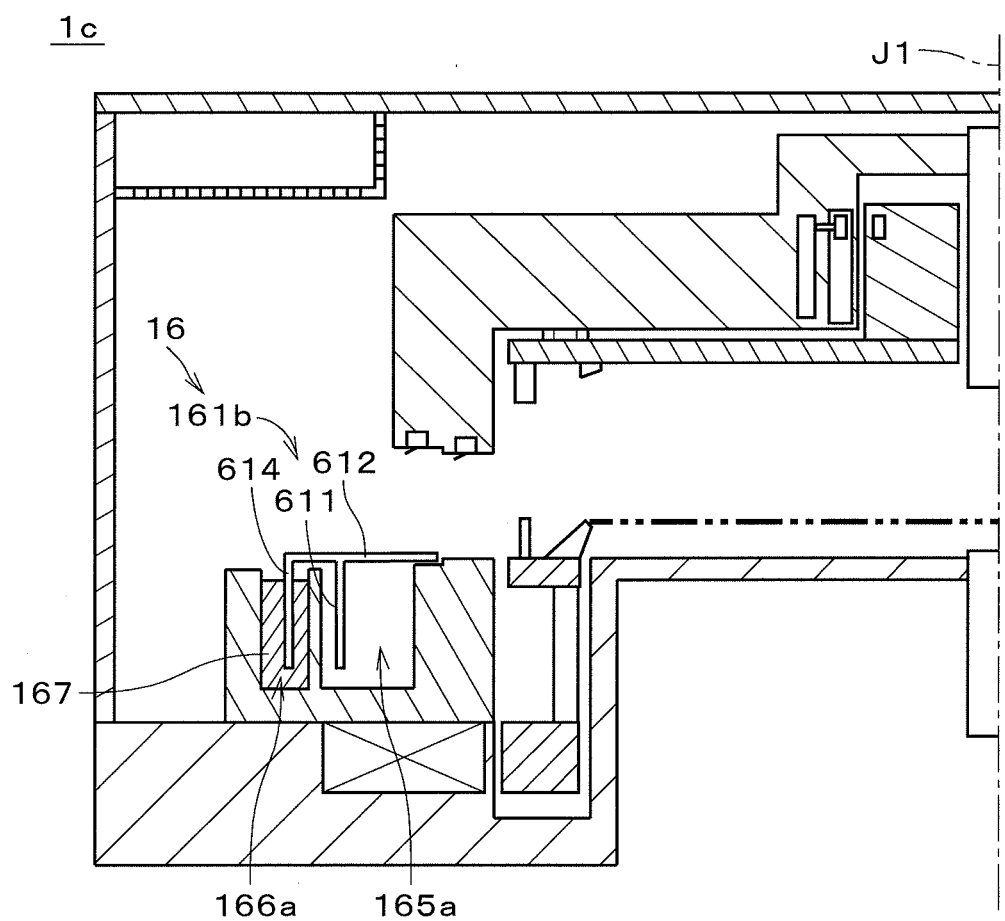
FIGS. 32 and 33 are cross sections each showing part of the substrate processing apparatus.

FIG. 32 is a cross section showing part of the substrate processing apparatus 1c. The cup part 161b includes the sidewall portion 611, the upper surface portion 612, and an outer cylindrical portion 614. The sidewall portion 611 has a substantially cylindrical shape about the central axis J1. The upper surface portion 612 has a substantially annular disk-like shape about the central axis J1 and extends inward and outward in the radial direction from the upper end portion of the sidewall portion 611. The outer cylindrical portion 614 has a substantially cylindrical shape about the central axis J1 and extends downward from an outer edge of the upper surface portion 612. The outer cylindrical portion 614 is disposed around the sidewall portion 611, being apart from the sidewall portion 611. An inner peripheral surface of the outer cylindrical portion 614 is opposed to an outer peripheral surface of the sidewall portion 611 in the radial direction. In the state of FIG. 32, most part of the sidewall portion 611 except an upper portion thereof is positioned inside the liquid receiving recessed portion 165a, and most part of the outer cylindrical portion 614 except an upper portion thereof is positioned inside the seal liquid 167 pooled in the liquid pooling part 166a.

Figure 33:
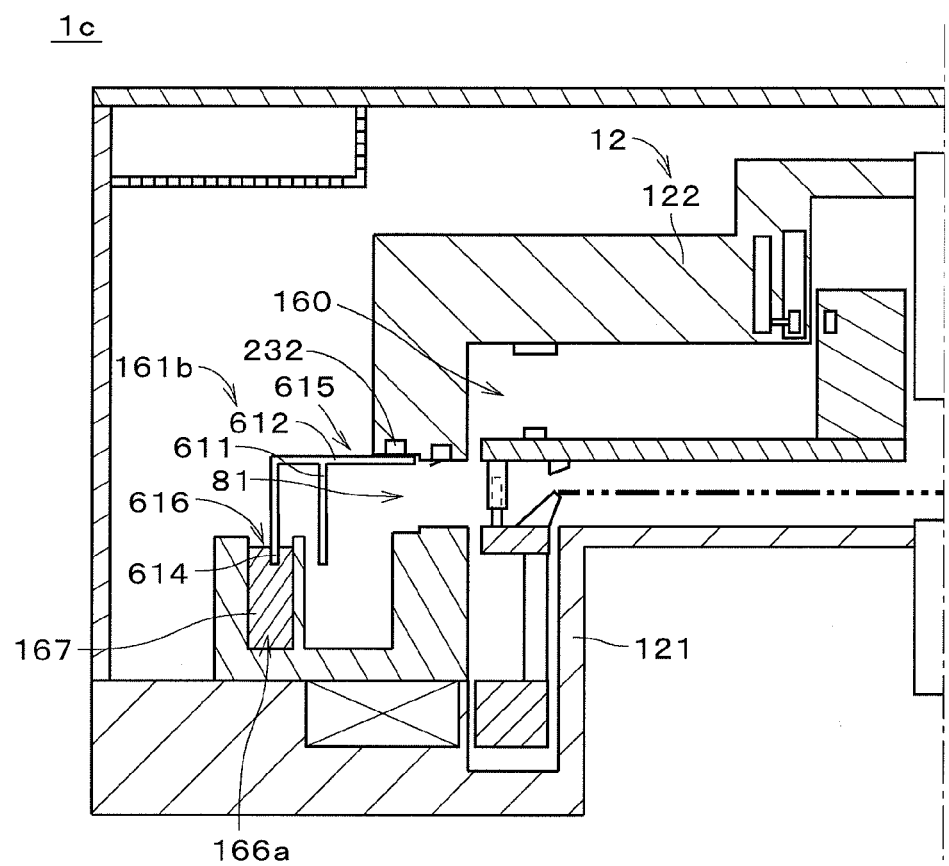

FIG. 33 is a cross section showing part of the substrate processing apparatus 1c in a state where the second sealed-state processing is performed in the sealed space 160. As shown in FIG. 33, the chamber 12 is in the semiopen state, and the annular opening 81 is formed between the chamber body 121 and the chamber cover 122. The cup part 161b is positioned at the first position on the outer side in the radial direction relative to the annular opening 81, and the sidewall portion 611 is opposed to the annular opening 81 in the radial direction.

Like in the substrate processing apparatus 1b, in the cup part 161b positioned at the first position, the upper surface of the inner edge part of the upper surface portion 612 is in contact with the lip seal 232 of the chamber cover 122 along the entire circumference thereof. Between the chamber cover 122 and the upper surface portion 612 of the cup part 161b, the first seal 615 for preventing gas and liquid from passing therethrough is thereby formed. Further, a lower end portion of the outer cylindrical portion 614 of the cup part 161b is positioned in the seal liquid 167 pooled in the liquid pooling part 166a of the chamber body 121 along the entire circumference thereof. Between the chamber body 121 and the outer cylindrical portion 614 of the cup part 161b, the second seal 616 for preventing gas and liquid from passing therethrough is thereby formed.

The upper surface portion 612 of the cup part 161b is the first seal portion on which the first seal 615 is formed at the first position. The outer cylindrical portion 614 is the second seal portion on which the second seal 616 is formed at the first position. Then, the sealed space 160 is formed by the chamber 12 in the semiopen state and the cup part 161b positioned at the first position.

Thus, in the substrate processing apparatus 1c, it is possible to easily form the first seal 615 between the chamber cover 122 and the cup part 161b and easily form the second seal 616 between the chamber body 121 and the cup part 161b, with a simple structure. Further, since the second seal 616 is formed by positioning the lower end portion of the outer cylindrical portion 614 of the cup part 161b in the seal liquid 167, it is possible to reliably prevent gas and liquid from leaking out from the second seal 616.

Figure 34:
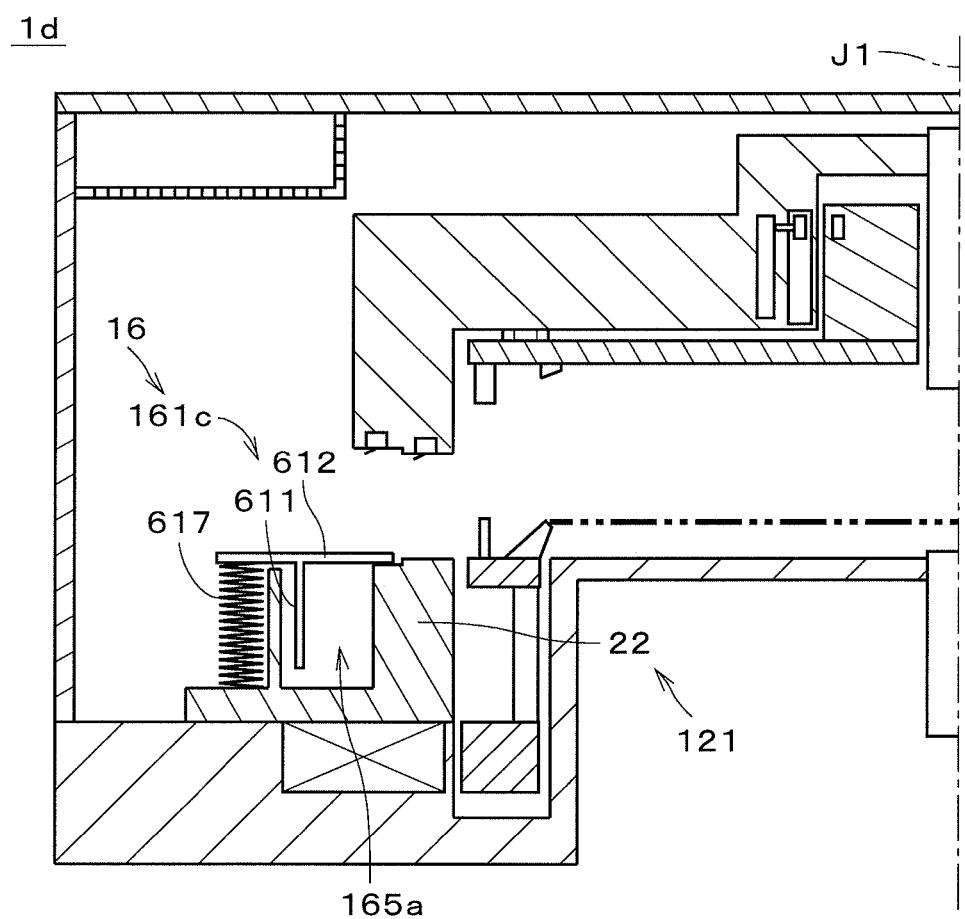
FIG. 34 is a cross section showing part of a substrate processing apparatus in accordance with a fifth preferred embodiment of the present invention.

FIG. 34 is a cross section showing part of a substrate processing apparatus 1d in accordance with the fifth preferred embodiment of the present invention. In the substrate processing apparatus 1d, a cup part 161c having a shape and a structure different from those of the cup part 161a shown in FIG. 14 is provided in the liquid receiving part 16. Other constituent elements are identical to those of the substrate processing apparatus 1b shown in FIG. 14, and in the following description, constituent elements identical to or corresponding to those of the substrate processing apparatus 1b are represented by the same reference signs.

As shown in FIG. 34, the cup part 161c includes the sidewall portion 611, the upper surface portion 612, and a bellows 617. The sidewall portion 611 has a substantially cylindrical shape about the central axis J1. The upper surface portion 612 has a substantially annular disk-like shape about the central axis J1 and extends inward and outward in the radial direction from the upper end portion of the sidewall portion 611. The bellows 617 has a substantially cylindrical shape about the central axis J1 and is extendable in the vertical direction. The bellows 617 is formed of a material impervious to gas and liquid.

The bellows 617 is provided around the sidewall portion 611 along the entire circumference thereof. An upper end portion of the bellows 617 is connected to a lower surface of the outer edge of the upper surface portion 612 along the entire circumference thereof. In other words, the upper end portion of the bellows 617 is indirectly connected to the sidewall portion 611 through the upper surface portion 612. A connecting part between the bellows 617 and the upper surface portion 612 prevents gas and liquid from passing therethrough. A lower end portion of the bellows 617 is indirectly connected to the chamber body 121 through the members constituting the chamber sidewall 22 and the liquid receiving recessed portion 165a. A connecting part between the lower end portion of the bellows 617 and the members constituting the chamber sidewall 22 and the liquid receiving recessed portion 165a also prevents gas and liquid from passing therethrough.

Figure 35:
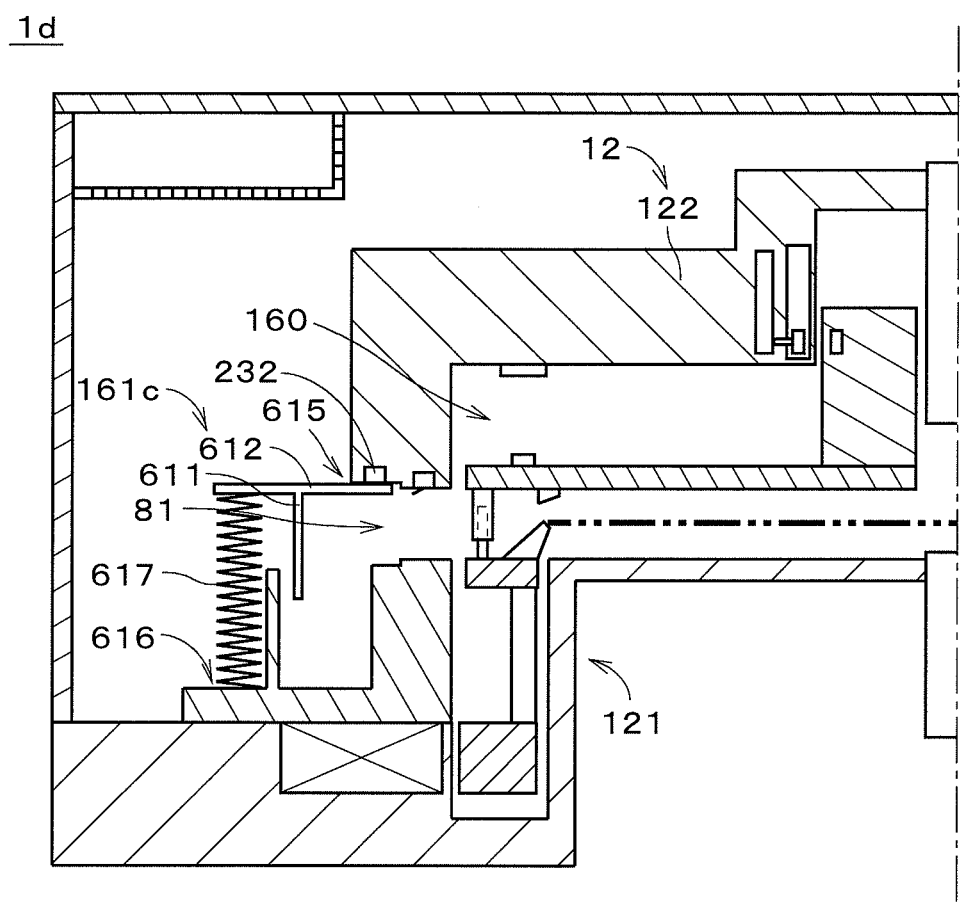
FIG. 35 is a cross section showing part of the substrate processing apparatus.

FIG. 35 is a cross section showing part of the substrate processing apparatus 1d in a state where the second sealed-state processing is performed in the sealed space 160. As shown in FIG. 35, the chamber 12 is in the semiopen state, and the annular opening 81 is formed between the chamber body 121 and the chamber cover 122. The cup part 161c is positioned at the first position on the outer side in the radial direction relative to the annular opening 81, and the sidewall portion 611 is opposed to the annular opening 81 in the radial direction.

Like in the substrate processing apparatus 1b, in the cup part 161c positioned at the first position, the upper surface of the inner edge part of the upper surface portion 612 is in contact with the lip seal 232 of the chamber cover 122 along the entire circumference thereof. Between the chamber cover 122 and the upper surface portion 612 of the cup part 161c, the first seal 615 for preventing gas and liquid from passing therethrough is thereby formed. Further, around the sidewall portion 611, the upper end portion of the bellows 617 is connected to the upper surface portion 612 and the lower end portion of the bellows 617 is indirectly connected to the chamber body 121. Between the chamber body 121 and the cup part 161*c*, the second seal 616 for preventing gas and liquid from passing therethrough is thereby formed.

The upper surface portion 612 of the cup part 161*c* is the first seal portion on which the first seal 615 is formed at the first position. The bellows 617 is the second seal portion on which the second seal 616 is formed at the first position. Then, the sealed space 160 is formed by the chamber 12 in the semiopen state and the cup part 161*c* positioned at the first position.

Thus, in the substrate processing apparatus 1*d*, it is possible to easily form the first seal 615 between the chamber cover 122 and the cup part 161*c* and easily form the second seal 616 between the chamber body 121 and the cup part 161*c*, with a simple structure. Further, since the second seal 616 is formed by connecting the lower end portion of the bellows 617 of the cup part 161*c* to the chamber body 121, it is possible to reliably prevent gas and liquid from leaking out from the second seal 616.

Figure 36:
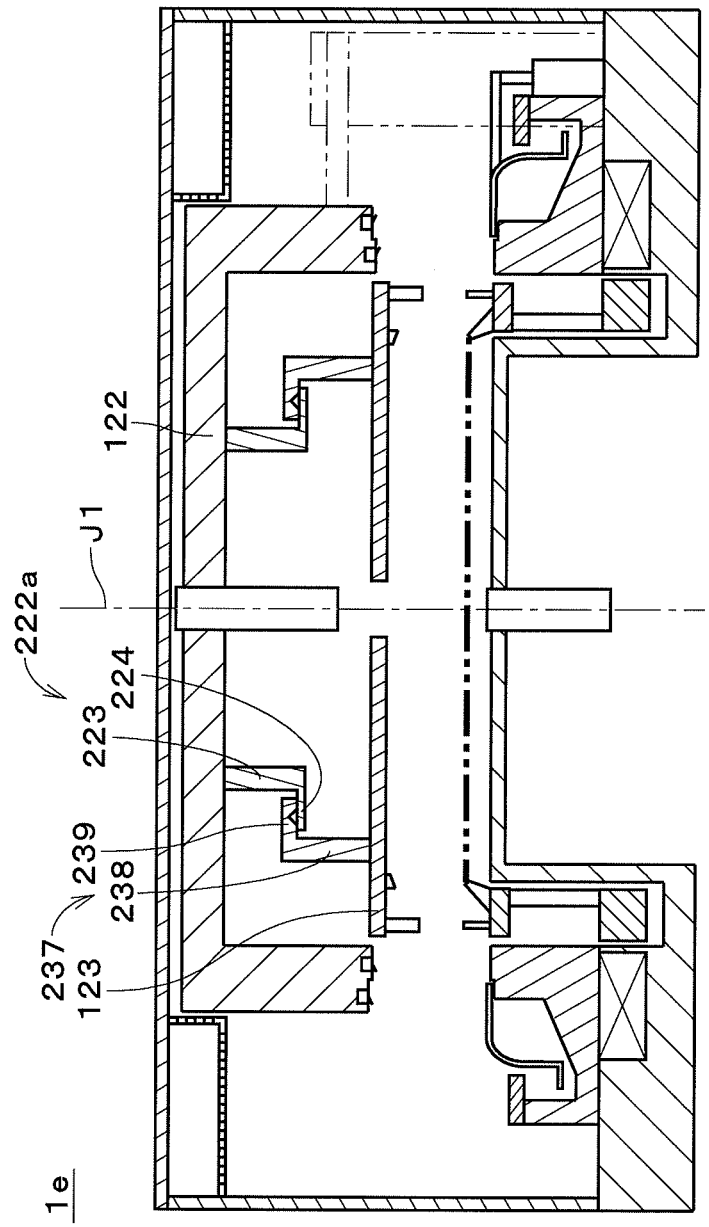
FIG. 36 is a cross section showing a substrate processing apparatus in accordance with a sixth preferred embodiment of the present invention.

FIG. 36 is a cross section showing a substrate processing apparatus 1*e* in accordance with the sixth preferred embodiment of the present invention. In the substrate processing apparatus 1*e*, the chamber cover 122 holds the top plate 123 in a different manner. Other constituent elements are identical to those of the substrate processing apparatus 1*b* shown in FIG. 14, and in the following description, constituent elements identical to or corresponding to those of the substrate processing apparatus 1*b* are represented by the same reference signs.

As shown in FIG. 36, the chamber cover 122 includes an annular plate holding part 222*a*. The plate holding part 222*a* includes a cylindrical portion 223 having a substantially cylindrical shape about the central axis J1 and a flange portion 224 having a substantially disk-like shape about the central axis J1. The cylindrical portion 223 extends downward from the lower surface of the chamber cover 122. The flange portion 224 extends outward in the radial direction from a lower end of the cylindrical portion 223.

The top plate 123 includes an annular held part 237. The held part 237 includes a cylindrical portion 238 having a substantially cylindrical shape about the central axis J1 and a flange portion 239 having a substantially disk-like shape about the central axis J1. The cylindrical portion 238 extends upward from the upper surface of the top plate 123. The flange portion 239 extends inward in the radial direction from an upper end of the cylindrical portion 238. The cylindrical portion 238 is positioned on an outer side in the radial direction relative to the cylindrical portion 223 of the plate holding part 222*a* and opposed to the cylindrical portion 223 in the radial direction. The flange portion 239 is positioned above the flange portion 224 of the plate holding part 222*a* and opposed to the flange portion 224 in the vertical direction. By bringing a lower surface of the flange portion 239 of the held part 237 into contact with an upper surface of the flange portion 224 of the plate holding part 222*a*, the top plate 123 gets so attached to the chamber cover 122 as to be suspended from the chamber cover 122.

Figure 37:
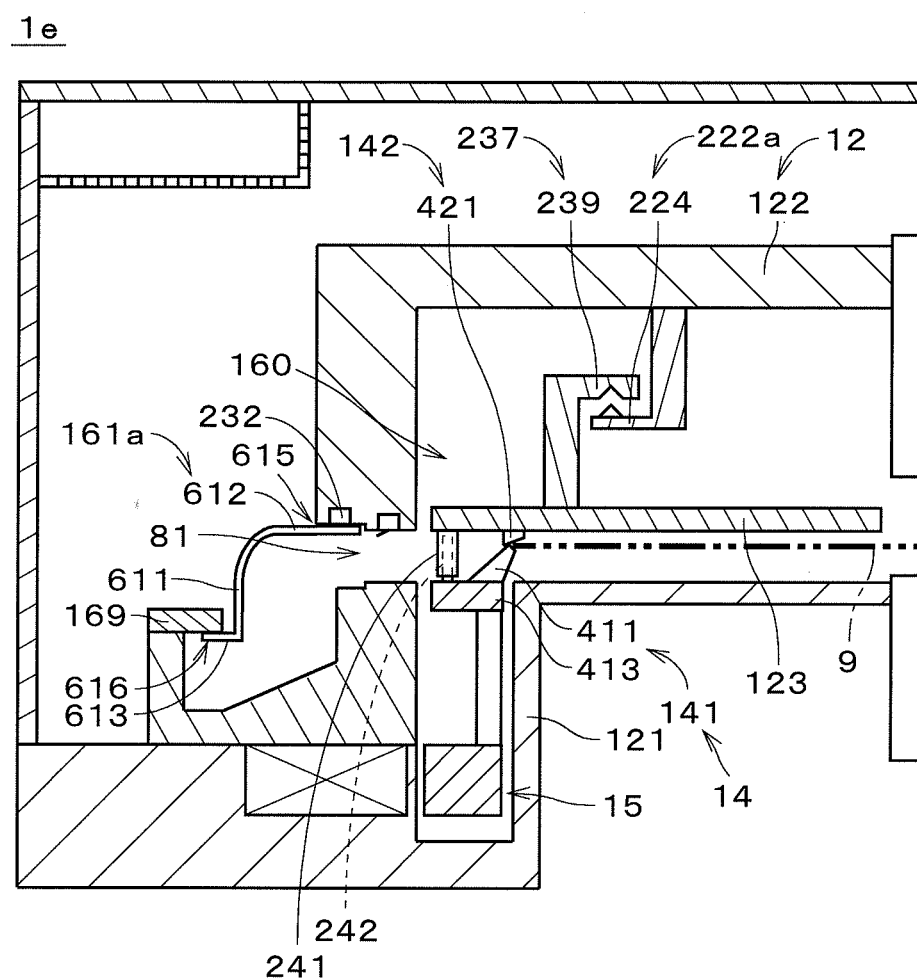
FIGS. 37 to 39 are cross sections each showing part of the substrate processing apparatus.

FIG. 37 is a cross section showing part of the substrate processing apparatus 1*e* in a state where the second sealed-state processing is performed in the sealed space 160. As shown in FIG. 37, the chamber 12 is in the semiopen state, and the annular opening 81 is formed between the chamber body 121 and the chamber cover 122. The cup part 161*a* is positioned at the first position on the outer side in the radial direction relative to the annular opening 81, and the sidewall portion 611 is opposed to the annular opening 81 in the radial direction.

Like in the substrate processing apparatus 1*b*, in the cup part 161*a* positioned at the first position, the upper surface of the inner edge part of the upper surface portion 612 is in contact with the lip seal 232 of the chamber cover 122 along the entire circumference thereof. Between the chamber cover 122 and the upper surface portion 612 of the cup part 161*a*, the first seal 615 for preventing gas and liquid from passing therethrough is thereby formed. Further, the upper surface of the lower surface portion 613 thereof is in contact with the lower surface of the outer seal portion 169 of the chamber body 121 along the entire circumference thereof. Between the chamber body 121 and the lower surface portion 613 of the cup part 161*a*, the second seal 616 for preventing gas and liquid from passing therethrough is thereby formed.

By causing the second engaging parts 242 to be engaged with the first engaging parts 241, respectively, the top plate 123 gets engaged with the supporting-part base 413 of the substrate supporting part 141 in the circumferential direction. In other words, the first engaging parts 241 and the second engaging parts 242 regulate the position of the top plate 123 relative to the substrate supporting part 141 in the rotation direction. The plurality of second contact parts 421 of the substrate retaining part 142 are in contact with the outer edge of the substrate 9.

The flange portion 239 of the held part 237 is positioned above the flange portion 224 of the plate holding part 222*a*, being apart therefrom. In the state of FIG. 37, a distance between the top plate 123 and the chamber cover 122 in the vertical direction is smaller than that shown in FIG. 36. In other words, the top plate 123 is attached to the chamber cover 122 with the distance with the chamber cover 122 in the vertical direction being changeable.

In the state of FIG. 37, the plate holding part 222*a* is not in contact with the held part 237, and the top plate 123 is supported by the substrate supporting part 141 with the substrate retaining part 142 and the substrate 9 interposed therebetween. The substrate retaining part 142 presses the substrate 9 toward the substrate supporting part 141 by the weight of the top plate 123.

Figure 38:
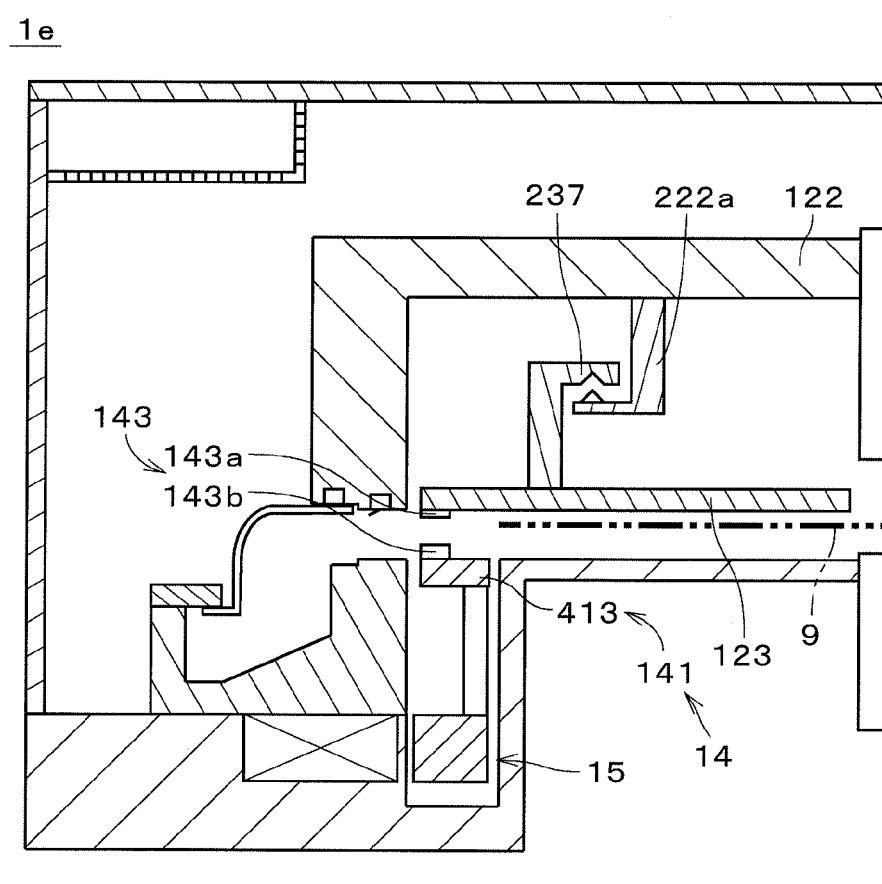

FIG. 38 is a cross section taken at a position different from that of FIG. 37, showing part of the substrate processing apparatus 1*e* in the state where the second sealed-state processing is performed. As shown in FIG. 38, on the lower surface of the top plate 123 and the supporting-part base 413 of the substrate supporting part 141, provided are a pair of magnets 143*a* and 143*b*, respectively, which are opposed to each other in the vertical direction (hereinafter, two magnets will be collectively referred to also as a "magnet pair 143"). In the substrate processing apparatus 1*e*, a plurality of magnet pairs 143 are arranged at regular angular intervals at positions different from those of the first contact parts 411, the second contact parts 421, the first engaging parts 241, and the second engaging parts 242 (see FIG. 37) in the circumferential direction. While the substrate retaining part 142 is in contact with the substrate 9, a downward force is exerted on the top plate 123 by the magnetic force (attractive force) exerted between each pair of magnets 143*a* and 143*b*. The substrate retaining part 142 thereby presses the substrate 9 toward the substrate supporting part 141 as shown in FIG. 37.

In the substrate processing apparatus 1*e*, since the substrate retaining part 142 presses the substrate 9 toward the substrate supporting part 141 by the weight of the top plate 123 and the magnetic force of the plurality of magnet pairs 143, the substrate 9 can be firmly held, being sandwiched by the substrate supporting part 141 and the substrate retaining part 142 from below and above. Further, only one magnet pair 143 may be provided, and even in such a case, the substrate 9 can be firmly held by the magnetic force of the magnet pair 143.

In the states of FIGS. 37 and 38, as discussed above, the plate holding part 222a is not in contact with the held part 237, and the top plate 123 is rotated by the substrate rotating mechanism 15 together with the substrate holding part 14 and the substrate 9 held by the substrate holding part 14, independently of the chamber cover 122.

Figure 39:
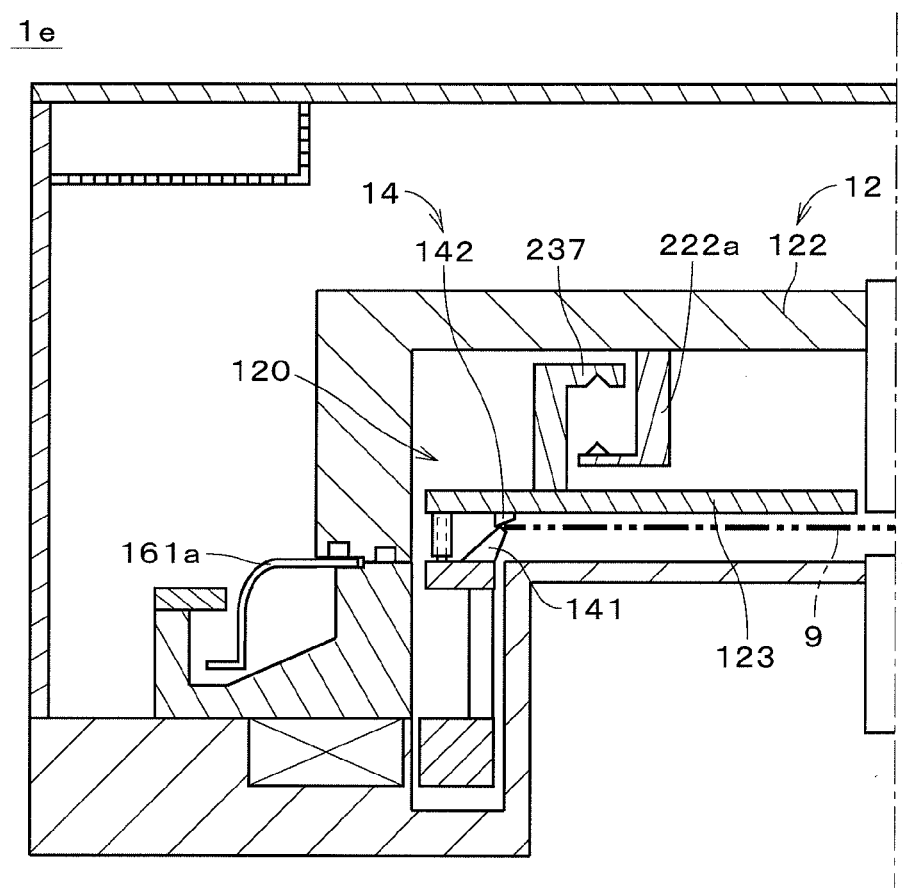

FIG. 39 is a cross section showing part of the substrate processing apparatus 1e in a state where the first sealed-state processing is performed in the internal space 120 of the chamber 12. As shown in FIG. 39, the chamber 12 is in the sealed state, and the cup part 161a is positioned at the above-described second position. In the state of FIG. 39, the distance between the top plate 123 and the chamber cover 122 in the vertical direction is smaller than those shown in FIGS. 36 and 37. Further, in the state of FIG. 39, the distance between the top plate 123 and the substrate 9 in the vertical direction is the same as that shown in FIG. 37, and the substrate retaining part 142 is in contact with the outer edge of the substrate 9 to press the substrate 9 toward the substrate supporting part 141. The plate holding part 222a is not in contact with the held part 237, and the top plate 123 is rotated together with the substrate holding part 14 and the substrate 9 held by the substrate holding part 14, independently of the chamber cover 122.

When the chamber cover 122 moves up to bring the chamber 12 into the open state of FIG. 36, a plurality of projections provided on the upper surface of the flange portion 224 of the plate holding part 222a gets engaged with an annular groove portion provided in the lower surface of the flange portion 239 of the held part 237, and the top plate 123 is thereby aligned with respect to the chamber cover 122. As a structure for alignment, any other structure may be used.

Like in the substrate processing apparatus 1b, also in the substrate processing apparatus 1e, the processing liquid can be received in the sealed space 160 by the cup part 161a disposed outside the chamber 12. Further, it is possible to prevent the processing liquid from being left near the holding structure for holding the outer edge of the substrate 9. It is also possible to prevent the processing liquid from splashing back against the holding structure. In the substrate processing apparatus 1e, the scan nozzle 188 shown in FIG. 30 may be additionally provided.

Though the preferred embodiments of the present invention have been discussed above, the present invention is not limited to the above-discussed preferred embodiments, but allows various variations.

In the substrate processing apparatuses 1 and 1a to 1e, other various processings may be performed. For example, a processing using an SPM (sulfuric acid/hydrogen peroxide/water mixture) may be performed. The order or the kind of processings to be performed in the open state, the semiopen state, and the sealed state may be changed in various ways.

All the processing liquid received by the cup part of the liquid receiving part 16 may be discarded. Instead, all the processing liquid received by the cup part of the liquid receiving part 16 may be collected. The processing liquid received by the chamber 12 may be also discarded or collected. The number of cup parts may be one or more than three. A plurality of cup parts may be move up and down at the same time. If no problem occurs even when processing liquids are mixed to some degree, each cup part may receive a plurality of kinds of processing liquids. In this case, a multiple valve may be provided at a liquid discharge path from the cup part.

In the cup parts 161a, 161b, and 161c, a portion other than the upper surface portion 612 (for example, the sidewall portion 611) may come into contact with the chamber cover 122, to thereby form the first seal 615 between the any one of the cup parts 161a, 161b, and 161c and the chamber cover 122. The respective shapes of the cup parts 161a, 161b, and 161c may be changed as appropriate.

The respective shapes of the upper nozzle 181 and the lower nozzle 182 are not limited to the protruding shape. Any portion having an ejection port for ejecting the processing liquid is included in the concept of the nozzle in the preferred embodiments of the present invention.

The chamber opening and closing mechanism may be any mechanism for opening and closing the chamber 12 in various manners, and in other words, may be any mechanism for moving up and down the chamber movable part including the upper portion or the lower portion of the chamber 12 relative to the other portion of the chamber 12. With the movement of the chamber movable part, the annular opening 81 is formed around the substrate 9.

For example, the chamber opening and closing mechanism 131 does not necessarily have to move the chamber cover 122 in the vertical direction, but may move the chamber body 121 in the vertical direction with the chamber cover 122 fixed, to thereby switch the state of the chamber 12 among the open state, the semiopen state, and the sealed state.

In the substrate processing apparatuses 1 and 1a, for the engagement between the top plate 123 and the substrate holding part 14 in the circumferential direction, any other structure may be used. For example, projections protruding downward from the top plate 123 and projections protruding upward from the substrate holding part 14 may only come into contact with each other in the circumferential direction.

In the substrate processing apparatuses 1b to 1e, as the mechanism for engagement between the top plate 123 and the substrate supporting part 141 in the circumferential direction, any structure different from the first engaging parts 241 and the second engaging parts 242 may be used. For example, projections protruding downward from the top plate 123 and projections protruding upward from the supporting-part base 413 of the substrate supporting part 141 may only come into contact with each other in the circumferential direction.

The structure of the substrate rotating mechanism 15 shown in FIG. 1 may be changed in various ways. The rotor part 152 does not necessarily have to rotate in a floating state, but there may be a case where a structure such as a guide or the like for mechanically supporting the rotor part 152 is provided in the internal space 120 of the chamber 12 and the rotor part rotates along the guide.

Figure 40:
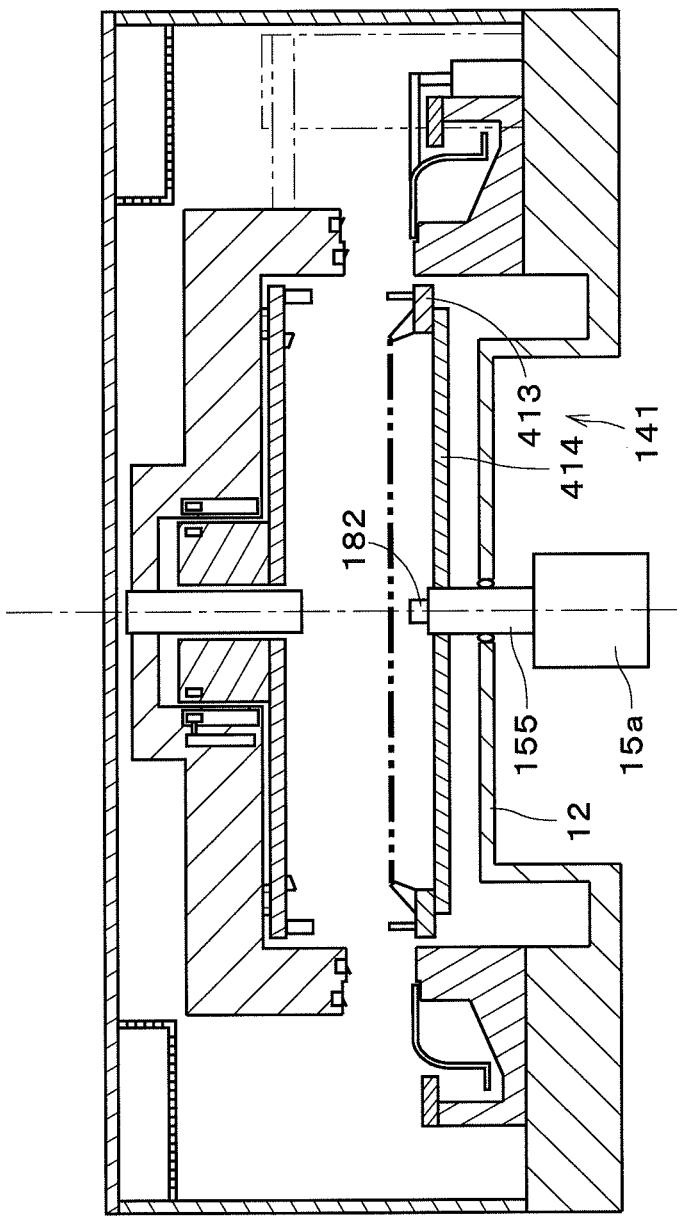
FIG. 40 is a cross section showing another example of a substrate processing apparatus.

The substrate rotating mechanism 15 does not necessarily have to be a hollow motor, but a substrate rotating mechanism 15a which is a shaft rotation type motor shown in FIG. 40 may be used. The substrate rotating mechanism 15a is disposed below the chamber 12 outside the chamber 12. In the substrate supporting part 141, a connecting part 414 having a substantially disk-like shape is fixed to the lower surface of the supporting-part base 413 having a substantially annular disk-like shape. A rotation shaft 155 of the substrate rotating mechanism 15a is connected to an opening of a center of the connecting part 414. The lower nozzle 182 is provided at an upper end of the rotation shaft 155 of the substrate rotating mechanism 15a.

In the substrate processing apparatus 1, one of the upper nozzle 181 and the lower nozzle 182 may be omitted. In other words, the processing liquid supply part 18 supplies the processing liquid onto the upper surface or the lower surface of the substrate 9. Further, the top plate 123 may be omitted.

The structure of the chamber cover 122 and the top plate 123 may be used in an apparatus for performing only a sealed-state processing, in which the liquid receiving part 16 is omitted.

In the top plate moving mechanism 126, it is not always necessary to provide the magnet moving mechanism 263. There may be a case, for example, where a plurality of annular electromagnets are arranged in the vertical direction around the accommodating part 221 of the chamber cover 122 and by selectively turning on one or two electromagnets, a position of the first magnet 261 in the vertical direction is controlled and the top plate 123 is thereby moved in the vertical direction. Also in the sealed space 160 where the second sealed-state processing is performed, the top plate moving mechanism 126 may change the position of the top plate 123.

The magnet pair 143 in the substrate processing apparatus 1e may be provided at the top plate 123 and the substrate supporting part 141 in the substrate processing apparatuses 1b, 1c, and 1d.

Though the top plate 123 is provided as the upper rotating member which is disposed above the substrate supporting part 141 and rotated together with the substrate supporting part 141 in the above-discussed substrate processing apparatuses, instead of the top plate 123, for example, an upper rotating member having a substantially annular disk-like shape may be provided, on a lower surface of which the substrate retaining part 142 is provided. In this case, in the substrate processing apparatuses 1b, 1c, and 1d, the top plate shaft 235 and the substantially annular disk-like upper rotating member are connected to each other with a connecting part which extends radially from the top plate shaft 235. Further, in the substrate processing apparatus 1e, the held part 237 is fixed to an upper surface of the upper rotating member. In the above-discussed substrate processing apparatuses, the upper rotating member may be omitted.

Though two second contact parts 421 of the substrate retaining part 142 are provided on both sides of each first contact part 411 of the substrate supporting part 141 in the circumferential direction adjacently thereto in the substrate holding part 14, the two second contact parts 421 disposed on both sides of one first contact part 411 adjacently thereto may be two portions of one member, which are apart from each other in the circumferential direction. Further, in the case where two first contact parts 411 are provided on both sides of each second contact part 421 in the circumferential direction adjacently thereto, the two first contact parts 411 may be two portions of one member, which are apart from each other in the circumferential direction. The first contact part 411 and the second contact part 421 do not necessarily have to be disposed adjacently to each other, but, for example, four first contact parts 411 and four second contact parts 421 may be arranged alternately at regular angular intervals.

The substrate holding part 14 does not necessarily have to be constituted of two separate parts, i.e., the substrate supporting part 141 and the substrate retaining part 142. There may be a case, for example, where a plurality of holding structures each having a recessed portion which is recessed outward in the radial direction are provided on the supporting-part base 413 and by inserting the outer edge of the substrate 9 into the recessed portion of each of the holding structures, each of the holding structures comes into contact with the substrate 9 from below, side, and above, to thereby hold the substrate 9.

In the above-discussed Steps S21 to 26, when it is intended that the third processing liquid should be collected separately from the first and second processing liquids, the chamber 12 is brought into the sealed state from the semi-open state between Steps S23 and S24. Further, in the processings on the substrate 9, it is not always necessary to supply the processing liquid onto the lower surface 92 of the substrate 9. In the above-discussed substrate processing apparatuses, various processings other than those shown in Steps S21 to S26 may be performed by supplying various kinds of processing liquids (for example, SPM (sulfuric acid/hydrogen peroxide/water mixture)) onto the substrate 9. The atmosphere in the internal space 120 of the chamber 12 and the sealed space 160 may be changed in various ways. Further, it is not always necessary to provide the chamber 12.

The substrate to be processed in the substrate processing apparatus is not limited to a semiconductor substrate but may be a glass substrate or other substrates.

The configurations in the above-discussed preferred embodiments and variations may be combined as appropriate only if those do not conflict with one another.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2012-191284 filed in the Japan Patent Office on Aug. 31, 2012, Japanese Patent Application No. 2012-191285 filed in the Japan Patent Office on Aug. 31, 2012, Japanese Patent Application No. 2012-210558 filed in the Japan Patent Office on Sep. 25, 2012, Japanese Patent Application No. 2012-210559 filed in the Japan Patent Office on Sep. 25, 2012, and Japanese Patent Application No. 2012-210560 filed in the Japan Patent Office on Sep. 25, 2012, the entire disclosures of which are incorporated herein by reference.

REFERENCE SIGNS LIST 1, 1a to 1e Substrate processing apparatus
9 Substrate
12 Chamber
14 Substrate holding part
15, 15a Substrate rotating mechanism
18 Processing liquid supply part
81 Annular opening
91 Upper surface (of Substrate)
120 Internal space
121 Chamber body
122 Chamber cover
123 Top plate
124 Chamber fixed part
125 chamber movable part
126 Top plate moving mechanism
131 Cover up-and-down moving mechanism (Chamber opening and closing mechanism)
132 Chamber up-and-down moving mechanism 141 Substrate supporting part
142 Substrate retaining part
143a, 143b Magnet
151 Stator part
152 Rotor part
160 Sealed space
161 First cup part
161a to 161c Cup part
162a Cup moving mechanism
163 Second cup part
164 Second cup up-and-down moving mechanism
166a Liquid pooling part
167 Seal liquid
172 Partition plate
181 Upper nozzle
186 Gas supply part
187 Pressurizing part
188 Scan nozzle
196 Pressure reducing part
221 Accommodating part
235 Top plate shaft
241 First engaging part
242 Second engaging part
261 First magnet
262 Second magnet
263 Magnet moving mechanism
411 First contact part
412 First sloped surface
421 Second contact part
422 Second sloped surface
611 Sidewall portion
612 Upper surface portion
613 Lower surface portion
614 Outer cylindrical portion
615 First seal
616 Second seal
617 Bellows
J1 Central axis
S11 to S16, S21 to S26 Step

The invention claimed is:

1. A substrate processing apparatus for processing a substrate, comprising:
a chamber including an upper portion and a lower portion which forms therein a sealed internal space by bringing said upper portion into contact with said lower portion;
a chamber opening and closing mechanism for moving up and down said upper portion of said chamber relative to said lower portion of said chamber;
a substrate holding part disposed in said chamber, for holding a substrate horizontally;
a substrate rotating mechanism for rotating said substrate together with said substrate holding part about a central axis oriented in a vertical direction;
a processing liquid supply part for supplying a processing liquid onto an upper surface or a lower surface of said substrate;
a cup part positioned on an outer side in a radial direction relative to an annular opening formed around said substrate by moving up said upper portion to be apart from said lower portion of said chamber, for receiving said processing liquid spattering from said substrate being rotated and passing through said annular opening between said upper portion and said lower portion of said chamber;
a cup discharge path for discharging said processing liquid received by said cup part while said upper portion is apart from said lower portion and said annular opening is formed;
a chamber discharge path for discharging said processing liquid received by said chamber while said upper portion comes into contact with said lower portion and said chamber is sealed; and
a control part for controlling said chamber opening and closing mechanism to switch a state of said chamber between a state that said upper portion is apart from said lower portion of said chamber and a state that said upper portion comes into contact with said lower portion of said chamber and to thereby switch a discharge path of said processing liquid between said cup discharge path and said chamber discharge path.

2. The substrate processing apparatus according to claim 1, further comprising:
a cup part up-and-down moving mechanism for moving said cup part up and down, to thereby move said cup part between a first position which is outward in said radial direction relative to said annular opening and a second position lower than said first position, wherein
said annular opening includes a position relative to said vertical direction in which said substrate is disposed.

3. The substrate processing apparatus according to claim 2, further comprising:
another cup part positioned on an outer side in said radial direction relative to said chamber,
wherein said cup up-and-down moving mechanism moves said cup part up and down, to thereby switch between a state in which said cup part receives said processing liquid from said substrate and another state in which said another cup part receives said processing liquid from said substrate.

4. The substrate processing apparatus according to claim 1, wherein
said processing liquid supply part includes a nozzle moving from the outside of said chamber to above said substrate while said upper portion of said chamber is apart from said lower portion of said chamber.

5. The substrate processing apparatus according to claim 1, wherein an upper portion of said cup part is close to or in contact with said upper portion of said chamber while said cup part receives said processing liquid spattering from said substrate.

6. The substrate processing apparatus according to claim 1, wherein
said processing liquid supply part selectively supplies deionized water or a processing liquid onto said substrate,
said chamber receives said processing liquid or deionized water spattering from said substrate while the inside of said chamber is sealed, and
said cup part receives said processing liquid spattering from said substrate while said annular opening is formed.

7. The substrate processing apparatus according to claim 1, further comprising:
a pressure reducing part for reducing pressure in said chamber.

8. The substrate processing apparatus according to claim 1, further comprising:
a pressurizing part for increasing pressure in said chamber.

9. The substrate processing apparatus according to claim 1, wherein said upper portion and said lower portion of said chamber are not rotated.

10. A substrate processing apparatus for processing a substrate, comprising:
- a chamber which forms therein an internal space which is sealed;
- a chamber opening and closing mechanism for moving up and down a chamber movable part including an upper portion or a lower portion of said chamber relative to the other portion of said chamber;
- a substrate holding part disposed in said chamber, for holding a substrate horizontally;
- a substrate rotating mechanism for rotating said substrate together with said substrate holding part about a central axis oriented in a vertical direction;
- a processing liquid supply part for supplying a processing liquid onto an upper surface or a lower surface of said substrate; and
- a cup part positioned on an outer side in a radial direction relative to an annular opening formed around said substrate by a movement of said chamber movable part, for receiving said processing liquid spattering from said substrate being rotated, wherein said chamber movable part includes said lower portion of said chamber, and said chamber comprises:
- a chamber fixed part positioned on an upper side relative to said chamber movable part; and
- a chamber cover positioned on an upper side relative to said chamber fixed part, said substrate processing apparatus further comprising:
- a cover up-and-down moving mechanism for moving said chamber cover up and down; and
- a partition plate extending outward from said chamber fixed part above said cup part.

* * * * *